(12) United States Patent
Akutsu et al.

(10) Patent No.: US 11,694,954 B2
(45) Date of Patent: Jul. 4, 2023

(54) SEMICONDUCTOR DEVICE AND METHOD FOR PRODUCING SAME

(71) Applicant: ROHM CO., LTD., Kyoto (JP)

(72) Inventors: Minoru Akutsu, Kyoto (JP); Kentaro Chikamatsu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 138 days.

(21) Appl. No.: 16/962,762

(22) PCT Filed: Dec. 5, 2018

(86) PCT No.: PCT/JP2018/044754
§ 371 (c)(1),
(2) Date: Jul. 16, 2020

(87) PCT Pub. No.: WO2019/142529
PCT Pub. Date: Jul. 25, 2019

(65) Prior Publication Data
US 2020/0357736 A1 Nov. 12, 2020

(30) Foreign Application Priority Data

Jan. 19, 2018 (JP) ................................ 2018-007397

(51) Int. Cl.
*H01L 29/778* (2006.01)
*H01L 29/66* (2006.01)
*H01L 23/522* (2006.01)

(52) U.S. Cl.
CPC .... *H01L 23/5222* (2013.01); *H01L 29/66462* (2013.01); *H01L 29/7787* (2013.01)

(58) Field of Classification Search
CPC ............. H01L 29/7787; H01L 29/7786; H01L 29/66462
See application file for complete search history.

(56) References Cited

U.S. PATENT DOCUMENTS

2006/0202272 A1 9/2006 Wu et al.
2010/0117146 A1 5/2010 Ikeda et al.
(Continued)

FOREIGN PATENT DOCUMENTS

JP 2010118556 5/2010
JP 2012178595 9/2012
(Continued)

OTHER PUBLICATIONS

International Search Report and Written Opinion issued for International Patent Application No. PCT/JP2018/044754, dated Feb. 26, 2019, 14 pages including English translation of Search Report.
(Continued)

*Primary Examiner* — Grant S Withers
(74) *Attorney, Agent, or Firm* — Hamre, Schumann, Mueller & Larson, P.C.

(57) ABSTRACT

A semiconductor device 1 has an electrode structure that includes source electrodes 3, a gate electrode 4, and drain electrodes 5 disposed on a semiconductor laminated structure 2 and extending in parallel to each other and in a predetermined first direction and a wiring structure that includes source wirings 9, drain wirings 10, and gate wirings 11 disposed on the electrode structure and extending in parallel to each other and in a second direction orthogonal to the first direction. The source wirings 9, the drain wirings 10, and the gate wirings 11 are electrically connected to the source electrodes 3, the drain electrodes 5, and the gate electrode 4, respectively. The semiconductor device 1 includes a conductive film 8 disposed between the gate electrode 4 and the drain wirings 10 and being electrically connected to the source electrodes 3.

10 Claims, 59 Drawing Sheets

(56) References Cited

U.S. PATENT DOCUMENTS

| | | | |
|---|---|---|---|
| 2010/0213503 A1 | 8/2010 | Yanagihara et al. | |
| 2015/0028384 A1* | 1/2015 | Cao | H01L 27/1207 |
| | | | 257/140 |
| 2015/0295573 A1 | 10/2015 | Suzuki et al. | |
| 2016/0043643 A1 | 2/2016 | Ujita et al. | |
| 2016/0218203 A1 | 7/2016 | Chikamatsu et al. | |
| 2017/0104092 A1* | 4/2017 | Tanaka | H01L 29/7786 |
| 2018/0190777 A1* | 7/2018 | Tomomatsu | H01L 23/4824 |

FOREIGN PATENT DOCUMENTS

| | | |
|---|---|---|
| JP | 2013065612 | 4/2013 |
| JP | 2016134599 | 7/2016 |
| WO | 2010047016 | 4/2010 |
| WO | 2012137574 A1 | 10/2012 |
| WO | 2014073295 | 5/2014 |
| WO | 2014188651 | 11/2014 |

OTHER PUBLICATIONS

International Preliminary Report on Patentability issued for International Patent Application No. PCT/JP2018/044754, dated Jul. 30, 2020, 23 pages including English translation.

Notice of Reasons for Refusal issued for Japanese Patent Application No. 2019-565755, Dispatch Date: May 19, 2022, 9 pages including English translation.

Notice of Reasons for Refusal issued for Japanese Patent Application No. 2019-565755, Dispatch Date: Sep. 1, 2022, 8 pages including English translation.

\* cited by examiner

FIG. 1
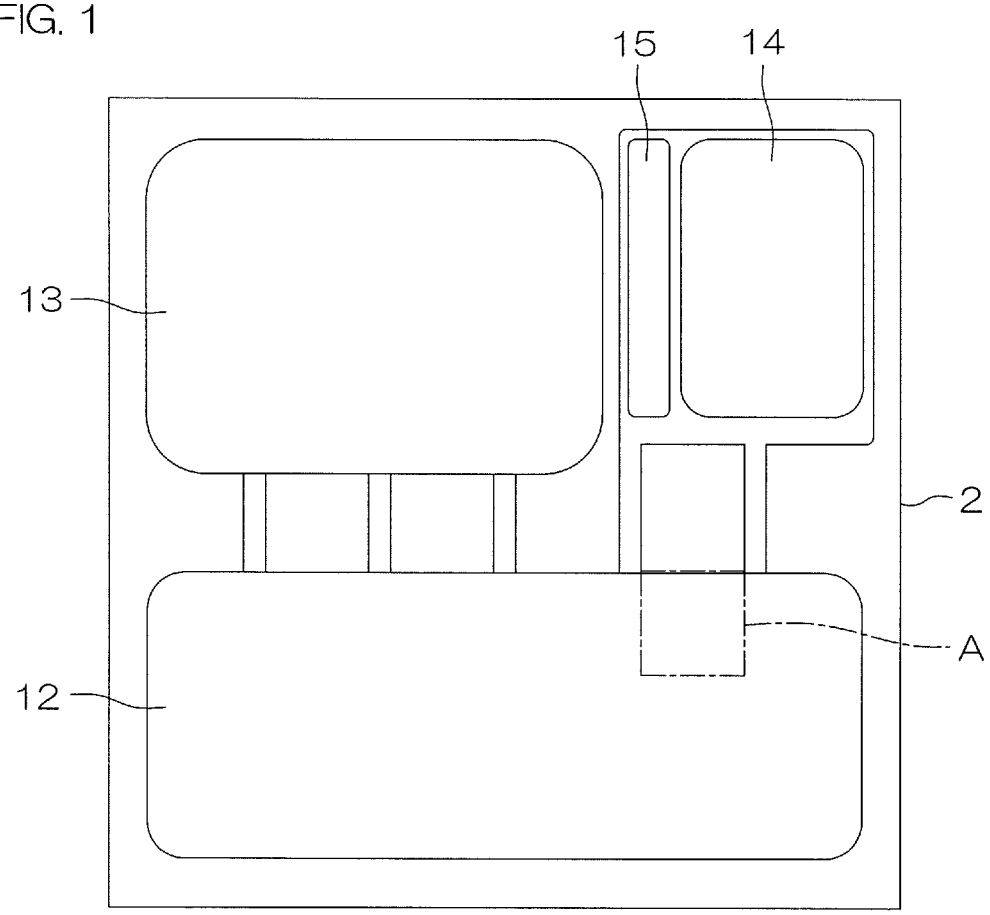
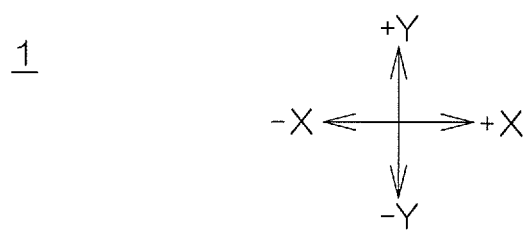

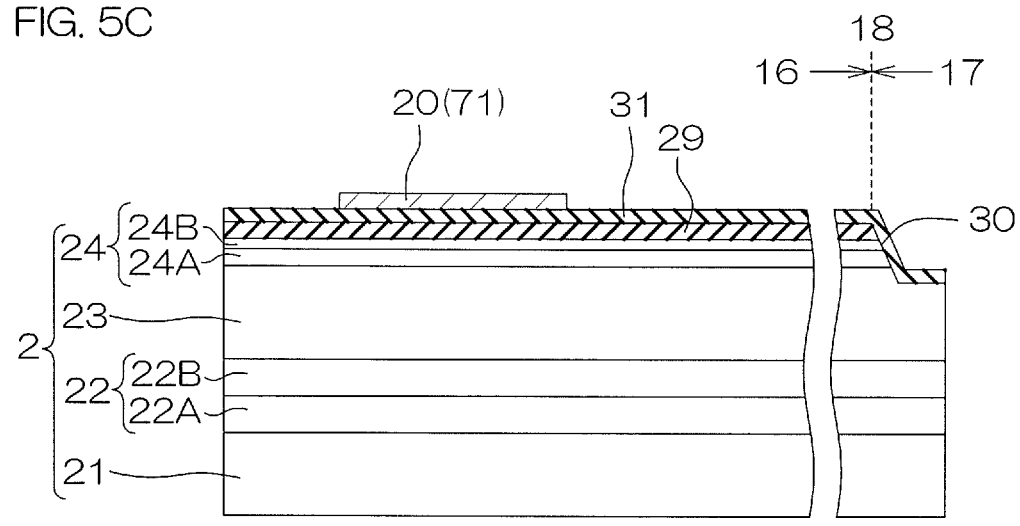

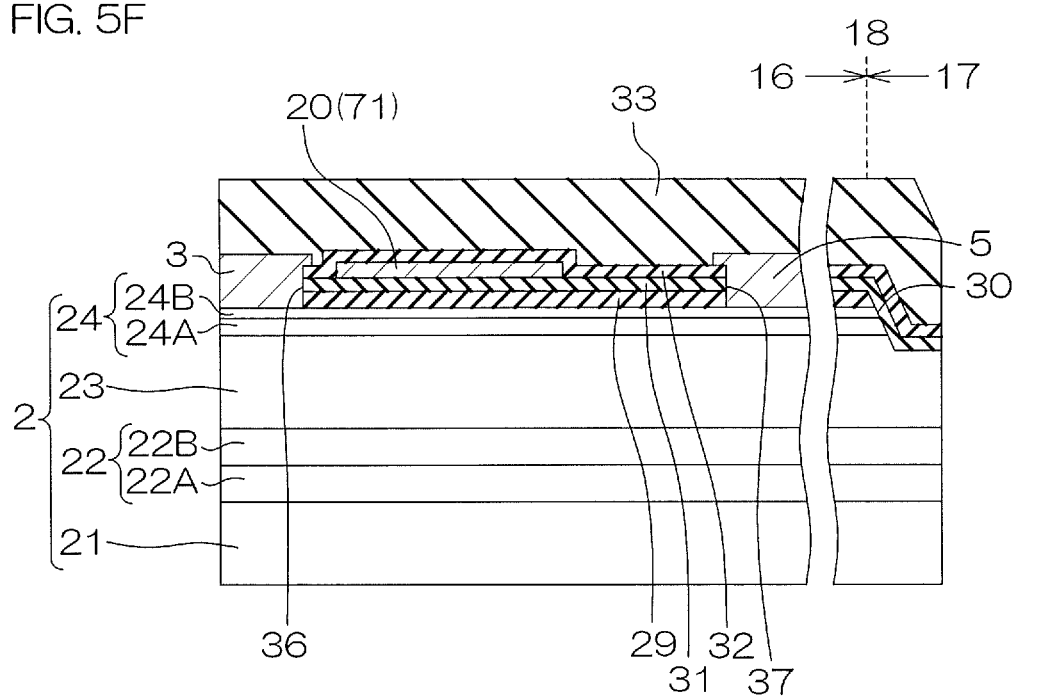

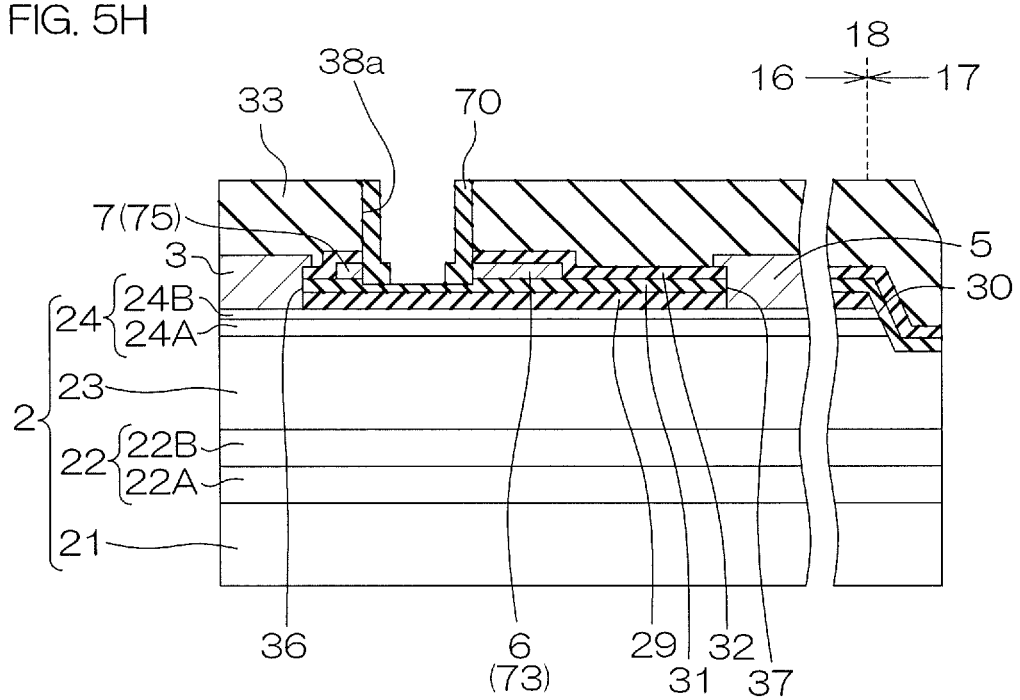

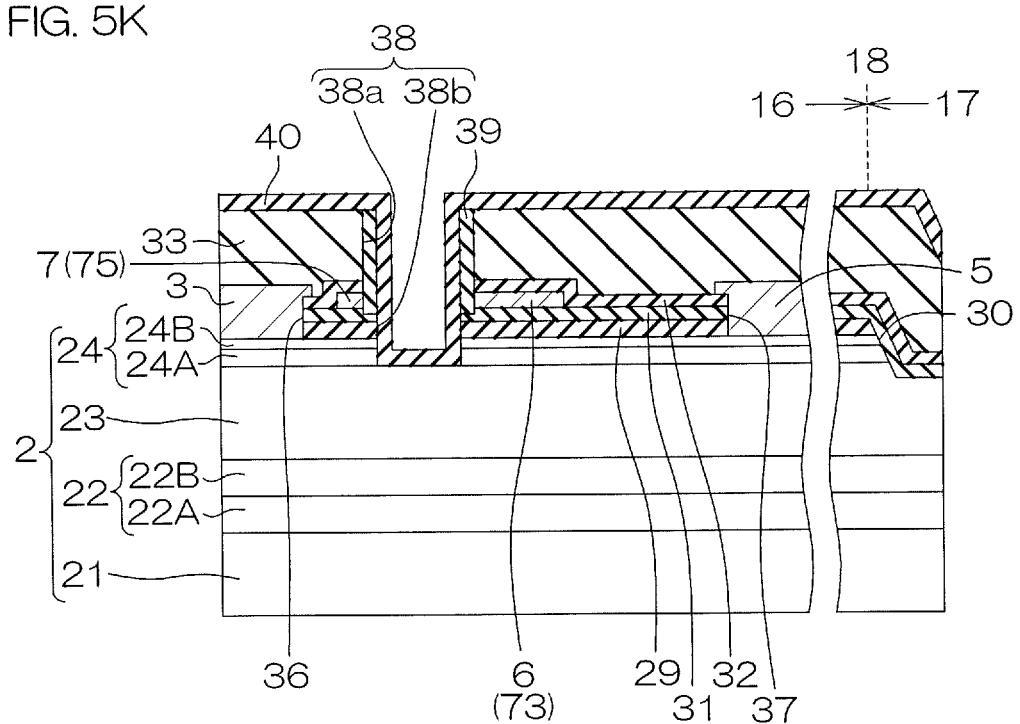

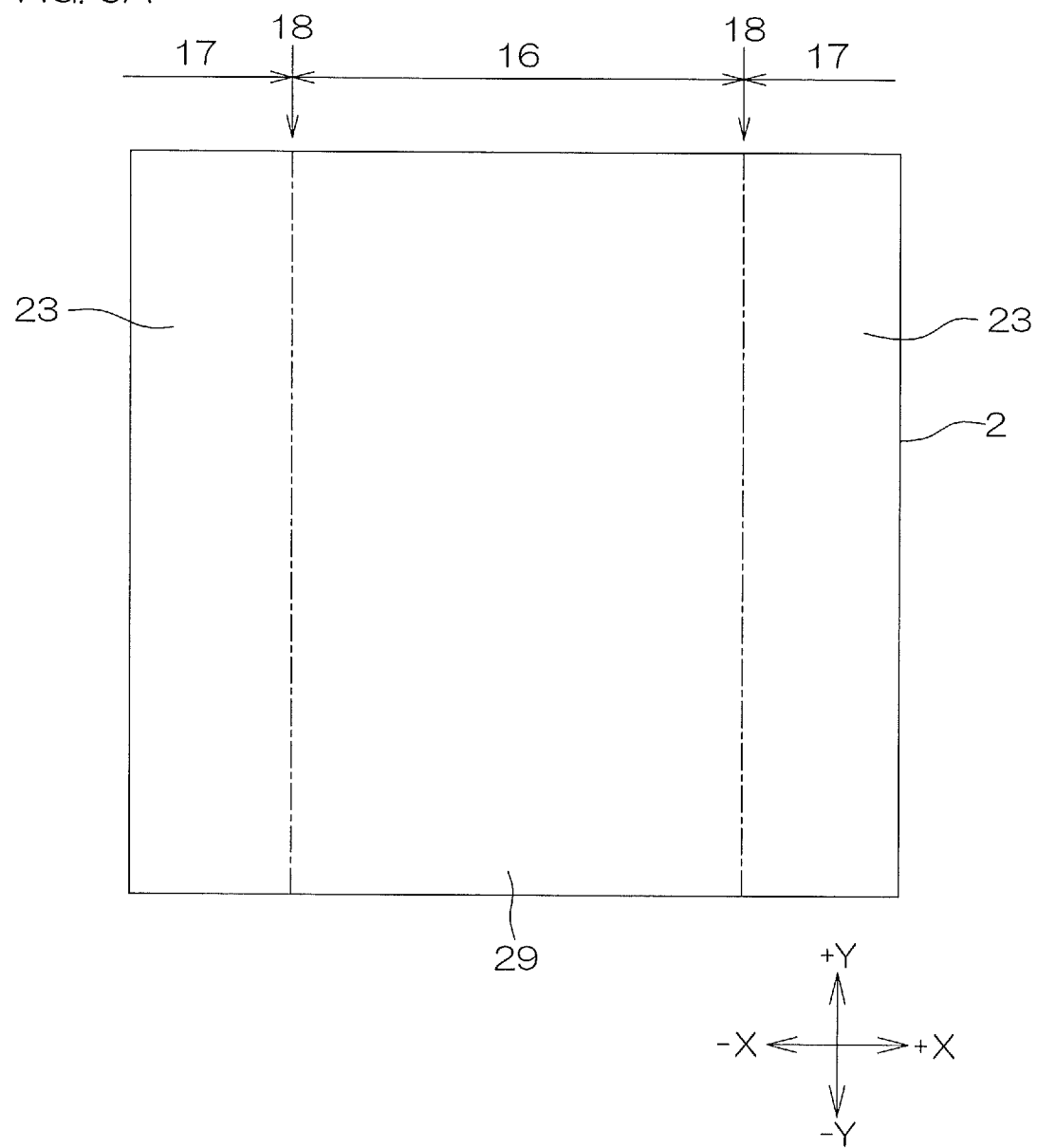

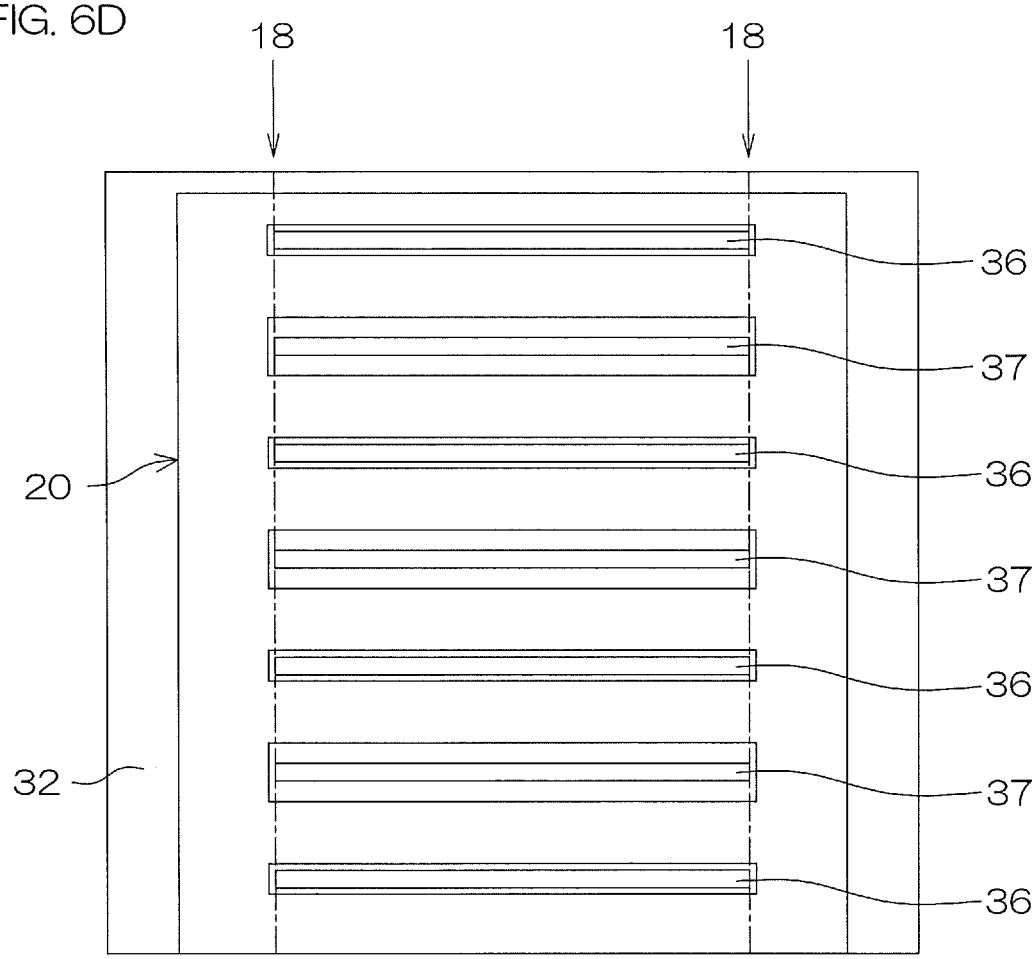

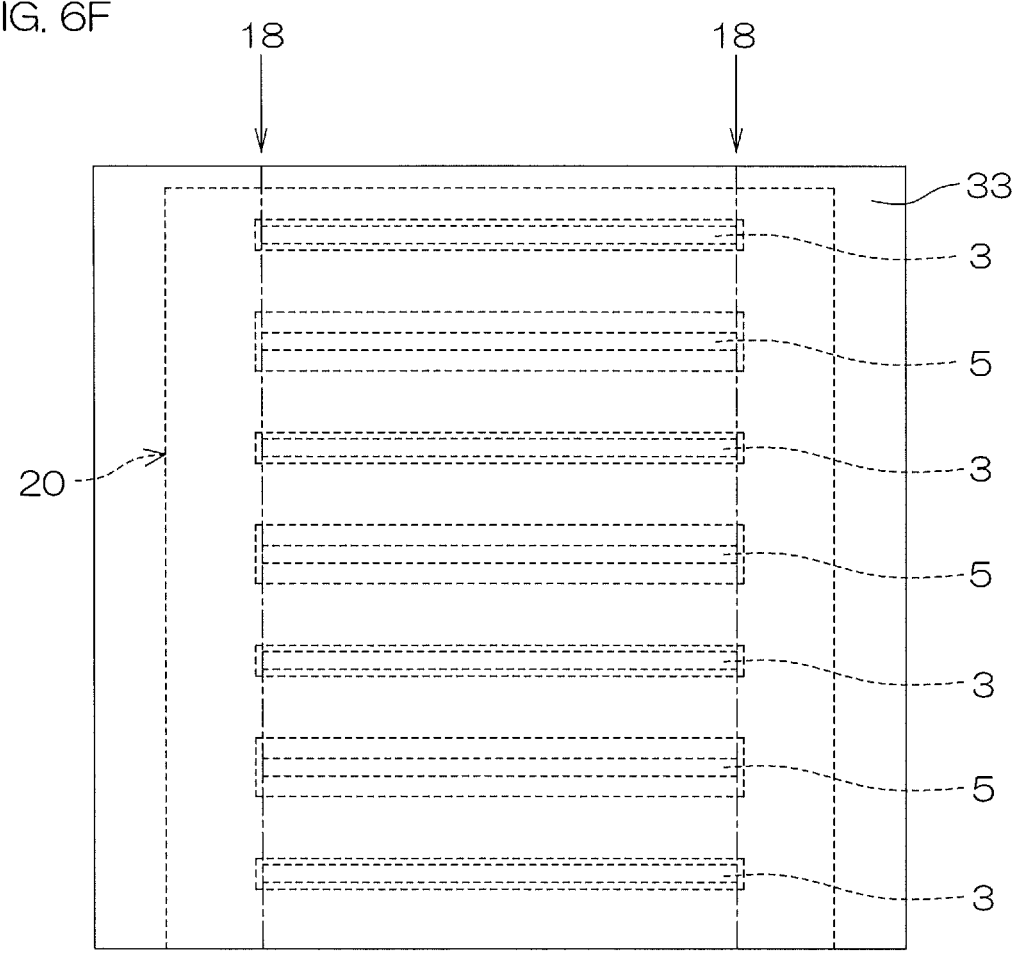

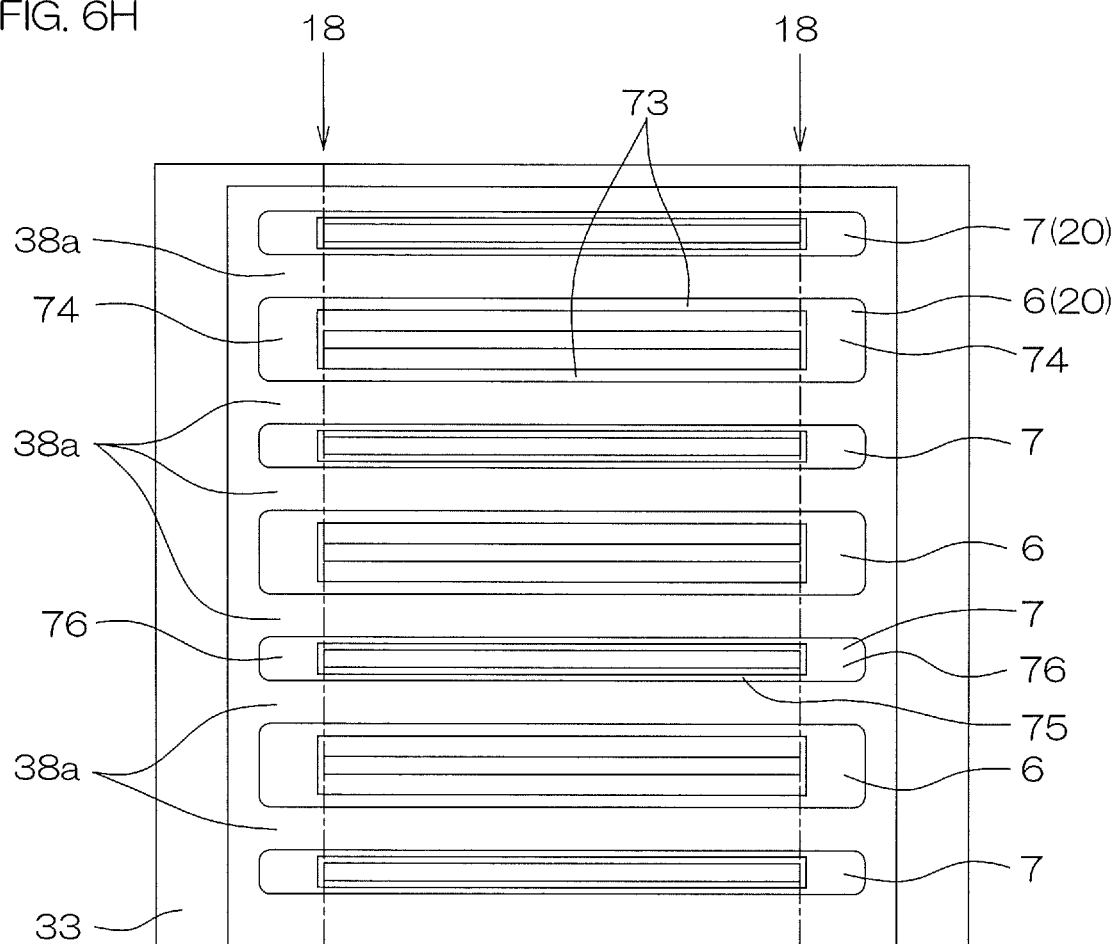

FIG. 6K
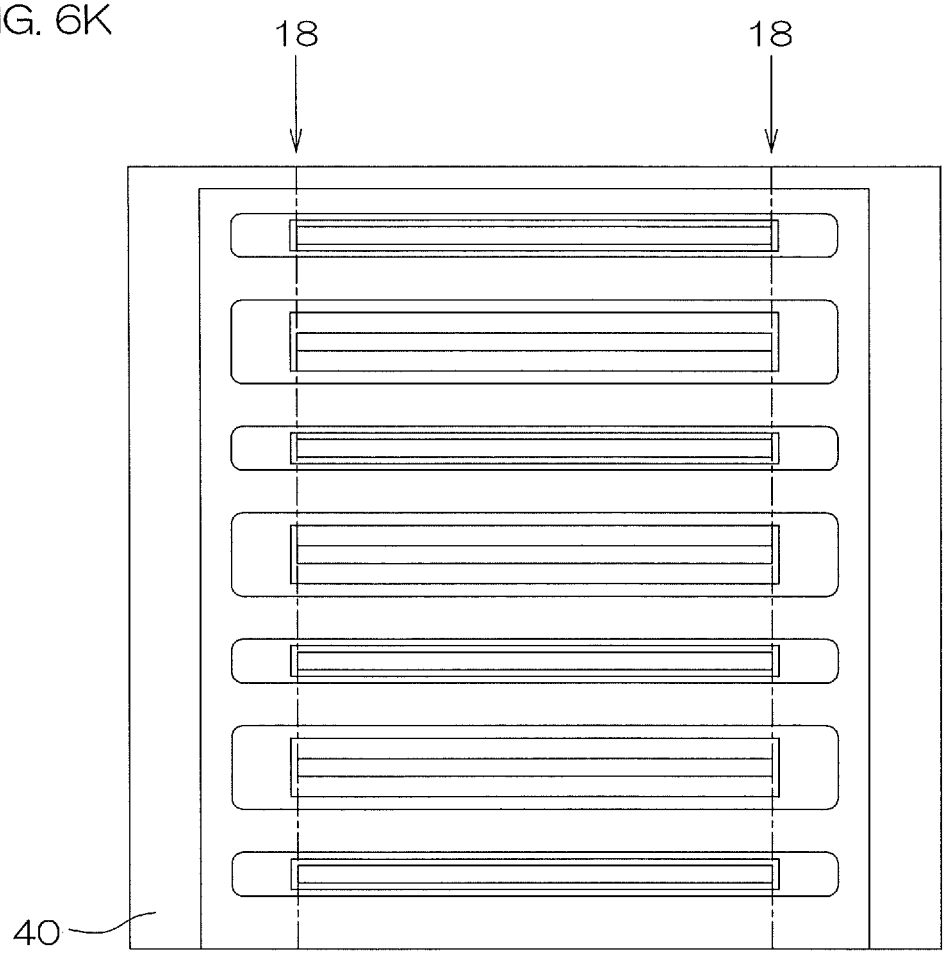
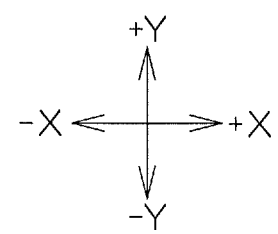

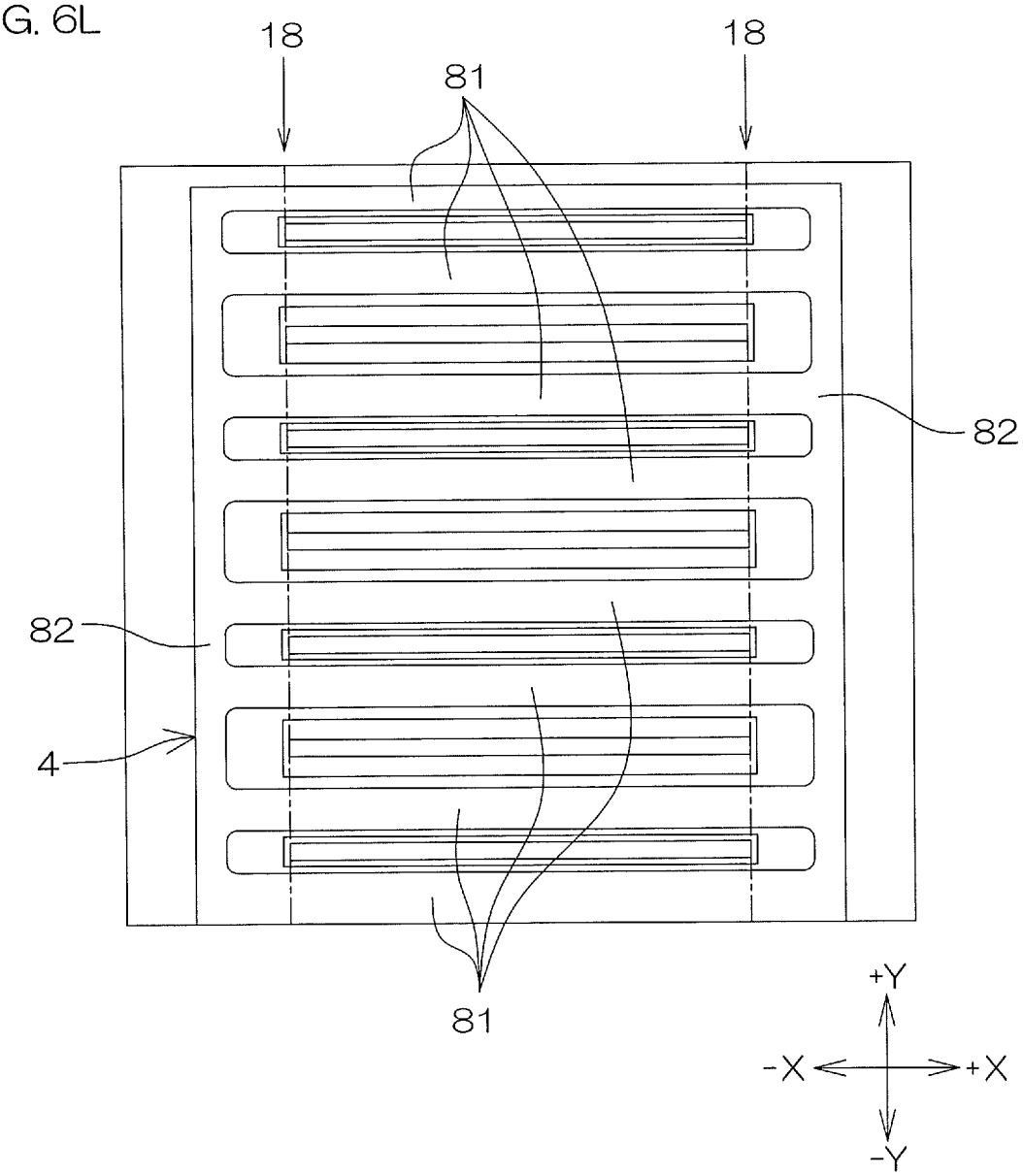

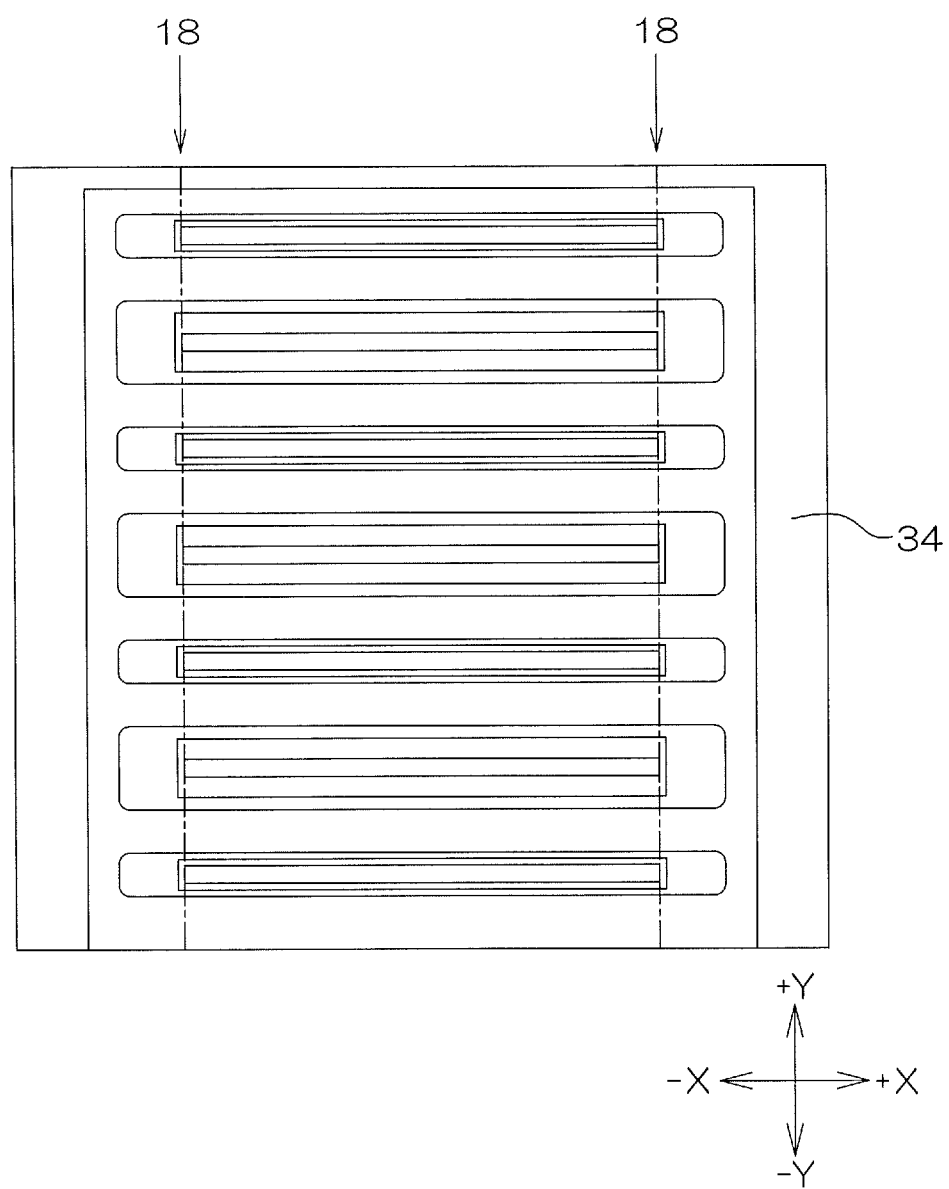

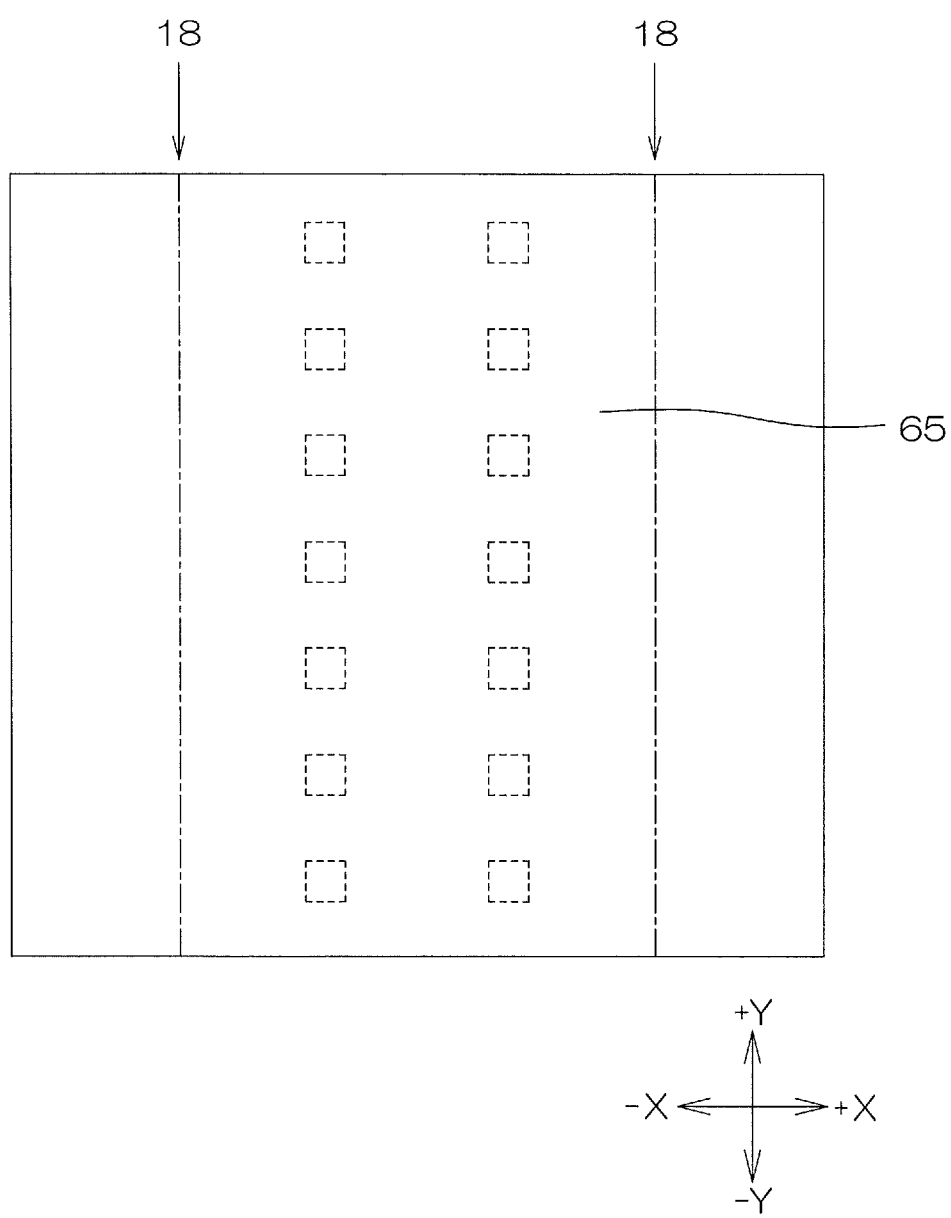

FIG. 6V
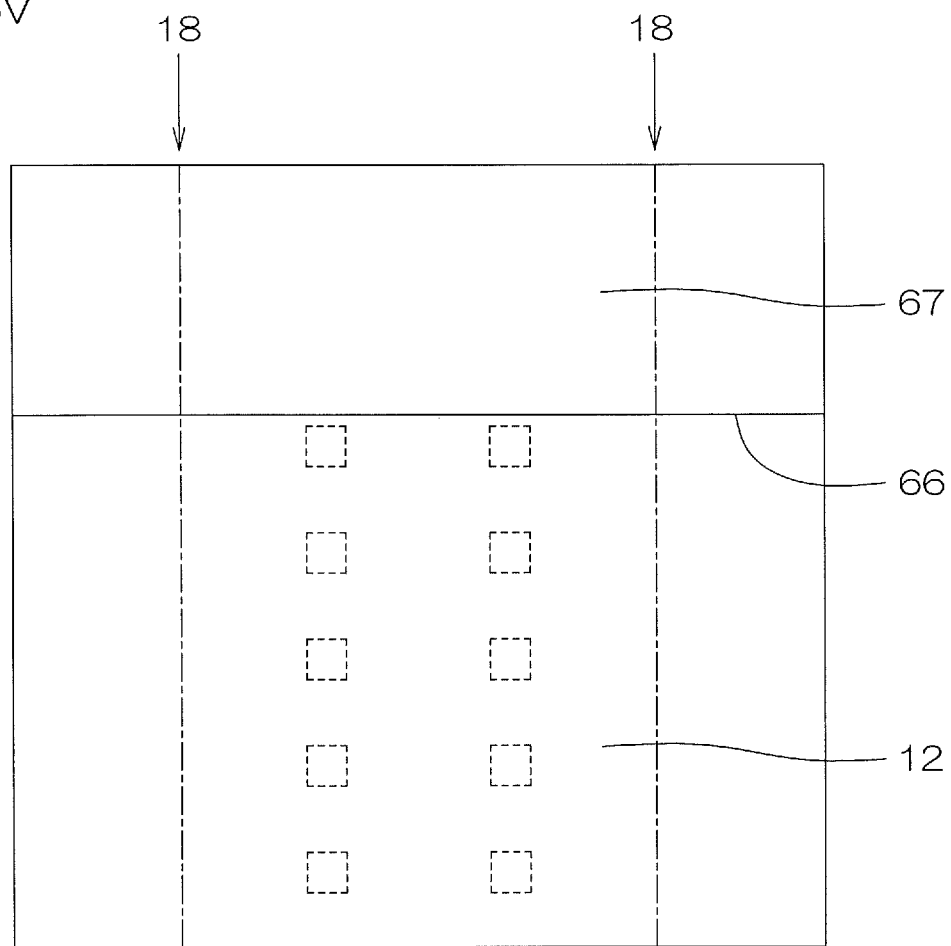
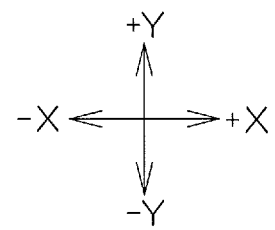

M1

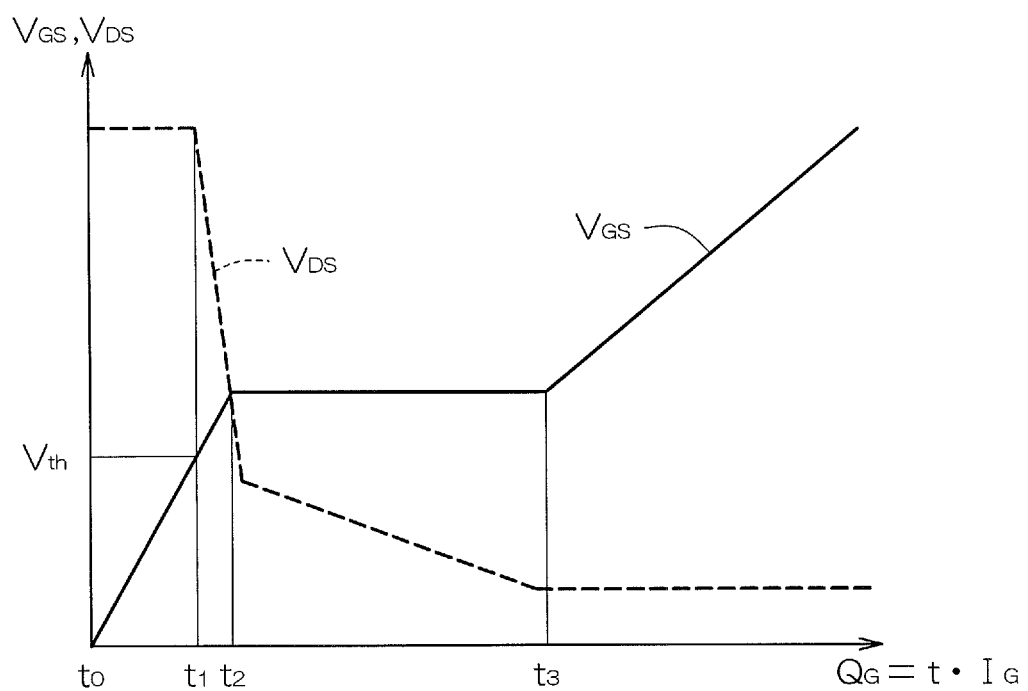

M2

FIG. 12 a=0.8 μm                                                Each capacitance at Vds=50V

|  | Ciss(pF) | Coss(pF) | Crss(pF) |
|---|---|---|---|
| Comparative Example (without second SFP) | 0.65 | 0.41 | 0.13 |
| Preferred Embodiment (b=0.6 μm) | 0.97 | 0.64 | 0.0055 |

Each capacitance at $V_{ds}=50V$

| Projection amount b($\mu$m) | Ciss(pF) | Coss(pF) | Crss(pF) |
|---|---|---|---|
| Comparative Example (without second SFP) | 0.48 | 0.37 | 0.045 |
| 0 | 0.57 | 0.40 | 0.012 |
| 0.3 | 0.58 | 0.41 | 0.0046 |
| 0.6 | 0.58 | 0.43 | 0.0025 |
| 0.9 | 0.58 | 0.45 | 0.0019 |

FIG. 15

Each capacitance at Vds=50V

| Interval d (μm) | Ciss(pF) | Coss(pF) | Crss(pF) |
|---|---|---|---|
| 0.1 | 0.70 | 0.43 | 0.0022 |
| 0.2 | 0.58 | 0.43 | 0.0025 |
| 0.4 | 0.52 | 0.44 | 0.0033 |

SEMICONDUCTOR DEVICE AND METHOD FOR PRODUCING SAME

TECHNICAL FIELD

The present invention relates to a semiconductor device and a method for producing the same.

BACKGROUND ART

An HEMT (high electron mobility transistor) using a nitride semiconductor has been proposed. Such an HEMT includes, for example, an electron transit layer constituted of GaN and an electron supply layer constituted of AlGaN epitaxially grown on the electron transit layer. A pair of a source electrode and a drain electrode are formed such as to contact the electron supply layer, and a gate electrode is disposed between these electrodes. The gate electrode is disposed such as to oppose the electron supply layer across an insulating film. Due to polarization caused by lattice mismatch between GaN and AlGaN, a two-dimensional electron gas is formed at a position inside the electron transit layer just several Å inward from an interface between the electron transit layer and the electron supply layer. A source and a drain are connected to each other through this two-dimensional electron gas as a channel. When the two-dimensional electron gas is interrupted by applying a control voltage to the gate electrode, the source and the drain are interrupted from each other. The device is of a normally-on type because the source and the drain are made conductive to each other in a state where the control voltage is not applied to the gate electrode.

A device using a nitrogen semiconductor has such features as high withstand voltage, high temperature operation, large current density, high-speed switching, and low on resistance and have thus been studied for application to a power device. However, for use as a power device, the device needs to be of a normally-off type that interrupts current at zero bias and therefore, an HEMT such as described above cannot be applied to a power device.

A structure for realizing a normally-off type nitrogen semiconductor HEMT is proposed, for example, in Patent Literature 1. According to Patent Literature 1, an oxide film having an interface that is continuous to an interface between an electron supply layer and an electron transit layer is formed on the electron transit layer. Also, a gate electrode opposes the electron transit layer from above and across the oxide film. With such an arrangement, the electron supply layer is not present directly below the gate electrode and therefore a two-dimensional electron gas is not formed directly below the gate electrode. A normally-off operation is thereby achieved. The oxide film is formed, for example, by thermally oxidizing a portion of the electron supply layer.

CITATION LIST

Patent Literature

Patent Literature 1: Japanese Patent Application Publication No. 2013-65612

SUMMARY OF INVENTION

Technical Problem

With a device that uses a nitride semiconductor, etc., there is a problem in that if a feedback capacitance that is a static capacitance between a gate and a drain is large, switching characteristics are degraded.

An object of the present invention is to provide a semiconductor device with which a feedback capacitance can be reduced and switching characteristics can be improved and a method for producing the same.

Solution to Problem

A preferred embodiment of a semiconductor device according to the present invention is a semiconductor device having an electrode structure that includes a source electrode, a gate electrode, and a drain electrode disposed on a semiconductor laminated structure and extending in parallel to each other and in a predetermined first direction and a wiring structure that includes a source wiring, a drain wiring, and a gate wiring disposed on the electrode structure and extending in parallel to each other and in a second direction orthogonal to the first direction and with which the source wiring, the drain wiring, and the gate wiring are electrically connected to the source electrode, the drain electrode, and the gate electrode, respectively, and includes a conductive film disposed between the gate electrode and the drain wiring and being electrically connected to the source electrode.

With the present arrangement, at least a portion of electric lines of force between the gate electrode and the drain wiring is interrupted by the conductive film and therefore a static capacitance formed by the gate electrode and the drain wiring can be reduced. A feedback capacitance can thereby be reduced and therefore, switching characteristics can be improved.

In the preferred embodiment of the present invention, the conductive film extends in the first direction along an upper surface of the gate electrode.

In the preferred embodiment of the present invention, a width of the conductive film is greater than a width of the upper surface of the gate electrode and in plan view, each side edge of the conductive film projects further outward than a corresponding side edge of the upper surface of the gate electrode.

In the preferred embodiment of the present invention, an amount of projection of each side edge of the conductive film from the corresponding side edge of the upper surface of the gate electrode is not less than 0.3 µm and not more than 0.9 µm.

In the preferred embodiment of the present invention, a distance between the upper surface of the gate electrode and a lower surface of the conductive film is not less than 0.15 µm and not more than 0.25 µm.

In the preferred embodiment of the present invention, the source electrode and the drain electrode are disposed apart from the gate electrode such as to sandwich the gate electrode.

In the preferred embodiment of the present invention, the semiconductor laminated structure includes an active area including an element structure arranged by sandwiching the gate electrode with the source electrode and the drain electrode and a nonactive area outside the active area and in the nonactive area, the source wiring and the conductive film are electrically connected.

In the preferred embodiment of the present invention, the semiconductor laminated structure includes an electron transit layer and an electron supply layer formed on the electron transit layer and having formed therein a lower opening portion reaching the electron transit layer, an insulating layer having an upper opening portion in communication with the lower opening portion is formed on the semiconductor laminated structure, a gate insulating film is formed such as to cover a front surface of the insulating layer and a bottom portion and a side portion of a gate opening portion constituted of the lower opening portion and the upper opening portion, and the gate electrode is formed on the gate insulating film inside the gate opening portion.

In the preferred embodiment of the present invention, a second conductive film embedded in the insulating layer and between the gate electrode and the drain electrode, insulated from the gate electrode, and electrically connected to the source electrode is further included.

In the preferred embodiment of the present invention, a third conductive film embedded in the insulating layer and between the gate electrode and the source electrode and insulated from the gate electrode and the source electrode is further included.

In the preferred embodiment of the present invention, a side wall of an insulating property disposed between the gate insulating film and the side portion of the gate opening portion is further included.

In the preferred embodiment of the present invention, the gate electrode includes an overlap portion formed on the gate insulating film at a peripheral edge of the gate opening portion.

A preferred embodiment of a method for producing a semiconductor device according to the present invention includes a step of forming a source electrode, a drain electrode, and a gate electrode extending in parallel to each other and in a predetermined first direction on a semiconductor laminated structure including an electron transit layer and an electron supply layer formed on the electron transit layer, a step of forming a first insulating layer disposed above the source electrode and the drain electrode and covering the gate electrode, a step of forming a conductive film at a position on the first insulating layer opposing an upper surface of the gate electrode, a step of forming a second insulating layer on the first insulating layer such as to cover the conductive film, a step in which a source via metal, a drain via metal, and a gate via metal for connecting the source electrode, the drain electrode, and the gate electrode respectively to a source wiring, a drain wiring, and a gate wiring formed on the second insulating layer are formed inside an insulating layer between the electrodes and the wirings and a conductive film via metal for connecting the conductive film to the source wiring is formed inside the second insulating layer, and a step in which the source wiring, the drain wiring, and the gate wiring extending in parallel to each other and in a second direction that is a direction along a front surface of the second insulating layer and is orthogonal to the first direction are formed on the second insulating layer.

In the preferred embodiment of the method for producing the semiconductor device according to the present invention, the conductive film extends in the first direction along the upper surface of the gate electrode.

In the preferred embodiment of the method for producing the semiconductor device according to the present invention, a width of the conductive film is greater than a width of the upper surface of the gate electrode and each side edge of the conductive film projects further outward than a corresponding side edge of the upper surface of the gate electrode.

The above and yet other objects, features, and effects of the present invention will be apparent from the following description of the preferred embodiments described with reference to the accompanying drawings.

BRIEF DESCRIPTION OF DRAWINGS

FIG. 1 is a plan view of a semiconductor device according to a preferred embodiment of the present invention and is a plan view with which layers further to an upper side than a pad portion are omitted.

FIG. 5C is a sectional view of a step subsequent to that of FIG. 5B.

FIG. 5F is a sectional view of a step subsequent to that of FIG. 5E.

FIG. 5H is a sectional view of a step subsequent to that of FIG. 5G.

FIG. 5K is a sectional view of a step subsequent to that of FIG. 5J.

FIG. 5O is a sectional view of a step subsequent to that of FIG. 5N.

FIG. 6A is a plan view of the example of the production process of the semiconductor device.

FIG. 6D is a plan view of a step subsequent to that of FIG. 6C.

FIG. 6F is a plan view of a step subsequent to that of FIG. 6E.

FIG. 6H is a plan view of a step subsequent to that of FIG. 6G.

FIG. 6K is a plan view of a step subsequent to that of FIG. 6J.

FIG. 6L is a plan view of a step subsequent to that of FIG. 6K.

FIG. 6M is a plan view of a step subsequent to that of FIG. 6L.

FIG. 6O is a plan view of a step subsequent to that of FIG. 6N.

FIG. 6T is a plan view of a step subsequent to that of FIG. 6S.

FIG. 6V is a plan view of a step subsequent to that of FIG. 6U.

FIG. 10 is a graph of changes in a gate-source voltage $V_{GS}$ and a drain-source voltage $V_{DS}$ with respect to an input gate charge amount when the gate voltage is applied to the gate G.

FIG. 12 is a table of simulation results.

FIG. 14 is a table of simulation results.

FIG. 15 is a table of simulation results.

DESCRIPTION OF EMBODIMENTS

Figure 2A:
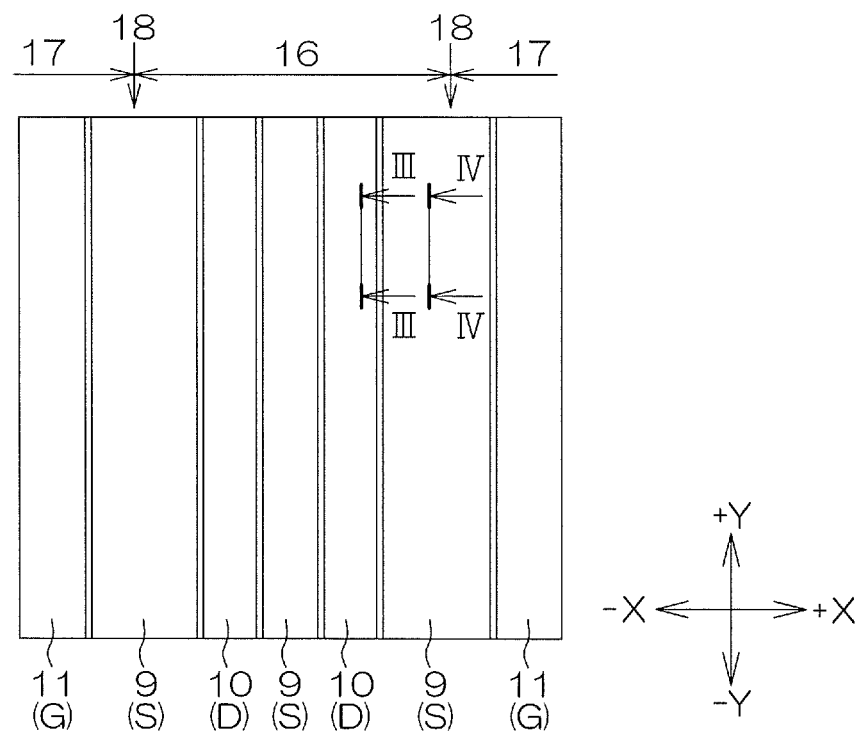
FIG. 2A is an enlarged plan view of a portion A of FIG. 1 and is a diagram showing a wiring metal structure disposed lower than the pad portion and FIG. 2B is an enlarged plan view of the portion A of FIG. 1 and is a diagram showing an electrode metal structure disposed lower than the wiring metal structure.
Figure 2B:
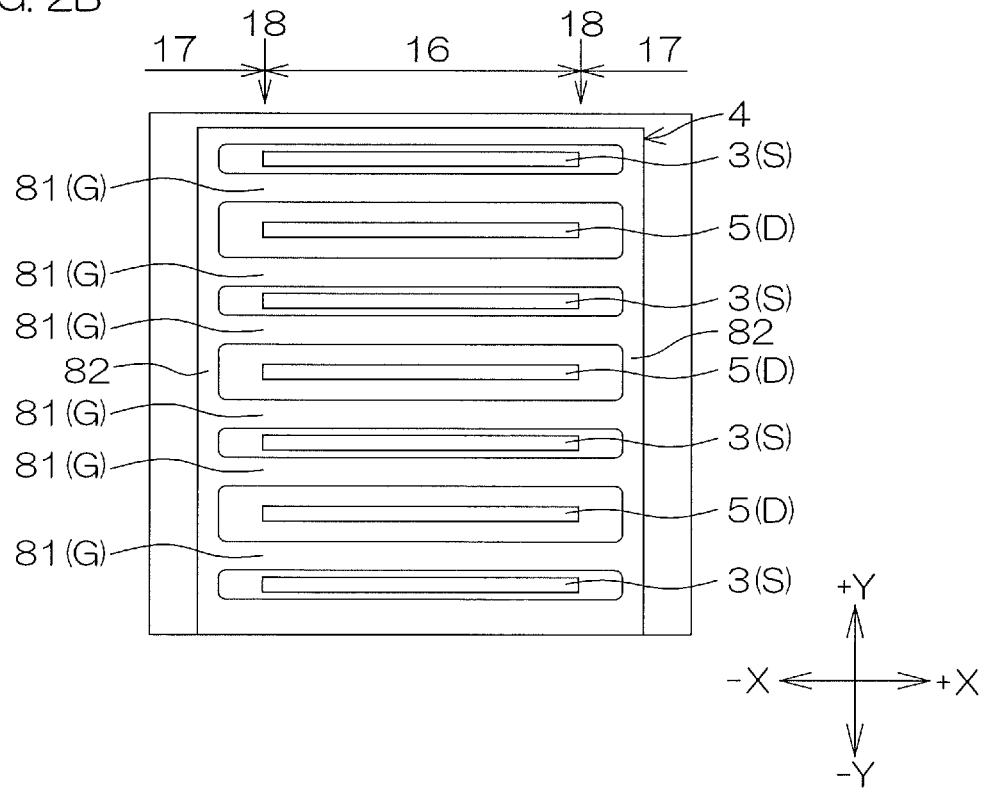

FIG. 1 is a plan view of a semiconductor device according to a preferred embodiment of the present invention and is a plan view with which layers further to an upper side than a pad portion are omitted. FIG. 2A is an enlarged plan view of a portion A of FIG. 1 and is a diagram showing a wiring metal structure disposed lower than the pad portion. FIG. 2B is an enlarged plan view of the portion A of FIG. 1 and is a diagram showing an electrode metal structure disposed lower than the wiring metal structure.

The semiconductor device 1 is formed to a rectangular shape in plan view. For convenience of description, a +X direction, a −X direction, a +Y direction, and a −Y direction shown in FIG. 1, FIG. 2A, and FIG. 2B are used at times in the following description. The +X direction and the −X direction are two directions along one side among two adjacent sides of a front surface of the semiconductor device 1 in plan view, and the +Y direction and the −Y direction are two directions along the other side. The +X direction and the −X direction shall be referred to simply as the "X direction" when referred to collectively, and the +Y direction and the −Y direction shall be referred to simply as the "Y direction" when referred to collectively.

The semiconductor device 1 includes a semiconductor laminated structure (nitride semiconductor structure) 2, an electrode metal structure disposed on the semiconductor laminated structure 2, a wiring metal structure disposed on the electrode metal structure, and a pad portion disposed on the wiring metal structure.

As shown in FIG. 2B, the electrode metal structure includes source electrodes 3, a gate electrode 4, and a drain electrode 5. The source electrodes 3 and the drain electrodes 5 extend in the X direction. The gate electrode 4 includes a plurality of electrode portions 81 extending in parallel to each other in the X direction and two base portions 82 respectively coupling corresponding end portions of the plurality of electrode portions 81 to each other.

In the example of FIG. 2B, the source electrodes 3 (S), the electrode portions 81 (G) of the gate electrode 4, and the drain electrodes 5 (D) are disposed cyclically in an order of DGSGDGS in the Y direction. Thereby, element structures are arranged by each electrode portion 81 (G) of the gate electrode 4 being sandwiched by a source electrode 3 (S) and a drain electrode 5 (D). A region of a front surface on the semiconductor laminated structure 2 is constituted of an active area 16 that includes the element structures and a nonactive area 17 besides the active area 16. In FIG. 2A and FIG. 2B, reference signs 18 indicate element isolation lines that are boundary lines between the active area 16 and the nonactive area 17. The base portions 82 of the gate electrode 4 respectively couple the corresponding end portions of the plurality of electrode portions 81 to each other in the nonactive area 17.

As shown in FIG. 2A, the wiring metal structure includes source wirings 9 (S), drain wirings 10 (D), and gate wirings 11 (G) extending in the Y direction. In the example of FIG. 2A, the source wirings 9 (S) and the drain wirings 10 (D) are disposed side by side alternately between two gate wirings 11 (G) that are disposed apart in the X direction. The source wirings 9 (S), the drain wirings 10 (D), and the gate wirings 11 (G) of the wiring metal structure are orthogonal to the source electrodes 3 (S), the electrode portions 81 (G) of the gate electrode 4, and the drain electrodes 5 (D) of the electrode metal structure. The source wirings 9 (S), the drain wirings 10 (D), and the gate wirings 11 (G) are respectively electrically connected to the source electrodes 3 (S), the drain electrodes 5 (D), and the gate electrode 4 (G).

As shown in FIG. 1, a drain pad 12, a source pad 13, a gate pad 14, and a substrate contact portion 15 are disposed in the pad portion. The drain pad 12, the source pad 13, and the gate pad 14 are respectively electrically connected to the drain wirings 10 (D), the source wirings 9 (S), and the gate wirings 11 (G).

Figure 3:
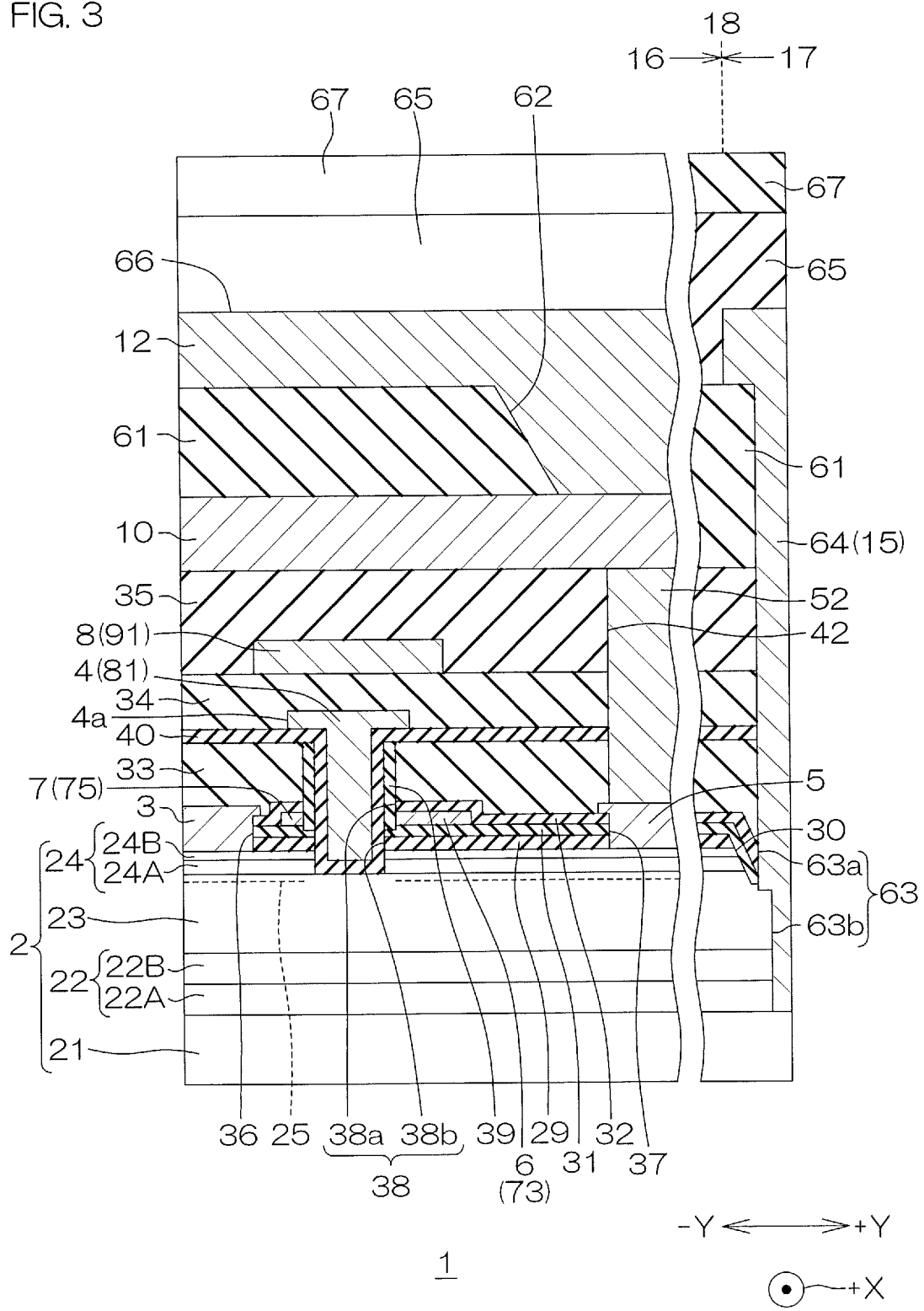
FIG. 3 is an enlarged sectional view mainly of a section taken along line III-III of FIG. 2A.

FIG. 3 is an enlarged sectional view mainly of a section taken along line III-III of FIG. 2A. In FIG. 3, in a region in which a drain wiring 10 is present in plan view, a cross section of viewing a small region that includes one electrode portion 81 of the gate electrode 4 of FIG. 2B from the X direction is indicated as the active area 16.

Figure 4:
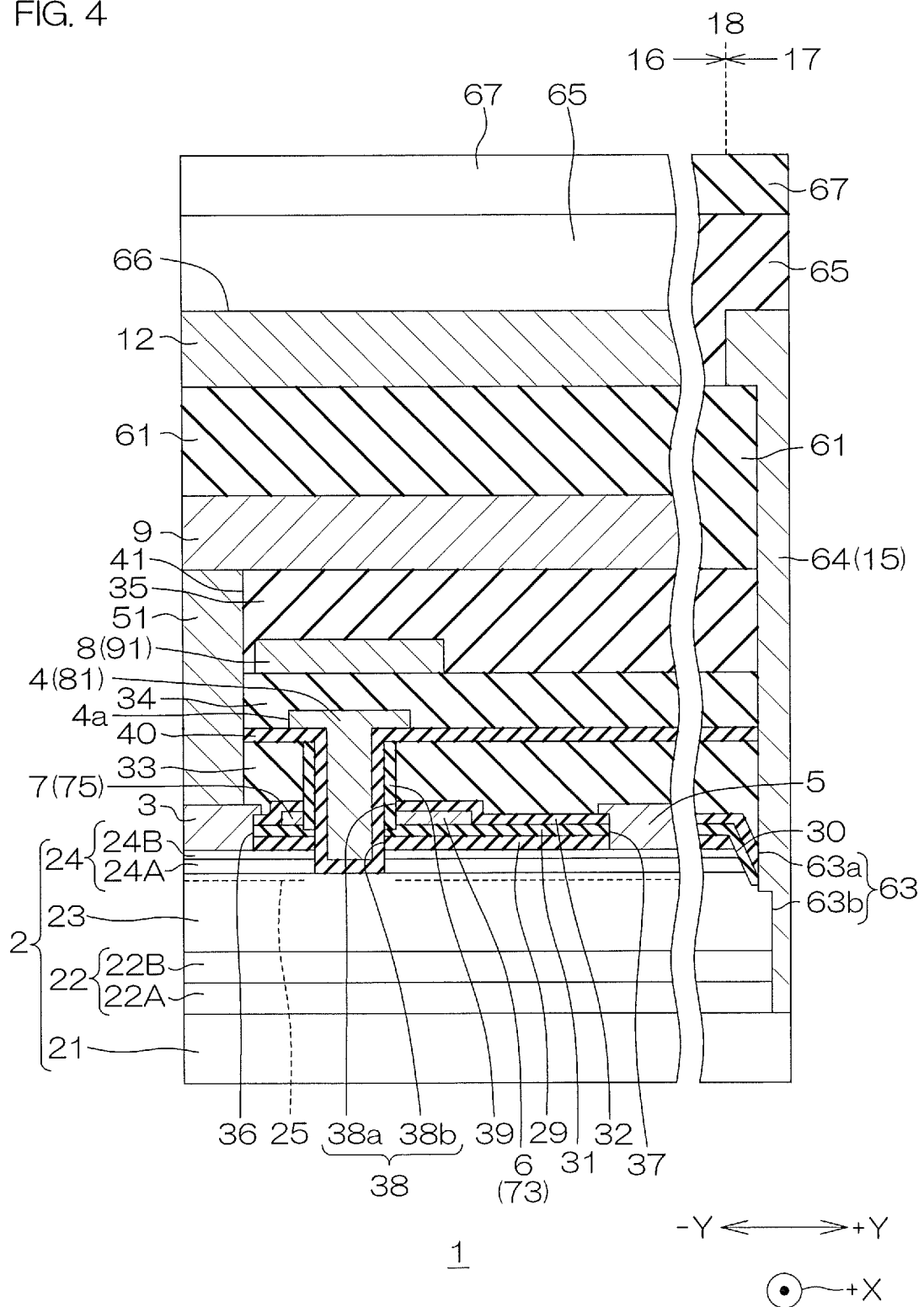
FIG. 4 is an enlarged sectional view mainly of a section taken along line IV-IV of FIG. 2A.

FIG. 4 is an enlarged sectional view mainly of a section taken along line IV-IV of FIG. 2A. In FIG. 4, in a region in which a source wiring 9 is present in plan view, a cross section of viewing a small region that includes one electrode portion 81 of the gate electrode 4 of FIG. 2B from the X direction is indicated as the active area 16. Also, in FIG. 3 and FIG. 4, a cross section of viewing a portion of the substrate contact portion 15 of FIG. 1 is indicated as the nonactive area 17.

Referring to FIG. 3 and FIG. 4, the semiconductor laminated structure 2 includes a substrate 21, a buffer layer 22 formed on a front surface of the substrate 21, an electron transit layer 23 epitaxially grown on the buffer layer 22, and an electron supply layer 24 epitaxially grown on the electron transit layer 23.

The substrate 21 is, for example, a silicon substrate. In this preferred embodiment, the buffer layer 22 is constituted from a first buffer layer 22A constituted of an AlN film in contact with the front surface of the substrate 21 and a second buffer layer 22B constituted of an AlGaN film laminated on a front surface (front surface at an opposite side to the substrate 21) of the first buffer layer. A film thickness of the first buffer layer 22A is, for example, 0.2 µm and a film thickness of the second buffer layer 22B is, for example, 0.12 µm. The buffer layer 22 may instead be constituted, for example, from a single film of AlN.

The electron transit layer 23 and the electron supply layer 24 are constituted of nitride semiconductors that differ from each other in Al composition. In this preferred embodiment, the electron transit layer 23 is constituted of a GaN layer and a thickness thereof is approximately 0.1 µm to 3.0 µm. The electron supply layer 24 is mainly constituted of a nitride semiconductor of higher Al composition than the electron transit layer 23. In this preferred embodiment, the electron supply layer 24 is constituted of an AlN layer 24A formed on the electron transit layer 23 and a cap layer 24B formed on the AlN layer 24A. A thickness of the AlN layer 24A is, for example, approximately 2 nm. The AlN layer 24A is not restricted to an AlN layer and suffices to be constituted from an $Al_xIn_yGa_{1-x-y}N$ ($0.8 \leq x \leq 1.0$, $0 \leq x+y \leq 1$) layer. The cap layer 24B is constituted of a GaN layer and is provided to reduce roughness of a front surface of the AlN layer 24A. A film thickness of the cap layer 24B is approximately 1 nm. The electron supply layer 24 may instead be constituted from just the AlN layer 24A.

The electron transit layer 23 and the electron supply layer 24 are thus constituted of nitride semiconductors of different Al composition and a lattice mismatch occurs therebetween. Specifically, a lattice constant of AlN that mainly constitutes the electron supply layer 24 is smaller than a lattice constant of GaN that constitutes the electron transit layer 23. Therefore, in the electron supply layer 24, a tensile strain is generated in a direction parallel to a growth surface. And, by spontaneous polarizations of the electron transit layer 23 and the electron supply layer 24 and a piezoelectric polarization due to the lattice mismatch therebetween, an energy level of a conduction band of the electron transit layer 23 at an interface between the electron transit layer 23 and the electron supply layer 24 is made lower than a Fermi level. Thereby, a two-dimensional electron gas (2DEG) 25 spreads at a position inside the electron transit layer 23 close to the interface between the electron supply layer 24 and the electron transit layer 23 (for example, at a distance of about several Å from the interface).

A passivation film 29 is formed on the electron supply layer 24. The passivation film 29 is constituted of an SiN film. A film thickness of the passivation film 29 is, for example, approximately 6 nm to 25 nm. In the nonactive area 17, a recess 30 penetrating through the passivation film 29 and the electron supply layer 24 and reaching an interior of the electron transit layer 23 is formed in a front surface of the passivation film 29.

A first protective film 31, a second protective film 32, a first interlayer insulating film 33, a second interlayer insulating film 34, and a third interlayer insulating film 35 are formed in that order on the passivation film 29 and on a side wall and a bottom wall of the recess 30. The first protective film 31 covers the passivation film 29. The first protective film 31, the second protective film 32, and the first interlayer insulating film 33 correspond to an insulating layer of the device invention of the present application. The second interlayer insulating film 34 corresponds to a first insulating layer in the invention of a production method of the present application. The third interlayer insulating film 35 corresponds to a second insulating layer in the invention of the production method of the present application.

In this preferred embodiment, the respective films 31 to 35 are constituted of $SiO_2$ films. A thickness of the first protective film 31 is, for example, approximately 40 nm. A thickness of the second protective film 32 is, for example, approximately 100 nm. A thickness of the first interlayer insulating film 33 is, for example, approximately 600 nm. A thickness of the second interlayer insulating film 34 is, for example, approximately 200 nm. A thickness of the third interlayer insulating film 35 is, for example, approximately 500 nm.

Source contact holes 36 and drain contact holes 37 that reach the electron supply layer 24 are formed in the second protective film 32, the first protective film 31, and the passivation film 29. The source electrodes 3 and the drain electrodes 5 are embedded in the source contact holes 36 and the drain contact holes 37, respectively. In this preferred embodiment, the source electrodes 3 and the drain electrodes 5 include overlap portions formed on the second protective film 32 at peripheral edges of the source contact holes 36 and the drain contact holes 37, respectively. Inside the source contact holes 36 and the drain contact holes 37, the source electrodes 3 and the drain electrodes 5 are respectively in ohmic contact with the electron supply layer 24. The source electrodes 3 and the drain electrodes 5 extend in the X direction (thickness direction of paper surface of FIG. 3 and FIG. 4).

The source electrodes 3 and the drain electrodes 5 are each constituted, for example, from a Ti/AlSiCu/Ti/TiN laminated film with which a Ti film, an AlSiCu film, a Ti film, and a TiN film are laminated in that order from a lower layer. A thickness of the Ti film at the lower layer side is, for example, 20 nm. A thickness of the AlSiCu film is, for example, approximately 2000 nm. A thickness of the Ti film at an upper layer side is, for example, 20 nm. A thickness of the TiN film is, for example, 50 nm.

Gate opening portions 38 reaching the electron transit layer 23 are each formed in the first interlayer insulating film 33, the second protective film 32, the first protective film 31, the passivation film 29, and the electron supply layer 24 at a position between a source electrode 3 and a drain electrode 5. Each gate opening portion 38 includes a first opening portion 38a formed in the first interlayer insulating film 33 and the second protective film 32 and a second opening portion 38b formed in the first protective film 31, the passivation film 29, and the electron supply layer 24 and being in communication with the first opening portion 38a. A portion of the second opening portion 38b penetrating through the electron supply layer 24 corresponds to a lower opening portion of the invention of the present application. Also, an upper opening portion of the invention of the present application is arranged by a portion of the second opening portion 38b penetrating through the passivation film 29 and the first protective film 31 and the first opening portion 38a.

The electron transit layer 23 is exposed at a bottom portion of the gate opening portion 38. A gate insulating film 40 is formed such as to cover bottom walls and side walls of the gate opening portions 38. The gate insulating film 40 is also formed between the first interlayer insulating film 33 and the second interlayer insulating film 34 in addition to being formed inside the gate opening portions 38. The gate insulating film 40 is constituted, for example, of an $SiO_2$ film. A thickness of the gate insulating film 40 is, for example, approximately 20 nm.

The gate electrode 4 is embedded in the gate opening portions 38. In this preferred embodiment, the gate electrode 4 includes overlap portions 4a formed on the gate insulating film 40 at peripheral edges of the gate opening portions 38. The electrode portions 81 of the gate electrode 4 extend in the X direction (thickness direction of paper surface of FIG. 3 and FIG. 4). The gate electrode 4 is constituted, for example, from a TiN/W/AlCu/TiN laminated film with which a TiN film, a W film, an AlCu film, and a TiN film are laminated in that order from a lower layer. A thickness of the TiN film at the lower layer side is, for example, 100 nm. A thickness of the W film is, for example, 500 nm. A thickness of the AlCu film is, for example, 500 nm. A thickness of the TiN film at an upper layer side is, for example, 50 nm.

A first source field plate (first SFP) 6 and a floating plate 7 are disposed at respective sides of each electrode portion 81 of the gate electrode 4 such as to partially form side portions of the gate opening portion 38. Each floating plate 7 is disposed between a source electrode 3 and an electrode portion 81 of the gate electrode 4. Each first source field plate 6 is disposed between an electrode portion 81 of the gate electrode 4 and a drain electrode 5.

The first source field plates 6 and the floating plates 7 are formed on the first protective film 31 such as to be exposed at height intermediate positions of the respective side portions of the gate opening portions 38. That is, with the side portions of the gate opening portions 38, lower sides are formed by the first protective film 31, the passivation film 29, and the electron supply layer 24, intermediate portions are formed by the first source field plates 6 and the floating plates 7, and upper sides are formed by the second protective film 32 and the first interlayer insulating film 33.

Side walls 39 of insulating property are formed at the side portions of the first opening portions 38a such as to contact the floating plates 7 and the first source field plates 6. That is, the side walls 39 are disposed between the side portions of the first opening portion 38a and the gate insulating film 40. For example, the side walls 39 are each constituted, for example, of an $SiO_2$ film and a thickness thereof is, for example, approximately 100 nm.

The floating plates 7 and the first source field plates 6 are insulated from the gate electrodes 4 by the side walls 39 and the gate insulating film 40. The floating plates 7 and the first source field plates 6 are each constituted, for example, of a TiN film and a thickness thereof is, for example, approximately 100 nm.

The first source field plates 6 are electrically connected to the source electrodes 3 (source wirings 9). As is well known, the first source field plates 6 are provided to relax electric field concentration on end portions of the electrode portions 81 of the gate electrode 4. On the other hand, the floating plates 7 are not electrically connected to any of the electrodes 3, 4, and 5.

On the second interlayer insulating film 34, a second source field plates (second SFP) 8 is disposed at a position opposing upper surfaces of the electrode portions 81 of the gate electrode 4 in plan view. The second source field plate 8 (to be accurate, electrode portions 91 of the second source field plate 8 to be described below) extends in the X direction (thickness direction of paper surface of FIG. 3 and FIG. 4). The second source field plate 8 is covered by the third interlayer insulating film 35.

In this preferred embodiment, a width of each second source field plate 8 is greater than a width of an upper surface (including an upper surface of the overlap portions 4a) of each electrode portion 81 of the gate electrode 4. In plan view, a −Y direction side end of the second source field plate 8 projects further in the −Y direction than a −Y direction side end of the upper surface of the electrode portion 81 of the gate electrode 4. Similarly, in plan view, a +Y direction side end of the second source field plate 8 projects further in the +Y direction than a +Y direction side end of the upper surface of the electrode portion 81 of the gate electrode 4. The second source field plate 8 is constituted, for example, of a TiN film and a thickness thereof is, for example, approximately 100 nm. Here, the −Y direction side end and the +Y direction side end of the second source field plate 8 do not have to project further outward from the −Y direction side end and the +Y direction side end, respectively, of the upper surface of the electrode portion 81 of the gate electrode 4 in plan view.

The second source field plate 8 is electrically connected to the source electrodes 3 (source wirings 9). The second source field plate 8 is provided to improve switching characteristics of the semiconductor device 1 by reducing a feedback capacitance Crss (=static capacitance Cgd between a gate and a drain). Details of the reason for providing the second source field plate 8 shall be described later.

First source via holes 41 and first drain via holes 42 (see FIG. 3, FIG. 4, and FIG. 6O) reaching the source electrodes 3 and the drain electrodes 5, respectively, are formed in the third interlayer insulating film 35, the second interlayer insulating film 34, the gate insulating film 40, and the first interlayer insulating film 33. Source via metals 51 and drain via metals 52 (see FIG. 3, FIG. 4, and FIG. 6P) are embedded in the first source via holes 41 and the first drain via holes 42, respectively. The source via metals 51 and the drain via metals 52 are electrically connected to the source electrodes 3 and the drain electrodes 5, respectively, inside the first source via holes 41 and the first drain via holes 42.

Although not illustrated in FIG. 3 and FIG. 4, first SFP via holes 44 (see FIG. 6O) reaching the first source field plates 6 are formed in the third interlayer insulating film 35, the second interlayer insulating film 34, the gate insulating film 40, the first interlayer insulating film 33, and the second protective film 32. First SFP via metals 54 (see FIG. 6P) are embedded in the first SFP via holes 44. Inside the first SFP via holes 44, the first SFP via metals 54 are electrically connected to the first source field plates 6.

Although not illustrated in FIG. 3 and FIG. 4, first gate via holes 43 (see FIG. 6O) reaching the gate electrode 4 are formed in the third interlayer insulating film 35 and the second interlayer insulating film 34. Gate via metals 53 (see FIG. 6P) are embedded in the first gate via holes 43. The gate via metals 53 are electrically connected to the gate electrode 4 inside the first gate via holes 43.

Although not illustrated in FIG. 3 and FIG. 4, second SFP via holes 45 (see FIG. 6O) reaching the second source field plate 8 are formed in the third interlayer insulating film 35. Second SFP via metals 55 (see FIG. 6P) are embedded in the second SFP via holes 45. Inside the second SFP via holes 45, the second SFP via metals 55 are electrically connected to the second source field plate 8.

On the third interlayer insulating film 35, the source wirings 9, the drain wirings 10, and the gate wirings 11 are formed at intervals in the X direction. The source wirings 9, the drain wirings 10, and the gate wirings 11 extend in the Y direction. A drain wiring 10 formed on the third interlayer insulating film 35 appears in the sectional view of FIG. 3. A source wiring 9 formed on the third interlayer insulating film 35 appears in the sectional view of FIG. 4.

Figure 6B:
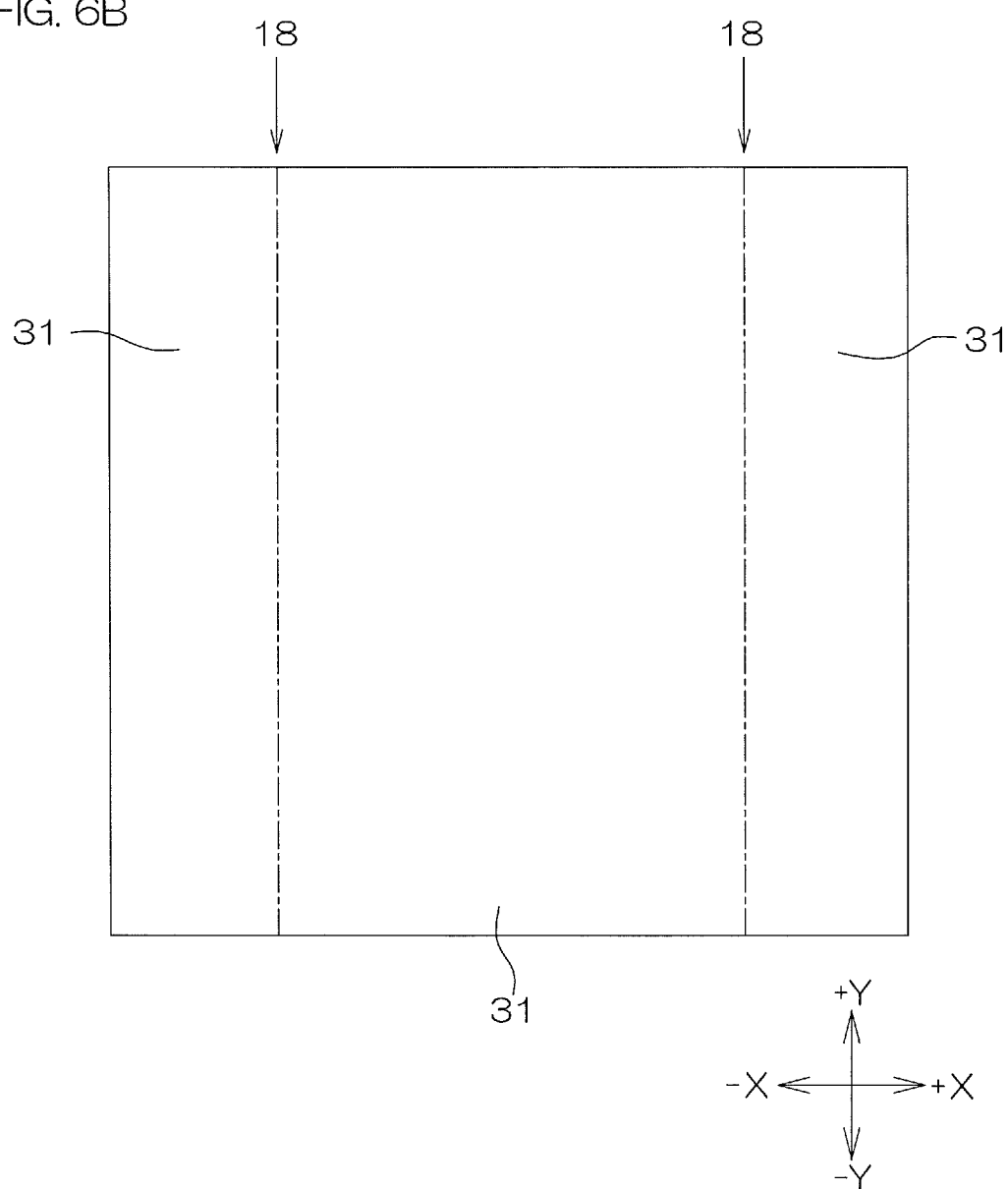
FIG. 6B is a plan view of a step subsequent to that of FIG. 6A.
Figure 6C:
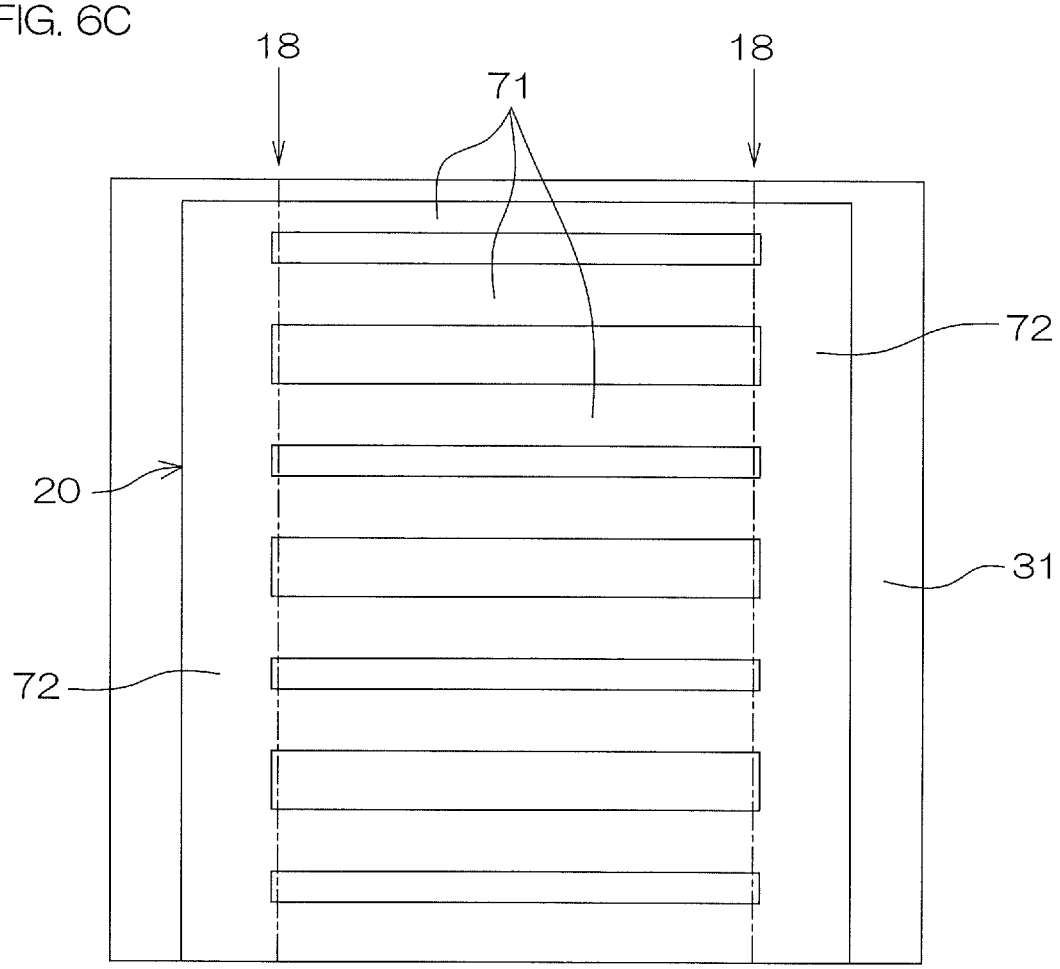
FIG. 6C is a plan view of a step subsequent to that of FIG. 6B.
Figure 6E:
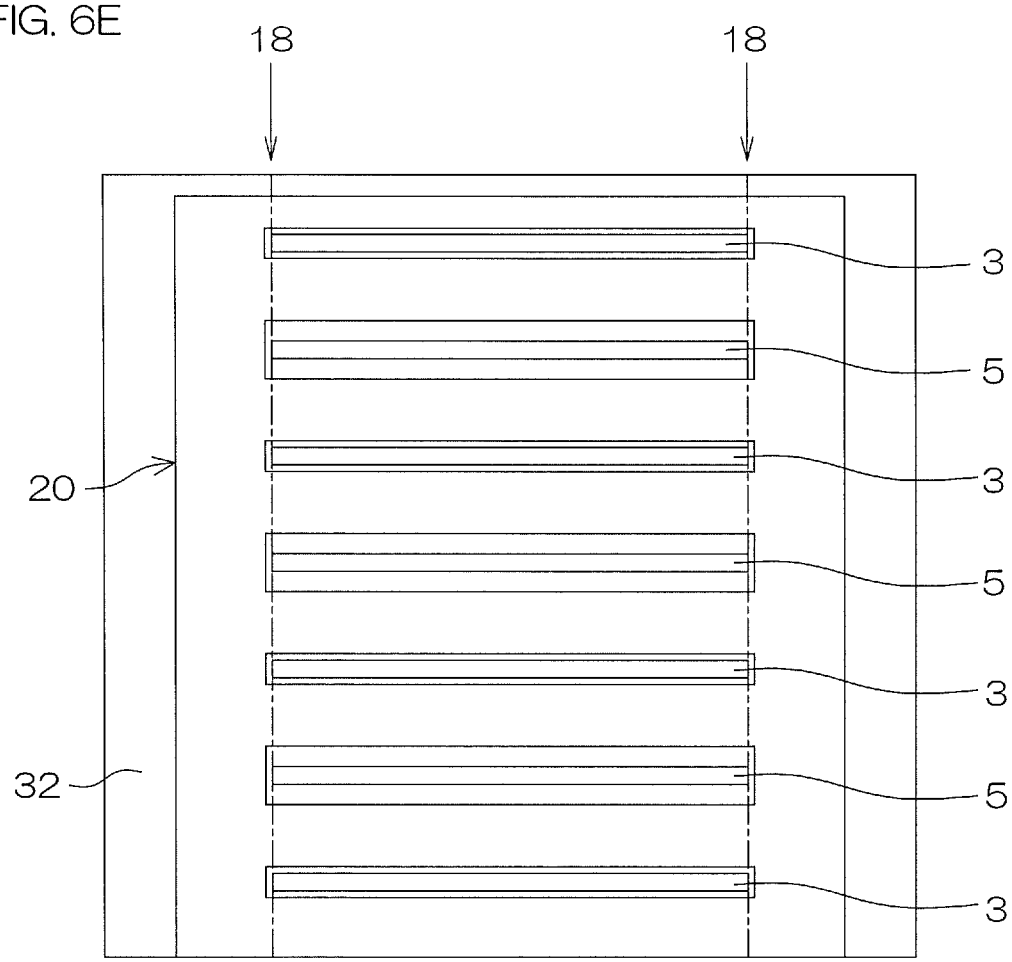
FIG. 6E is a plan view of a step subsequent to that of FIG. 6D.
Figure 6G:
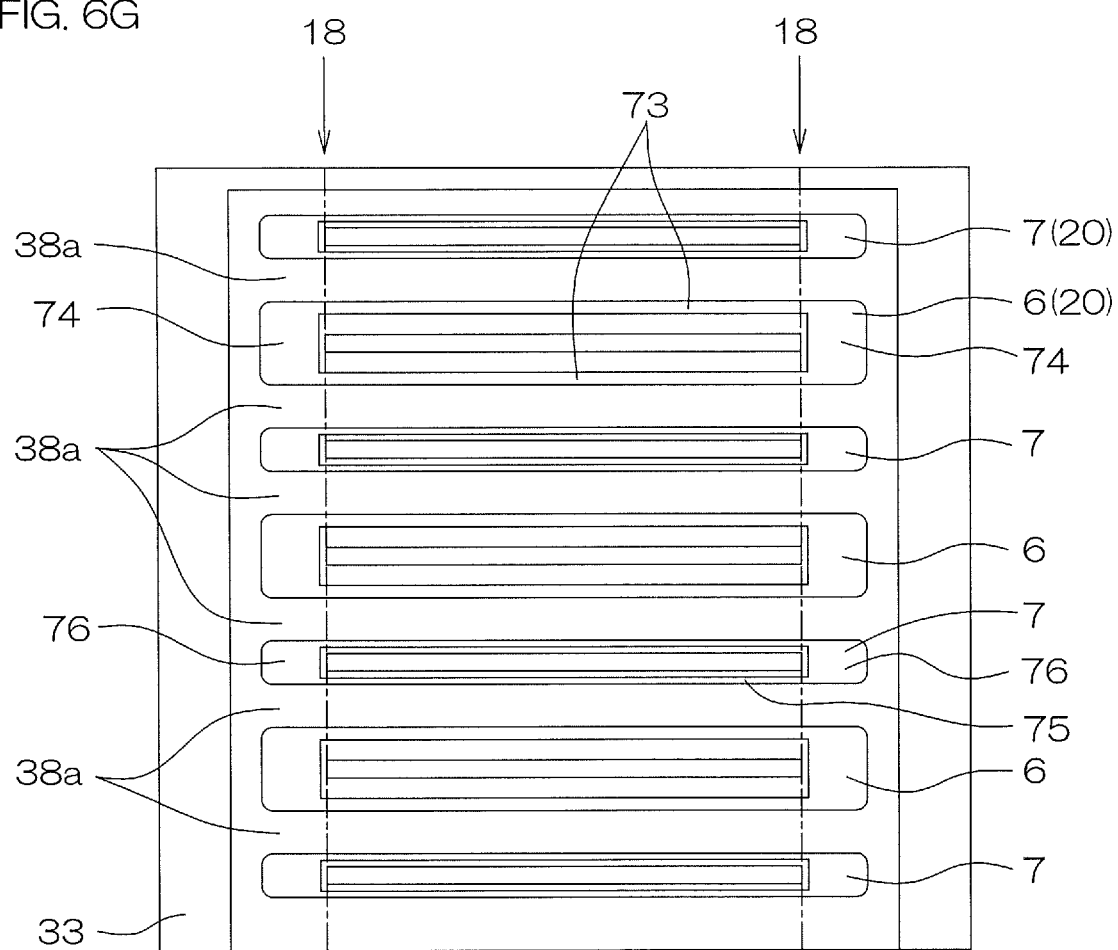
FIG. 6G is a plan view of a step subsequent to that of FIG. 6F.
Figure 6I:
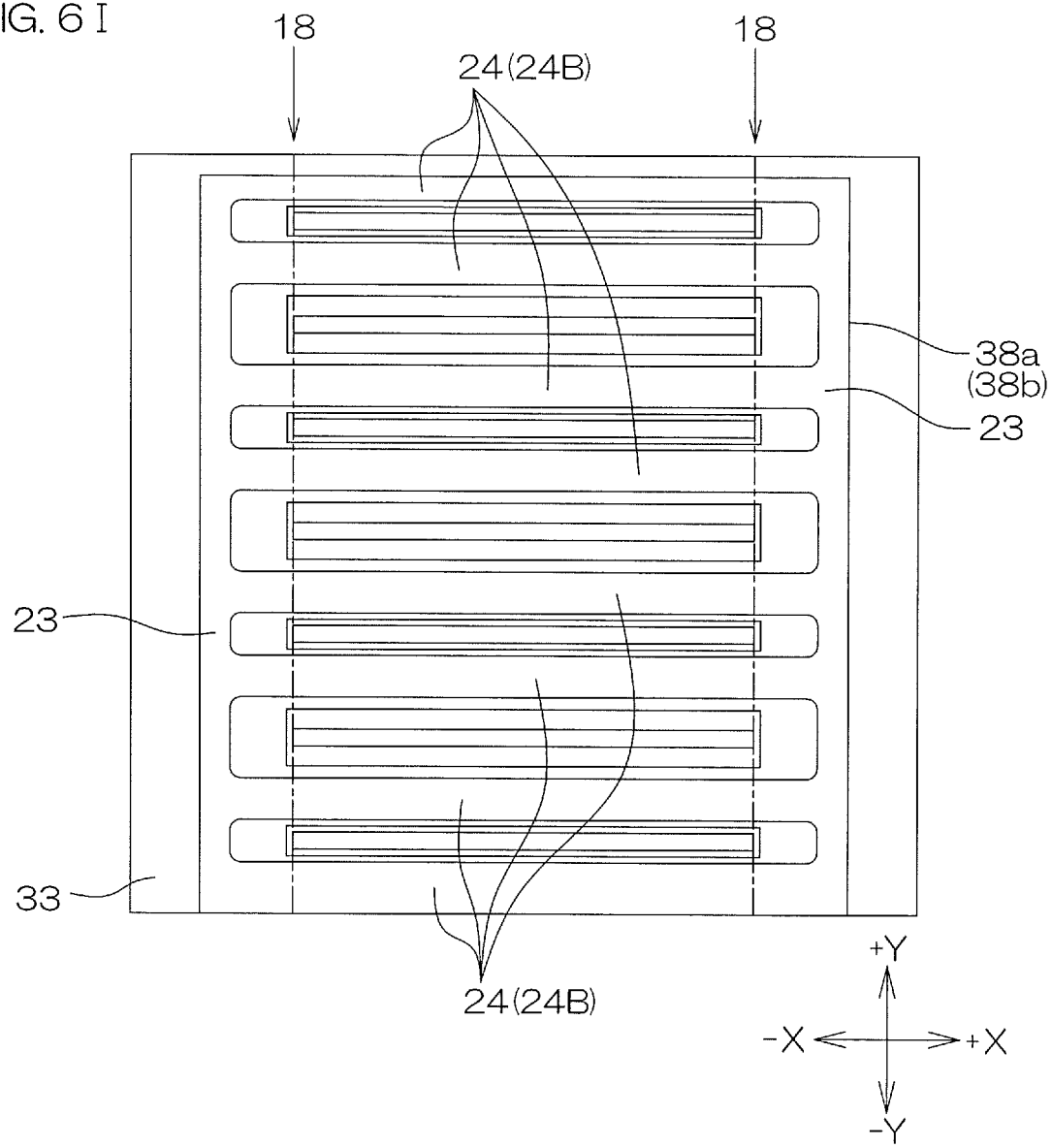
FIG. 6I is a plan view of a step subsequent to that of FIG. 6H.
Figure 6J:
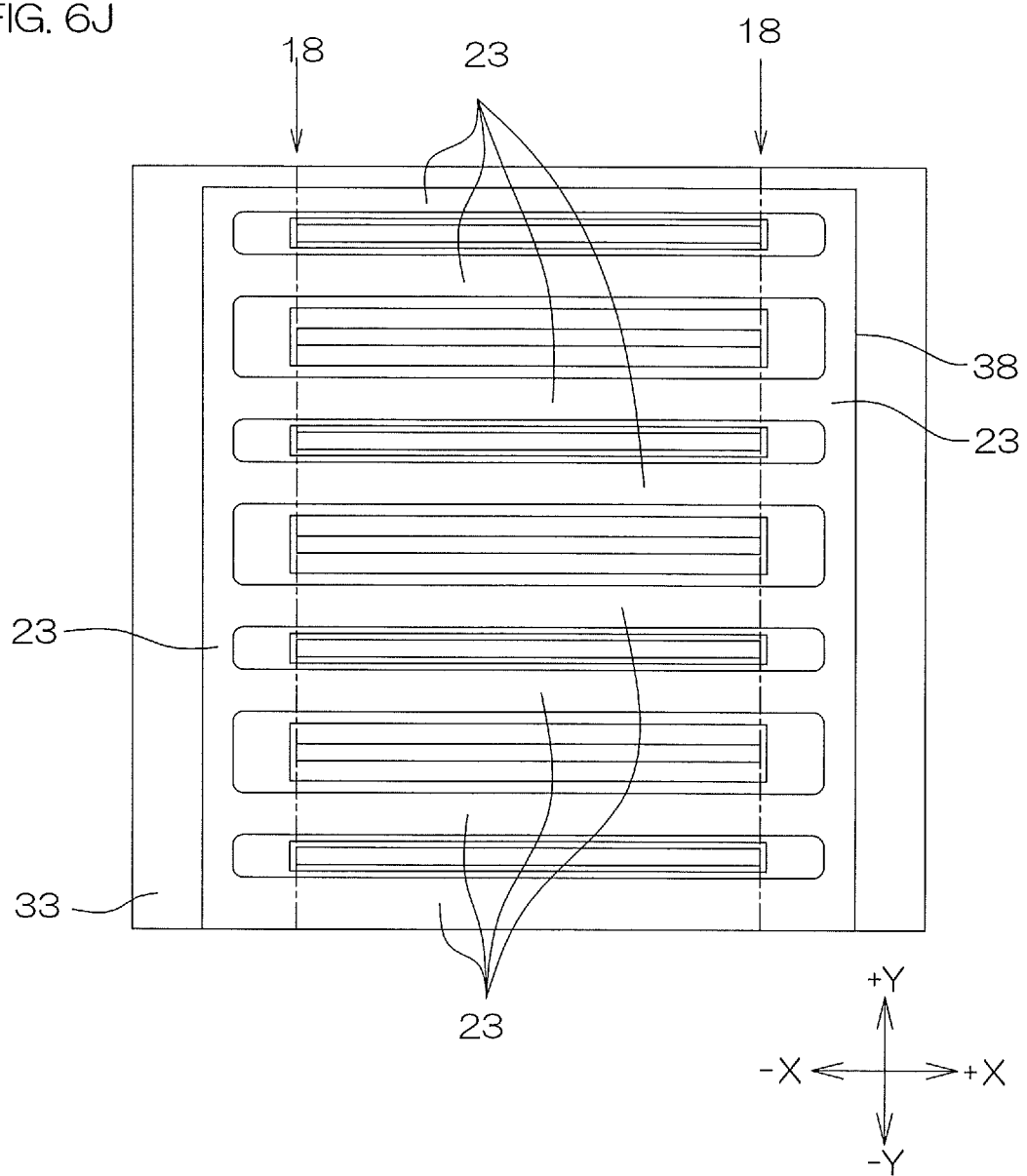
FIG. 6J is a plan view of a step subsequent to that of FIG. 6I.
Figure 6N:
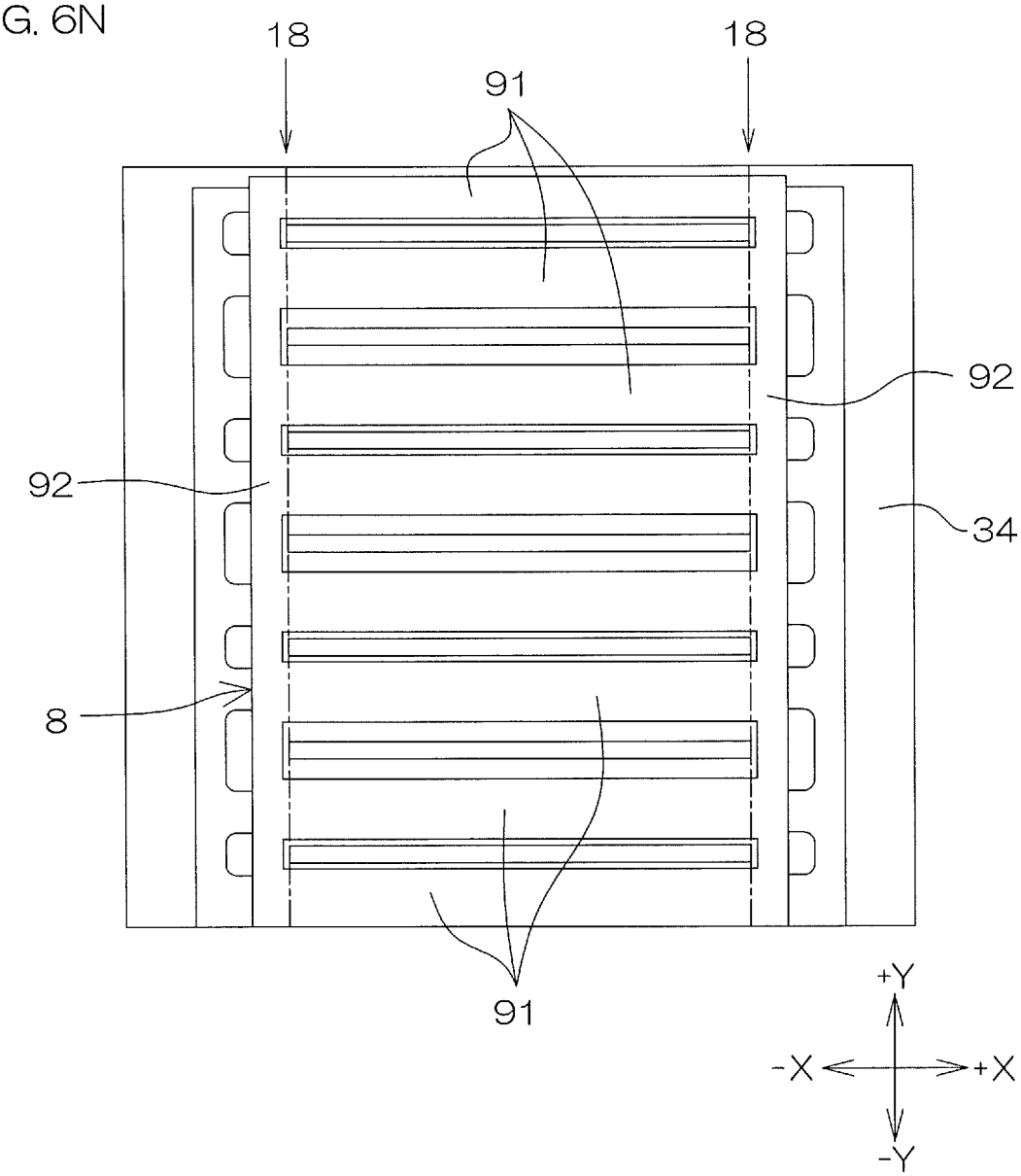
FIG. 6N is a plan view of a step subsequent to that of FIG. 6M.
Figure 60:
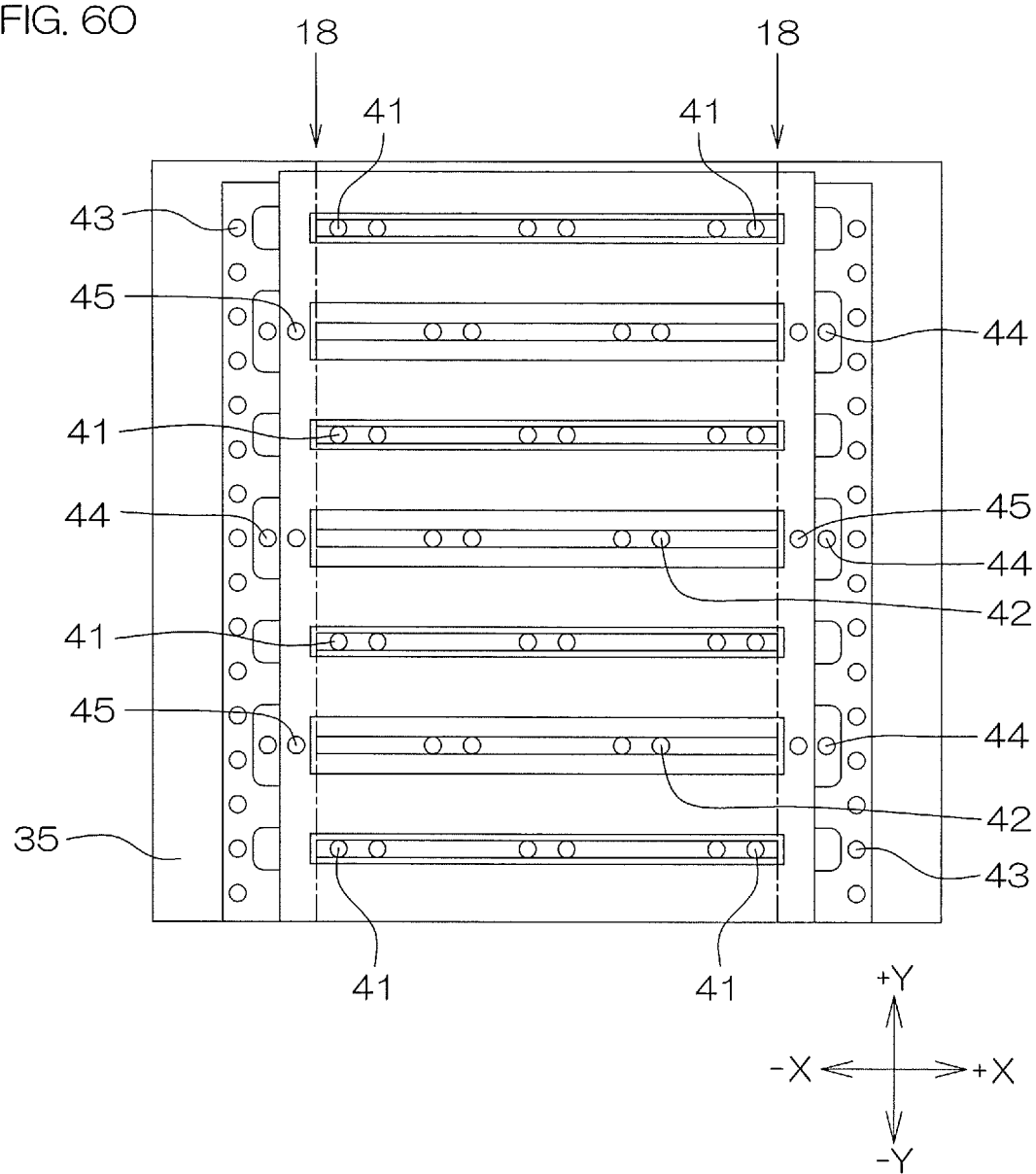
Figure 6P:
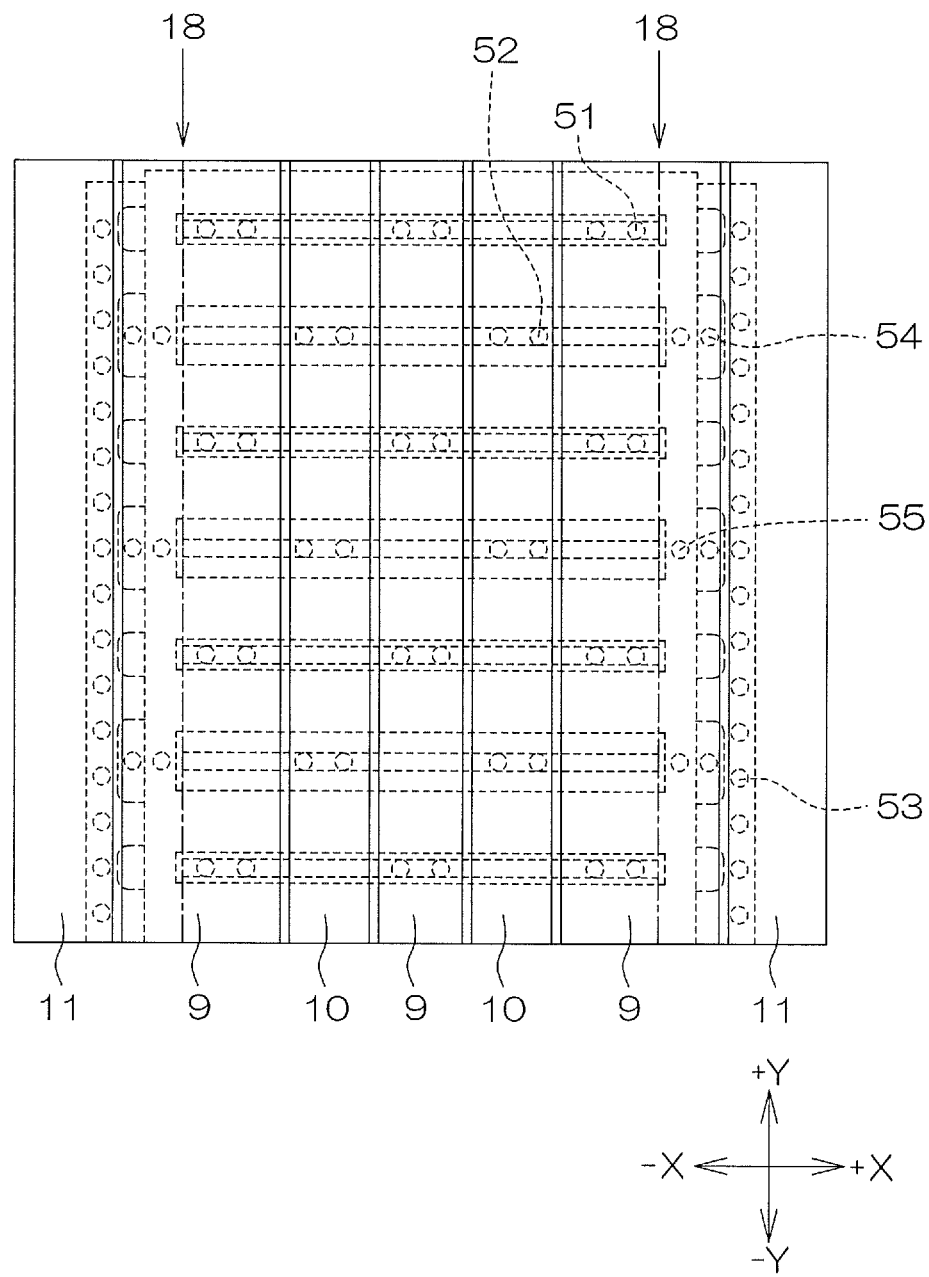
FIG. 6P is a plan view of a step subsequent to that of FIG. 6O.

As shown in FIG. 3 and FIG. 6P, the drain via metals 52 are connected to the drain wirings 10. Also, as shown in FIG. 4 and FIG. 6P, the source via metals 51 are connected to the source wirings 9. Although not illustrated in FIG. 4, the first SFP via metals 54 and the second SFP via metals 55 are connected to the source wirings 9 as shown in FIG. 6P. Although not illustrated in FIG. 3 and FIG. 4, the gate via metals 53 are connected to the gate wirings 11 as shown in FIG. 6P. Each of the via metals 51 to 55 is constituted of TiN barrier film formed on a side wall of the corresponding one of the via holes 41 to 45 and W (tungsten) embedded at an inner side of the TiN barrier film.

The source wirings 9, the drain wirings 10, and the gate wirings 11 are each constituted, for example, of a TiN/AlCu/TiN laminated film with which a TiN film, an AlCu film, and a TiN film are laminated in that order on the third interlayer insulating film 35. A thickness of each TiN film is, for example, approximately 40 nm and a thickness of the AlCu film is, for example, approximately 1000 nm.

A fourth interlayer insulating film 61 covering the source wirings 9, the drain wirings 10, and the gate wirings 11 is formed on the third interlayer insulating film 35. The fourth interlayer insulating film 61 is constituted, for example, of $SiO_2$ and a thickness thereof is, for example, approximately 1000 nm. As shown in FIG. 3, second drain via holes 62 reaching the drain wirings 10 are formed at required locations of the fourth interlayer insulating film 61. Although not illustrated in FIG. 3 and FIG. 4, second source via holes reaching the source wirings 9 and the second gate via holes reaching the gate wirings 11 are formed at required locations of the fourth interlayer insulating film 61.

As shown in FIG. 3 and FIG. 4, the drain pad 12 is formed on the fourth interlayer insulating film 61. The drain pad 12 enters into the second drain via holes 62 and, inside the second drain via holes 62, is connected to the drain wirings 10. Although not illustrated in FIG. 3 and FIG. 4, the source pad 13 and the gate pad 14 shown in FIG. 1 are formed on the fourth interlayer insulating film 61. The source pad 13 enters into the second source via holes and, inside the second source via holes, is connected to the source wirings 9. The gate pad 14 enters into the second gate via holes and, inside the second gate via holes, is connected to the gate wirings 11. The drain pad 12, the source pad 13, and the gate pad 14 are each constituted, for example, of a TiN/AlCu laminated film of a TiN film of a lower layer and an AlCu film of an upper layer. A thickness of the TiN film is, for example, approximately 40 nm and a thickness of the AlCu film is, for example, approximately 4200 nm.

In the nonactive area 17 (nonactive area including the substrate contact portion 15), a substrate contact hole 63 reaching the substrate 21 is formed in the fourth interlayer insulating film 61, the third interlayer insulating film 35, the second interlayer insulating film 34, the gate insulating film 40, the first interlayer insulating film 33, the second protective film 32, the first protective film 31, the electron transit layer 23, and the buffer layer 22. The substrate contact hole 63 is constituted of a first substrate contact hole 63a formed in the fourth interlayer insulating film 61, the third interlayer insulating film 35, the second interlayer insulating film 34, the gate insulating film 40, the first interlayer insulating film 33, the second protective film 32, and the first protective film 31 and a second substrate contact hole 63b formed in the electron transit layer 23 and the buffer layer 22 and being in communication with the first substrate contact hole 63a.

The substrate contact portion 15 is formed by a substrate contact metal 64 being embedded inside the substrate contact hole 63. Materials of the substrate contact metal 64 are, for example, same as the materials of the drain pad 12, the source pad 13, and the gate pad 14.

A third protective film 65 covering the drain pad 12, the source pad 13, the gate pad 14, and the substrate contact portion 15 (substrate contact metal 64) is formed on the fourth interlayer insulating film 61. The third protective film 65 is constituted, for example, of an $SiO_2/SiN$ laminated film constituted of an $SiO_2$ film of a lower layer and an SiN film of an upper layer. A thickness of the $SiO_2$ film is approximately 600 nm and a thickness of the SiN film is approximately 600 nm.

As shown in FIG. 3 and FIG. 4, a drain pad opening portion 66 arranged to expose a central portion of the drain pad 12 is formed in the third protective film 65. Although not illustrated in FIG. 3 and FIG. 4, a source pad opening portion arranged to expose a central portion of the source pad 13 and a gate pad opening portion arranged to expose a central portion of the gate pad 14 are formed.

A resin layer 67 is formed on a front surface of the third protective film 65. The resin layer 67 is constituted, for example, of a polyimide layer and a thickness thereof is, for example, approximately 10 μm.

With the semiconductor device 1, on the electron transit layer 23, the electron supply layer 24 differing in Al composition is formed and a heterojunction is thereby formed. Thereby, the two-dimensional electron gas 25 is formed inside the electron transit layer 23 in a vicinity of the interface between the electron transit layer 23 and the electron supply layer 24 and an HEMT using the two-dimensional electron gas 25 as a channel is formed.

The electrode portions 81 of the gate electrode 4 oppose the electron transit layer 23 across the gate insulating film 40 and the electron supply layer 24 is not present directly below the electrode portions 81 of the gate electrode 4. Therefore, the two-dimensional electron gas 25 due to the polarization by the lattice mismatch of the electron supply layer 24 and the electron transit layer 23 is not formed directly below the electrode portions 81 of the gate electrode 4. Thus, when a bias is not applied to the gate electrode 4 (at zero bias), the channel due to the two-dimensional electron gas 25 is interrupted directly below the electrode portions 81 of the gate electrode 4. A normally-off type HEMT is thus realized. When an appropriate on voltage (for example, of 5 V) is applied to the gate electrode 4, channels are induced inside the electron transit layer 23 directly below the electrode portions 81 of the gate electrode 4 and the two-dimensional electron gas 25 at both sides of the electrode portions 81 of the gate electrode 4 becomes connected. A source and a drain are thereby made conductive.

In use, for example, a predetermined voltage (for example, of 200 V to 400 V) such that the drain voltage 5 side becomes positive is applied across the source electrodes 3 and the drain electrodes 5. In this state, an off voltage (0 V) or the on voltage (5 V) is applied to the gate electrode 4 with the source electrodes 3 being at a reference potential (0 V).

Figure 5A:
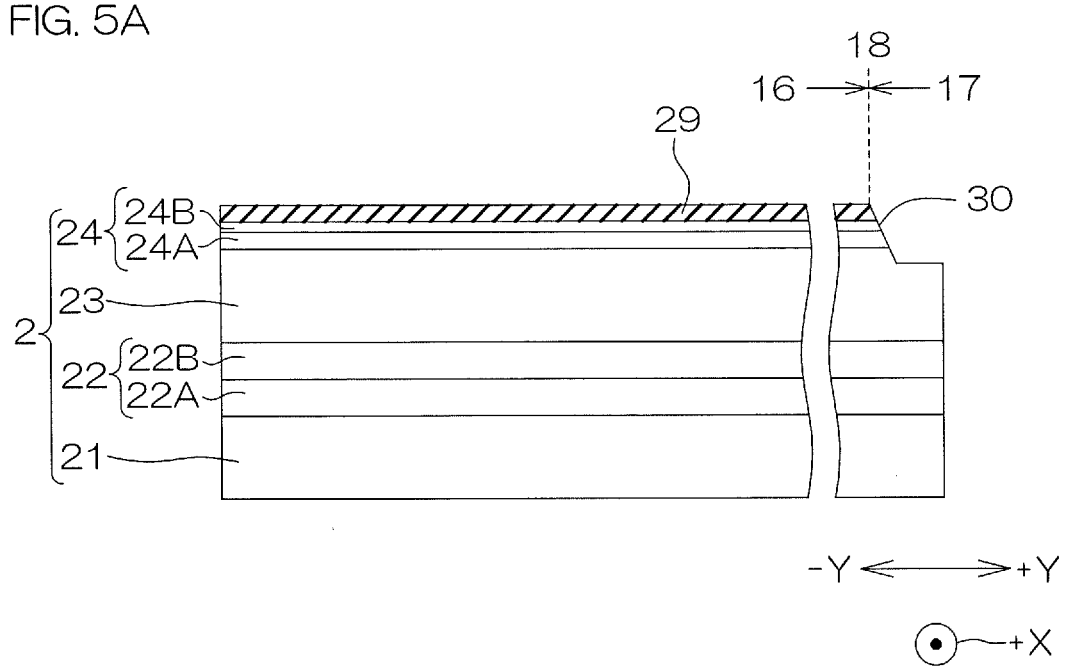
FIG. 5A is a sectional view of an example of a production process of the semiconductor device.
Figure 5B:
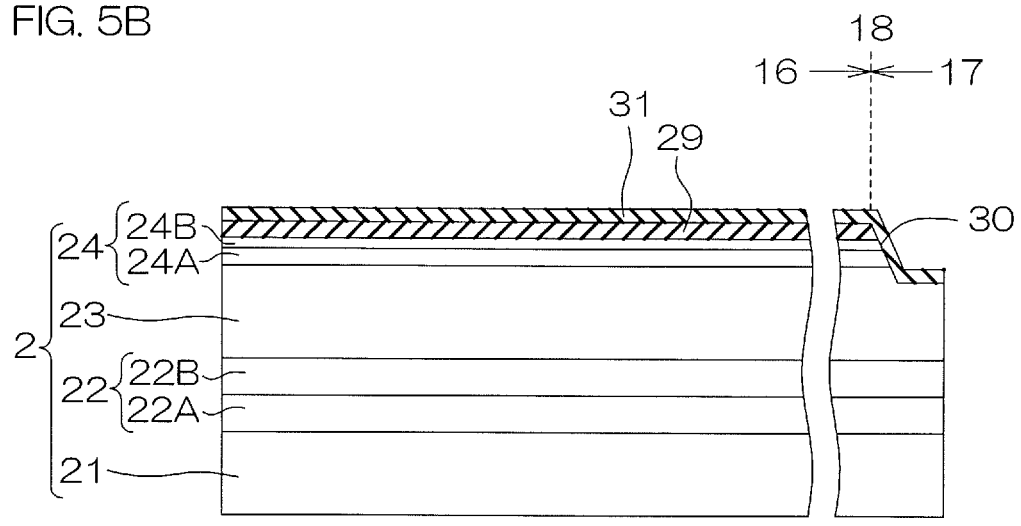
FIG. 5B is a sectional view of a step subsequent to that of FIG. 5A.
Figure 5D:
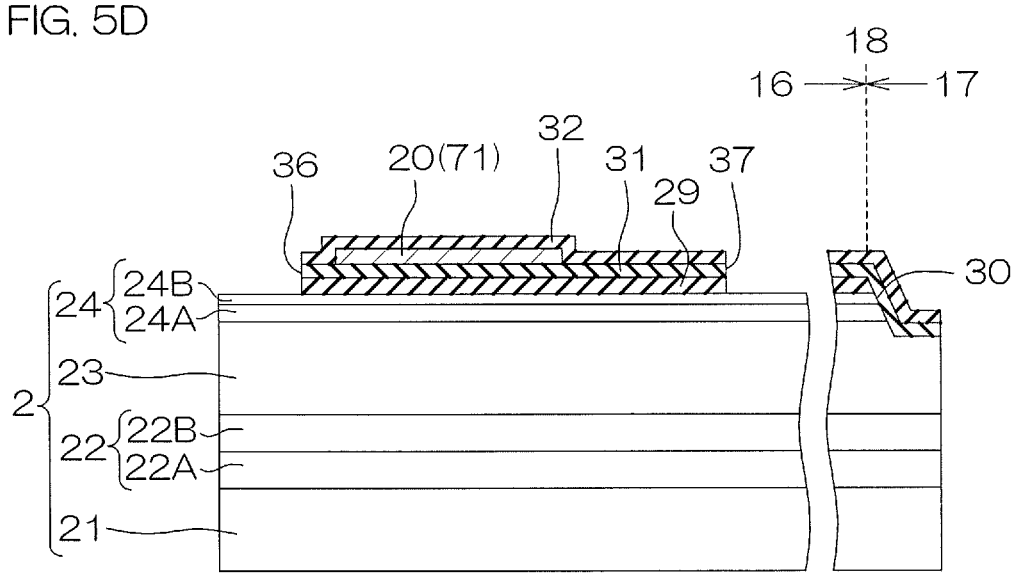
FIG. 5D is a sectional view of a step subsequent to that of FIG. 5C.
Figure 5E:
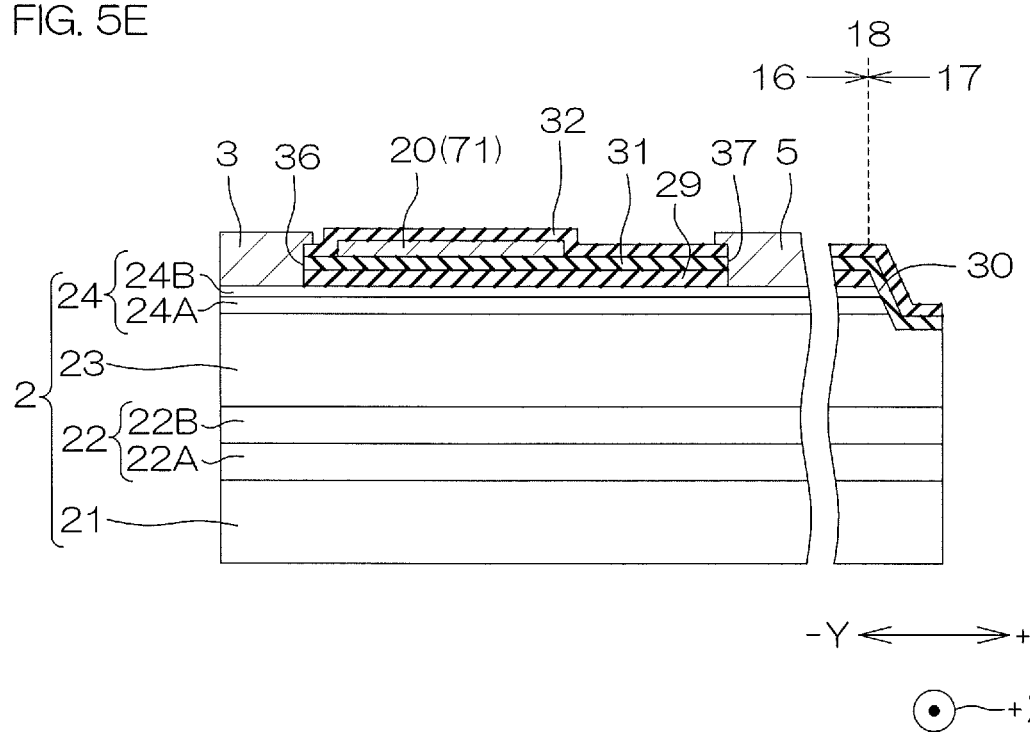
FIG. 5E is a sectional view of a step subsequent to that of FIG. 5D.
Figure 5G:
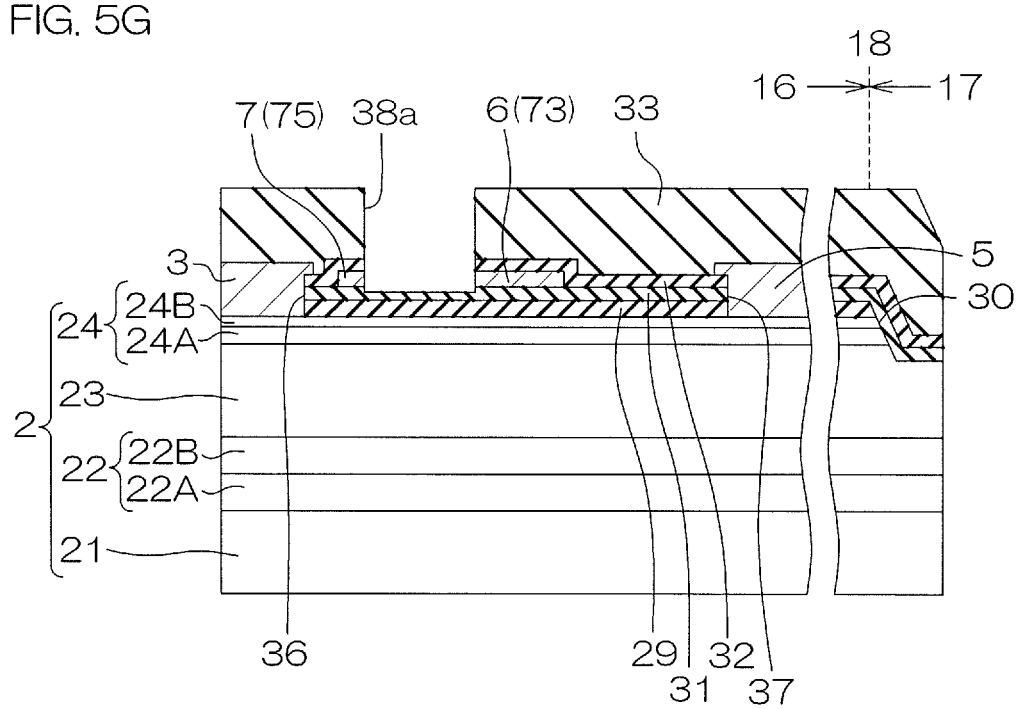
FIG. 5G is a sectional view of a step subsequent to that of FIG. 5F.
Figure 5I:
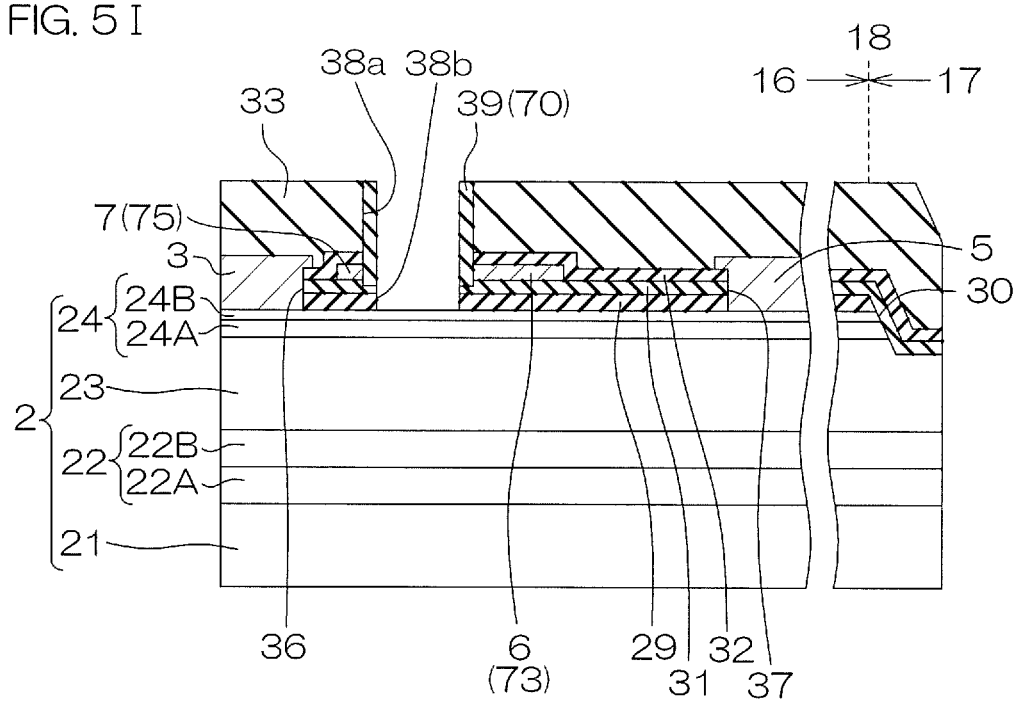
FIG. 5I is a sectional view of a step subsequent to that of FIG. 5H.
Figure 5J:
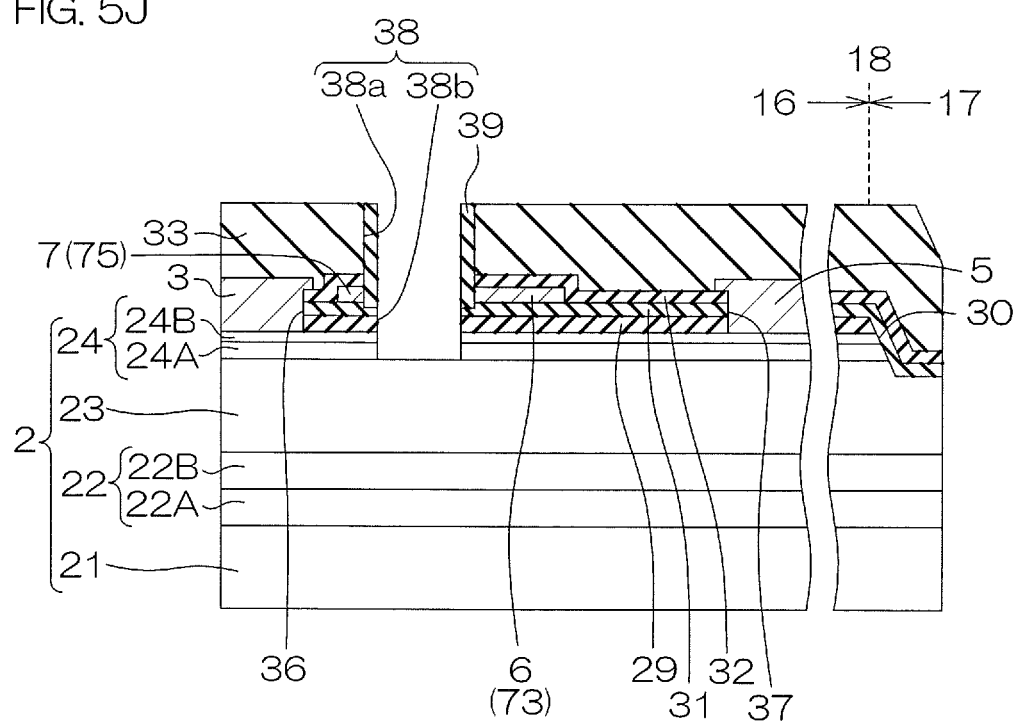
FIG. 5J is a sectional view of a step subsequent to that of FIG. 5I.
Figure 5L:
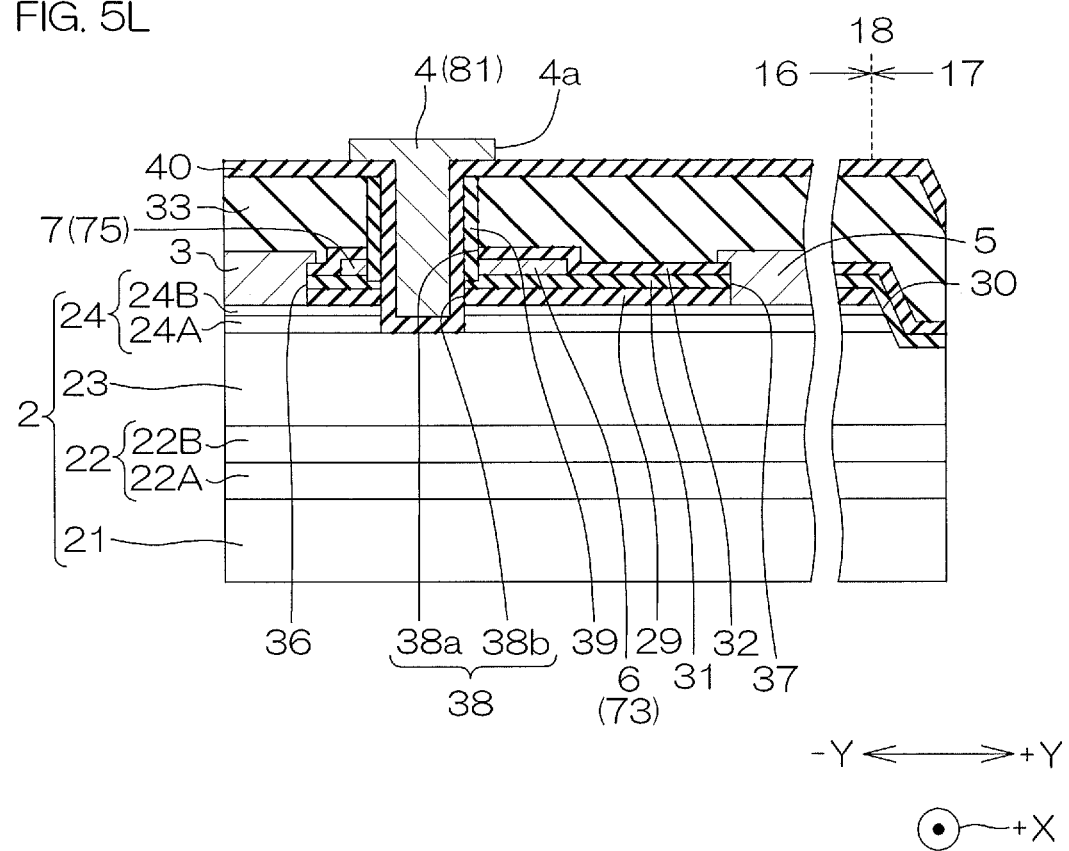
FIG. 5L is a sectional view of a step subsequent to that of FIG. 5K.
Figure 5M:
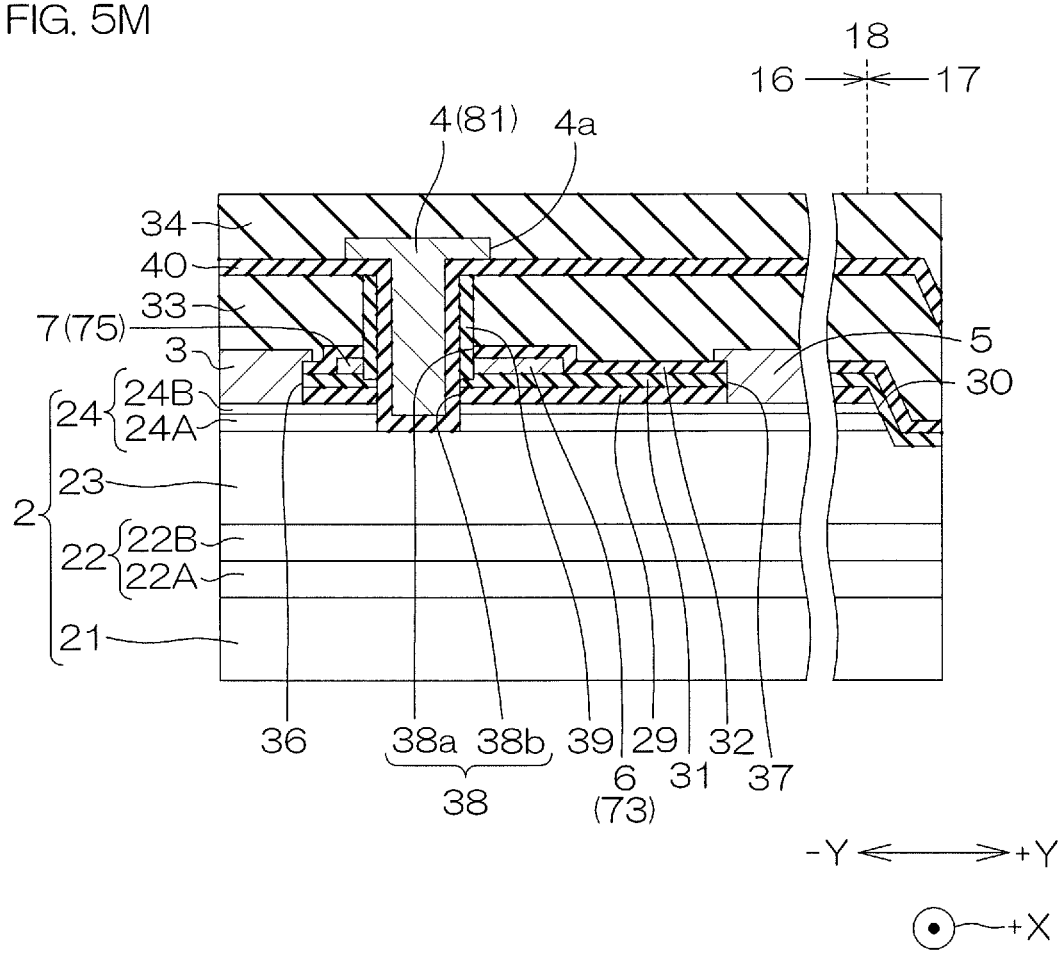
FIG. 5M is a sectional view of a step subsequent to that of FIG. 5L.
Figure 5N:
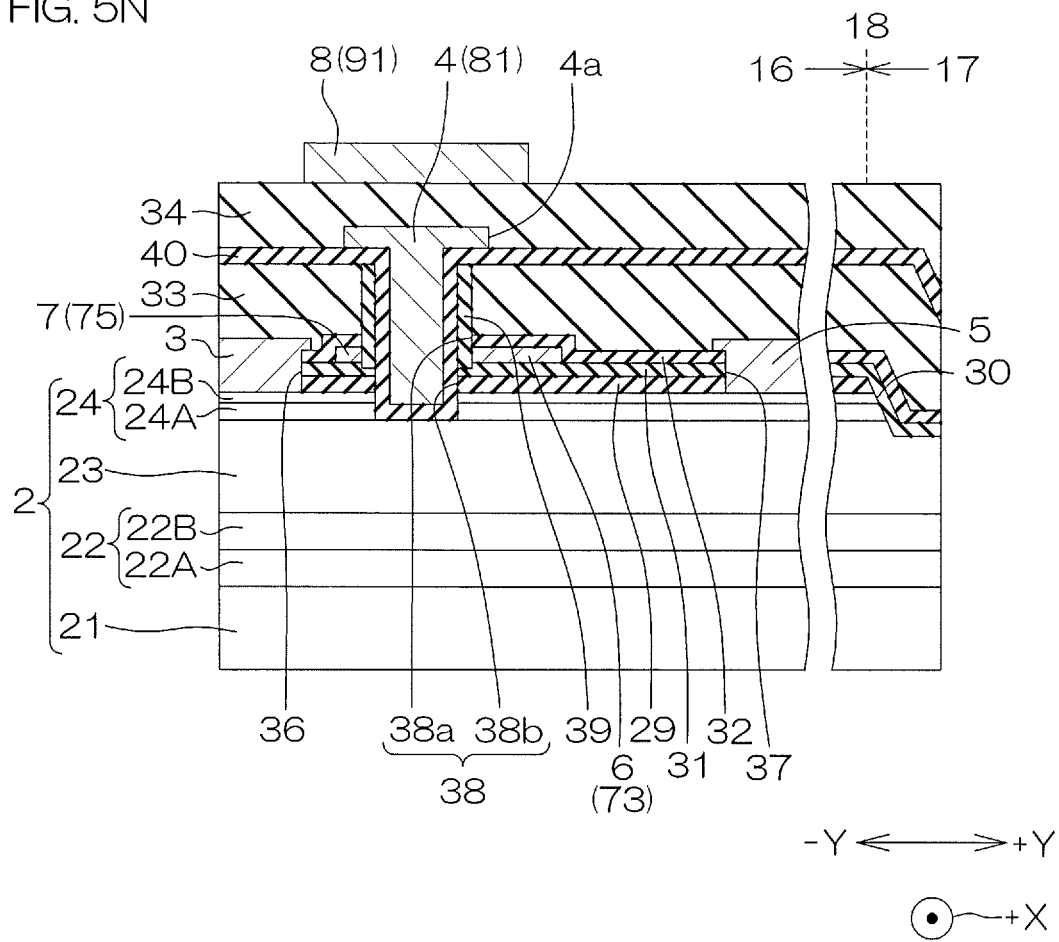
FIG. 5N is a sectional view of a step subsequent to that of FIG. 5M.
Figure 50:
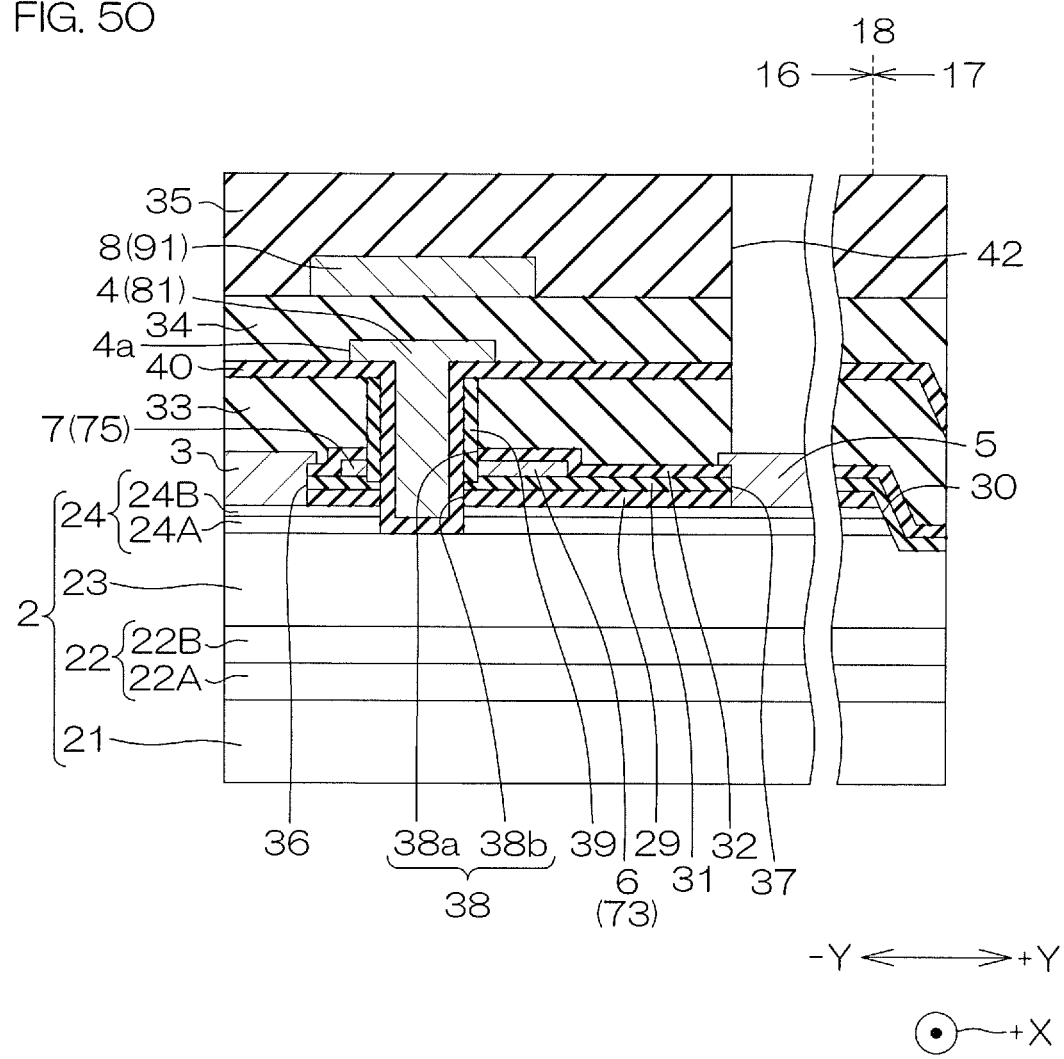
Figure 5P:
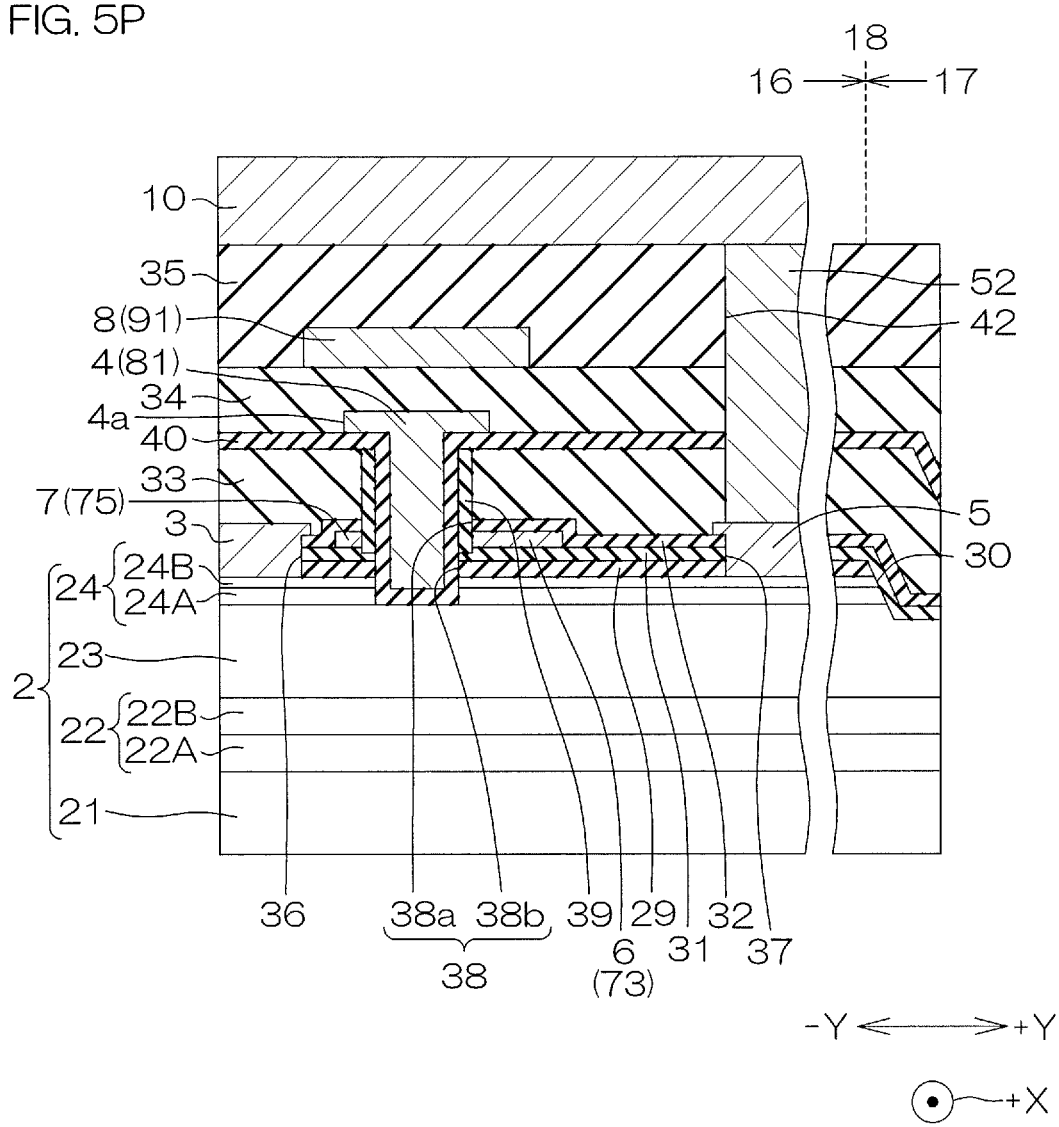
FIG. 5P is a sectional view of a step subsequent to that of FIG. 5O.
Figure 5Q:
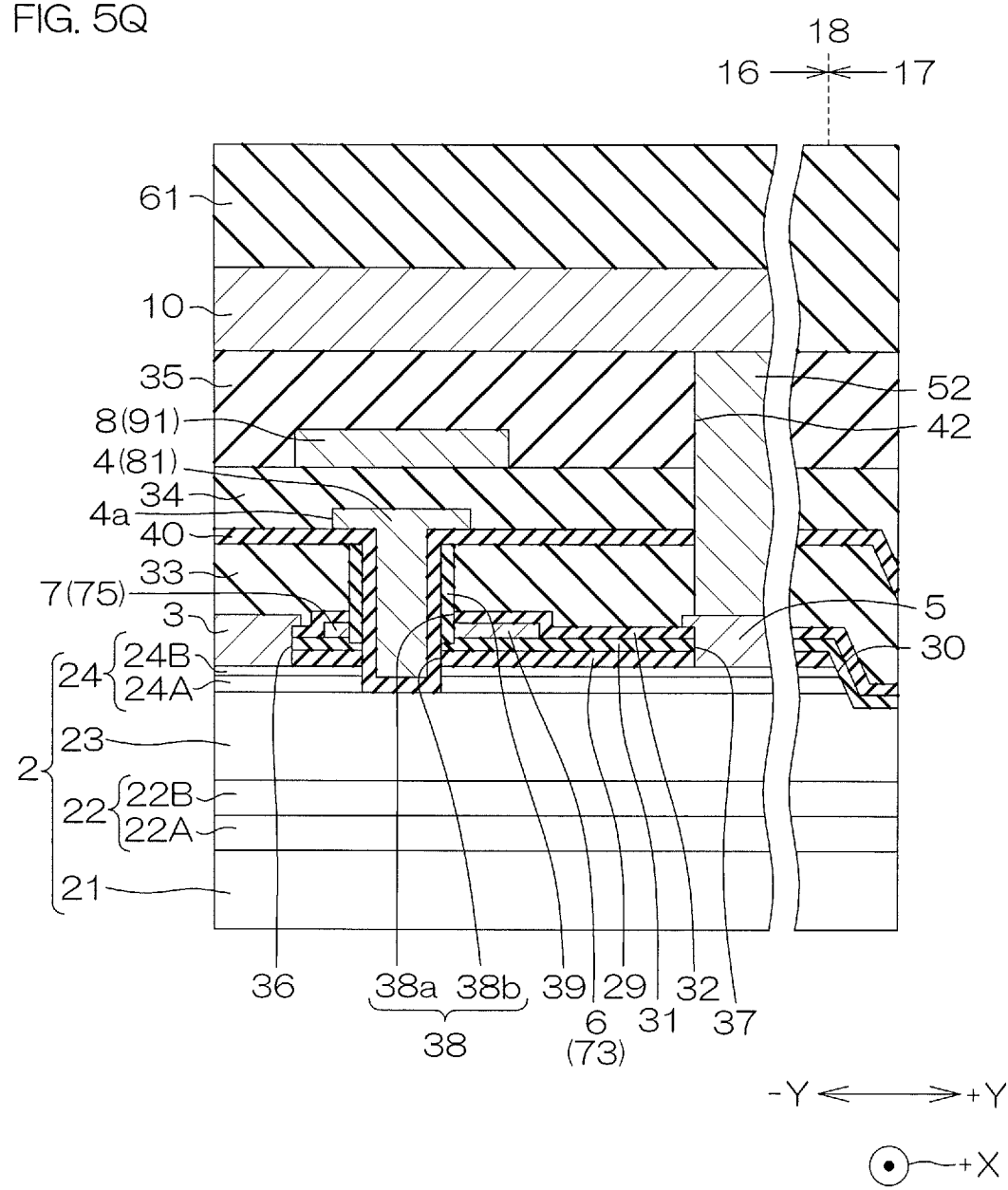
FIG. 5Q is a sectional view of a step subsequent to that of FIG. 5P.
Figure 5R:
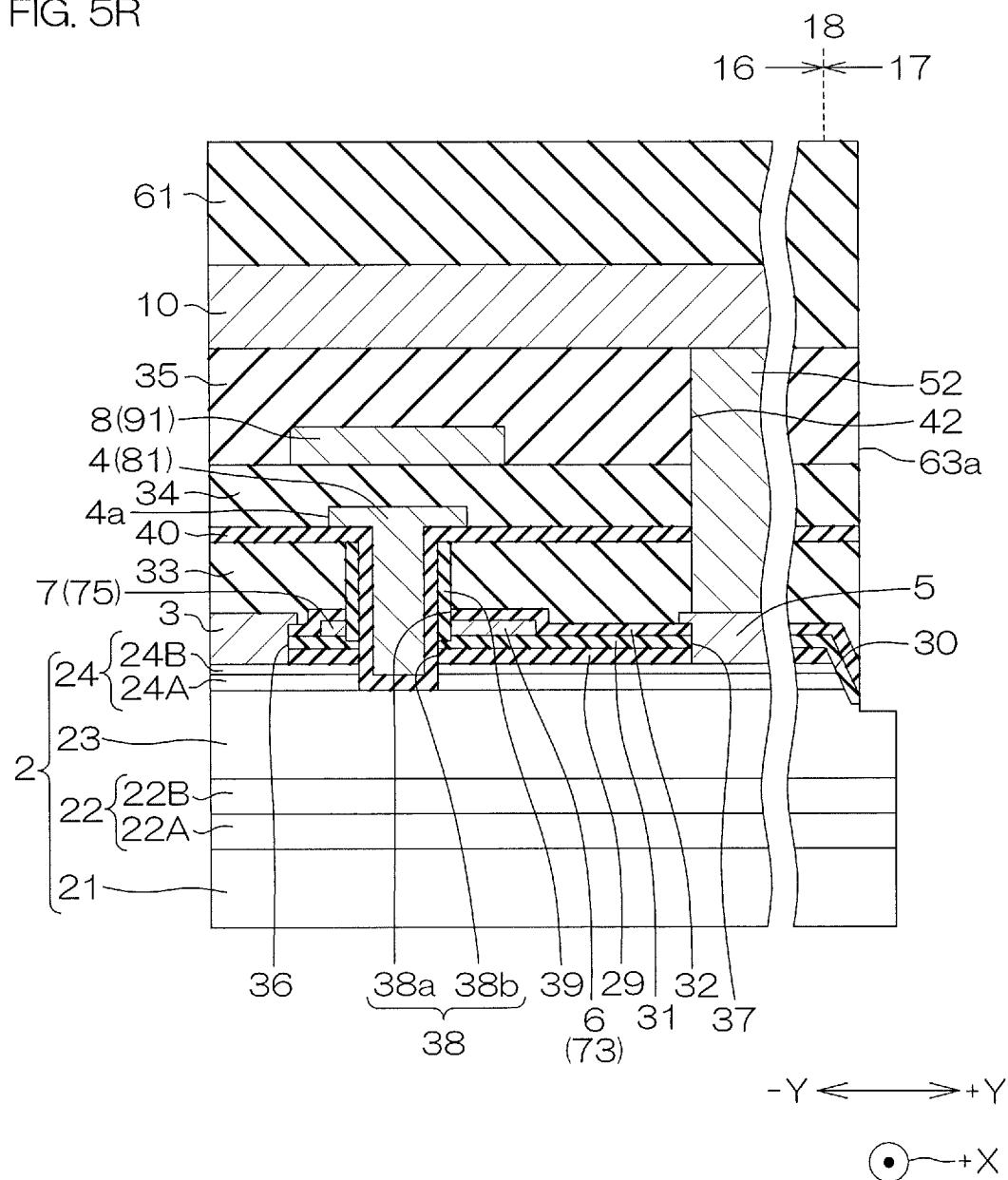
FIG. 5R is a sectional view of a step subsequent to that of FIG. 5Q.
Figure 5S:
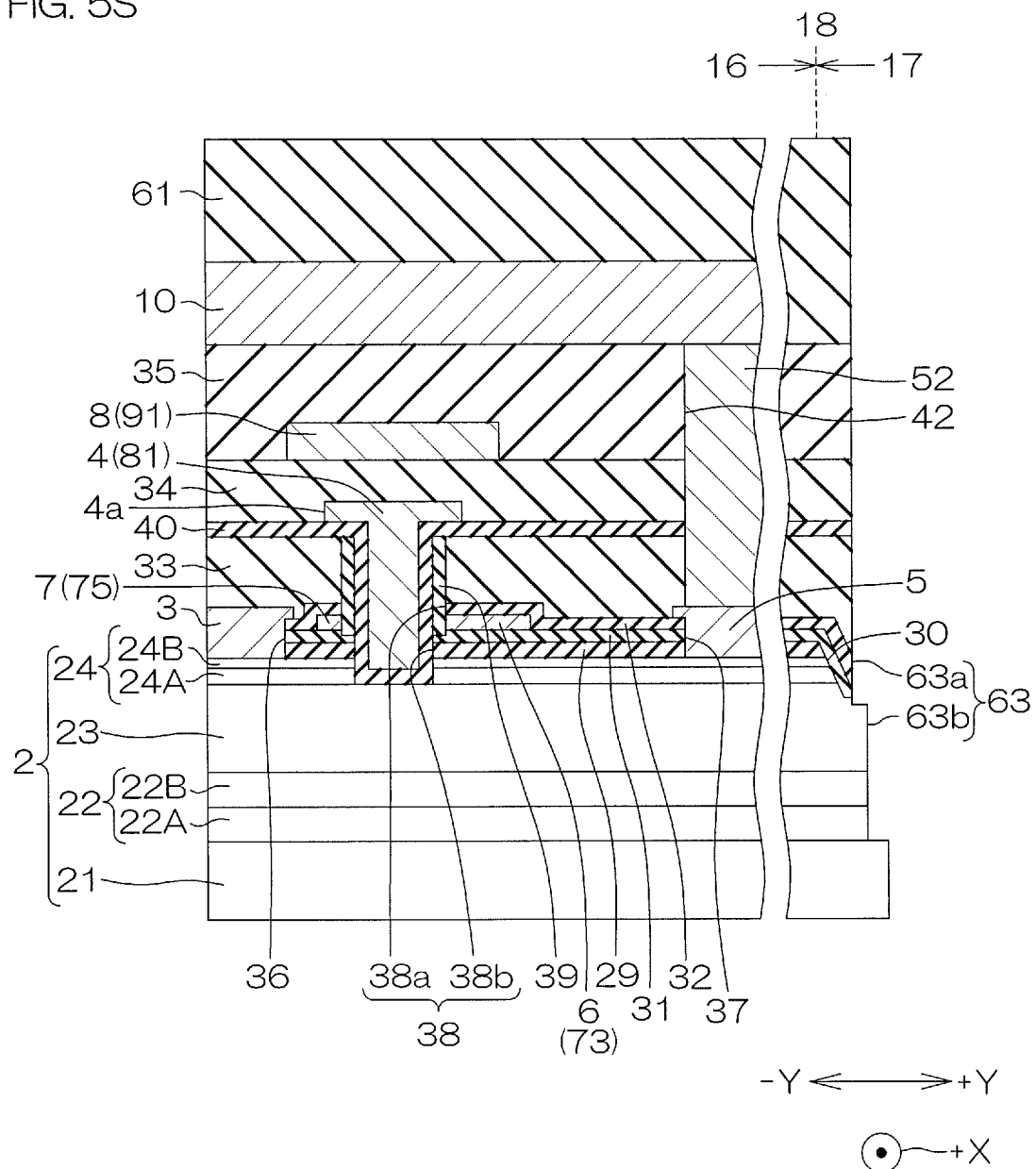
FIG. 5S is a sectional view of a step subsequent to that of FIG. 5R.
Figure 5T:
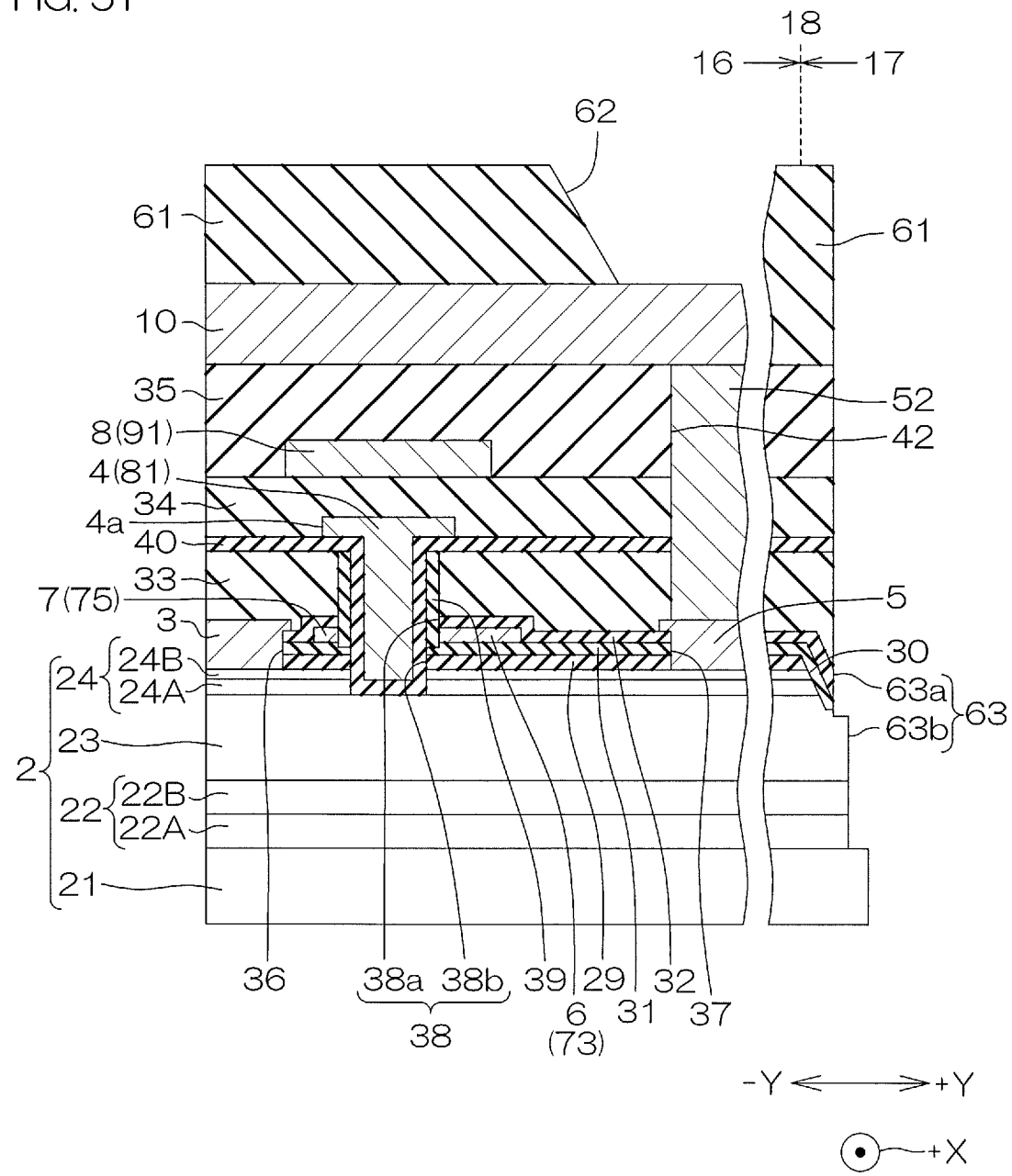
FIG. 5T is a sectional view of a step subsequent to that of FIG. 5S.
Figure 5U:
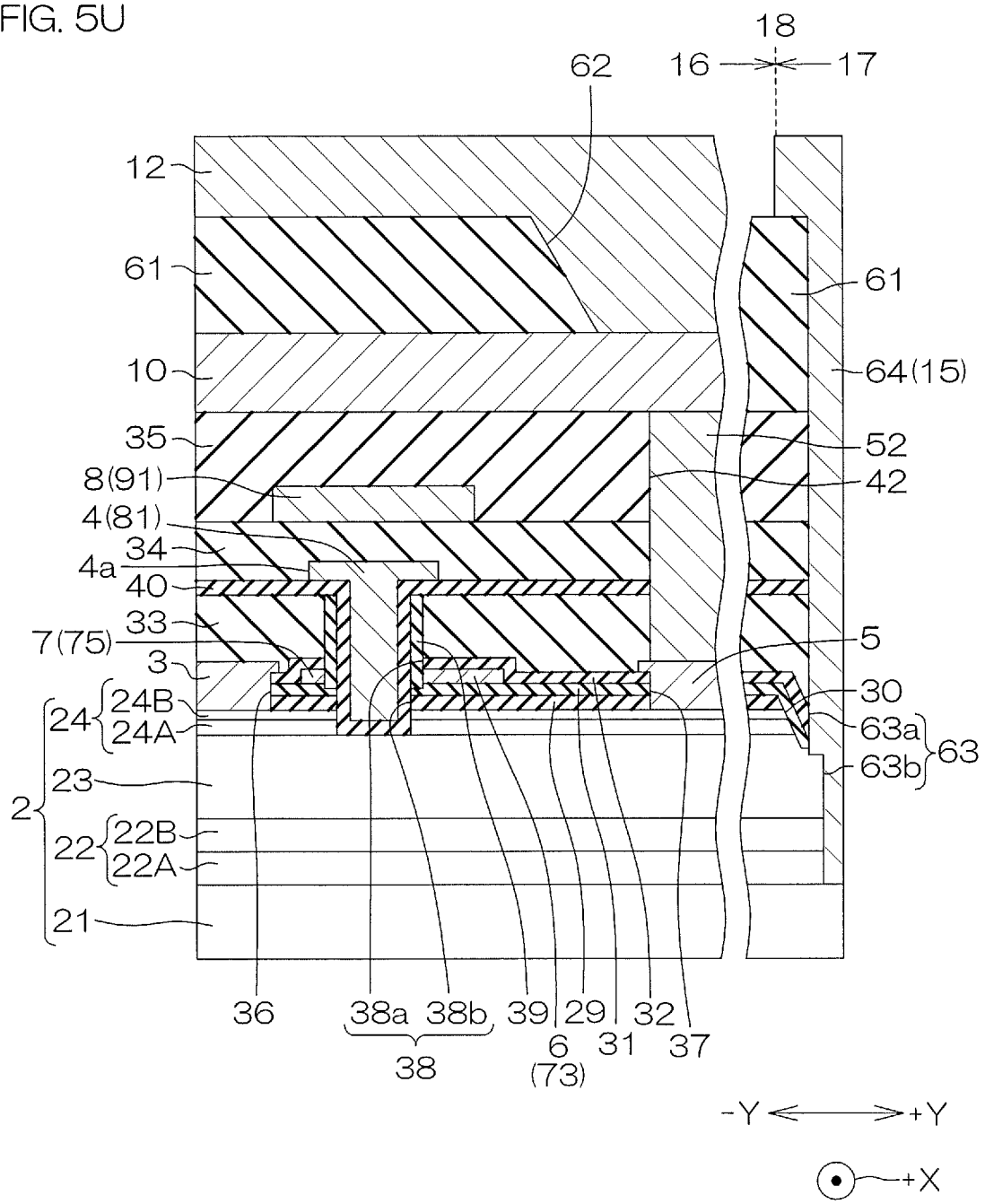
FIG. 5U is a sectional view of a step subsequent to that of FIG. 5T.
Figure 5V:
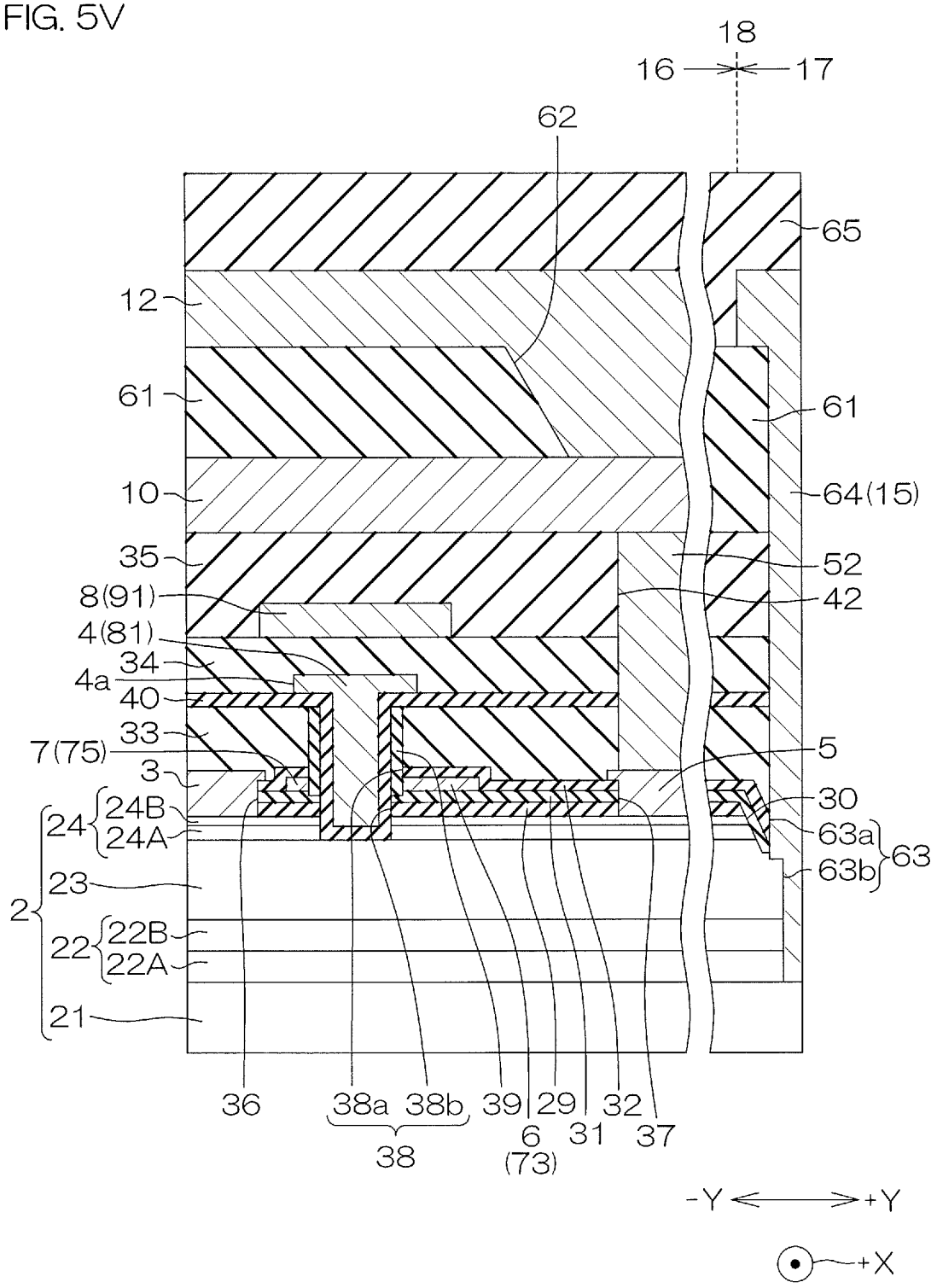
FIG. 5V is a sectional view of a step subsequent to that of FIG. 5U.
Figure 5W:
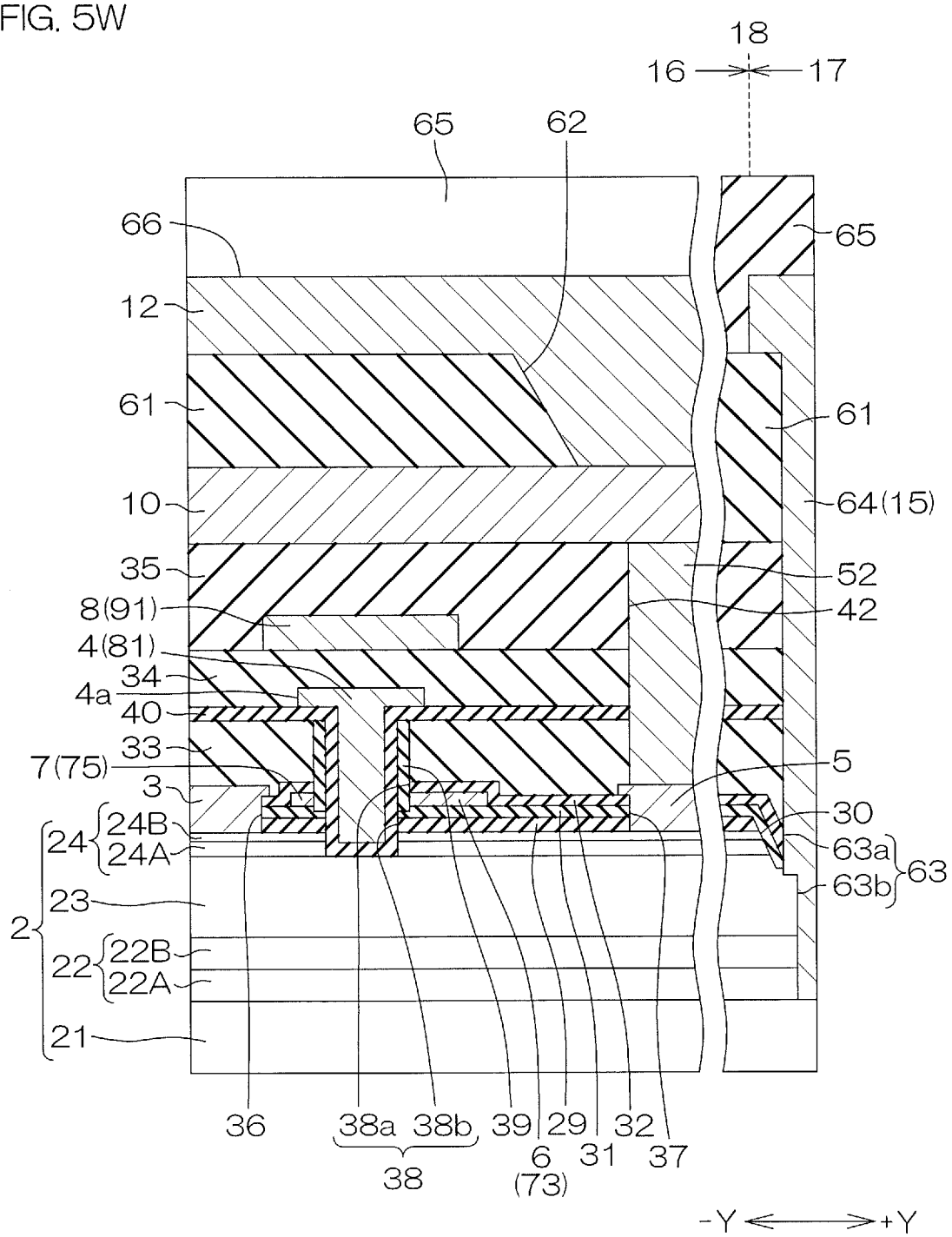
FIG. 5W is a sectional view of a step subsequent to that of FIG. 5V.
Figure 5X:
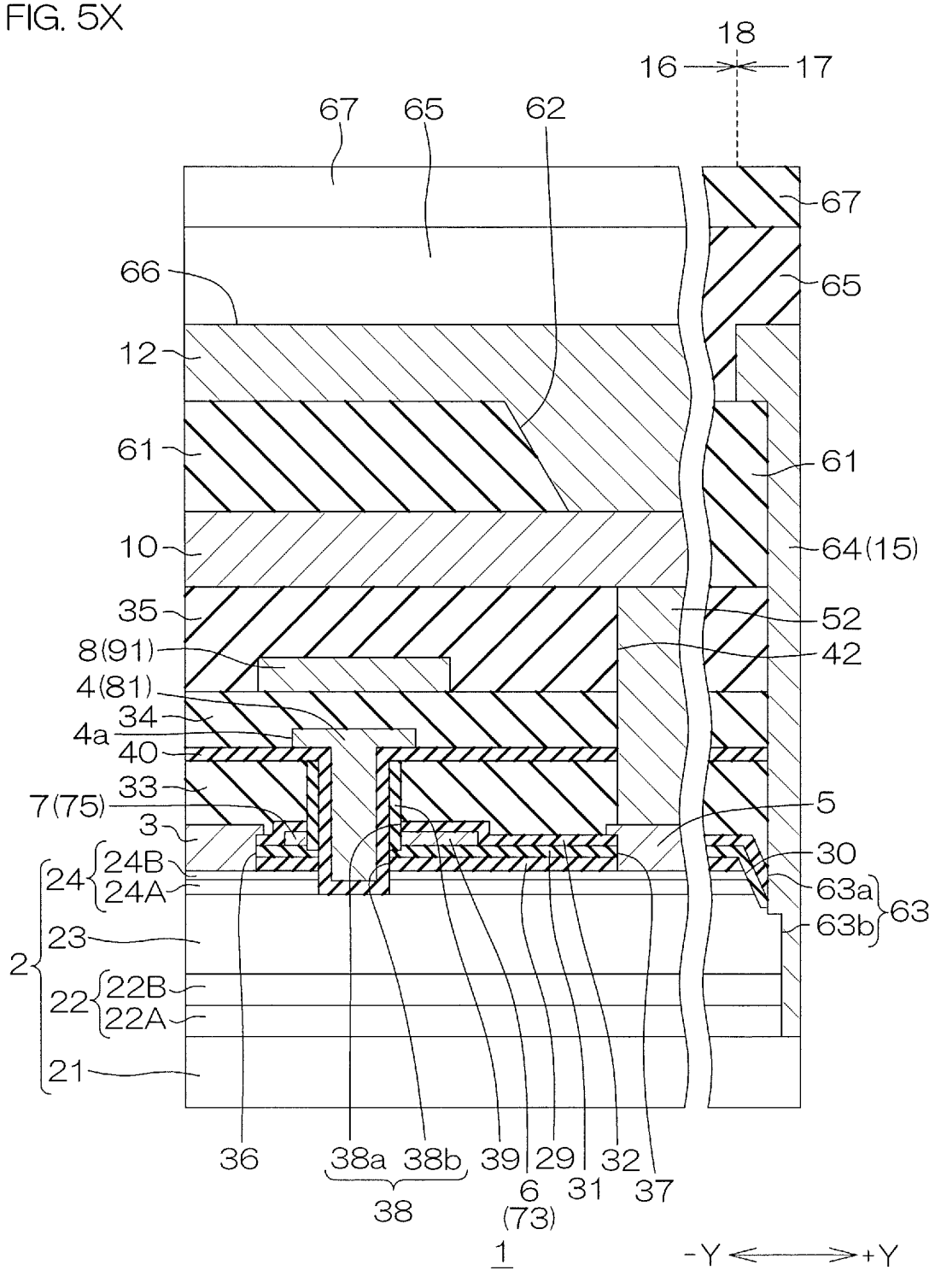
FIG. 5X is a sectional view of a step subsequent to that of FIG. 5W.

FIG. 5A to FIG. 5X are sectional views for describing an example of a production process of the semiconductor device 1 described above. The cross sections of FIG. 5A to FIG. 5X are sectional views corresponding to the section plane of FIG. 3. FIG. 6A to FIG. 6V are plan views for describing the example of the production process of the semiconductor device 1 described above. The plan views of FIG. 6A to FIG. 6V are plan views of the portion A of FIG. 1.

To produce the semiconductor device 1, the buffer layer 22 (22A and 22B) and the electron transit layer 23 are epitaxially grown successively on the substrate 21 as shown in FIG. 5A and FIG. 6A. Next, the electron supply layer 24 (24A and 24B) is epitaxially grown on the electron transit layer 23.

Next, the passivation film 29 is formed, for example, by a CVD method (chemical vapor deposition method) such as to cover an entire upper surface of the electron supply layer 24. In this preferred embodiment, the passivation film 29 is film-formed inside a film forming apparatus in which the buffer layer 22, the electron transit layer 23, and the electron supply layer 24 are film-formed. Thereafter, the recess 30 is formed in the nonactive area 17 by surface layer portions of the passivation film 29, the buffer layer 22, the electron transit layer 23, and the electron supply layer 24 being etched.

Next, as shown in FIG. 5B and FIG. 6B, the first protective film 31 is formed, for example, by an LPCVD method (low pressure CVD method) such as to cover an entire upper surface of the passivation film 29 and an inner surface of the recess 30.

Next, after a plate film is formed on the first protective film 31, for example, by a sputter method, the plate film is removed selectively, for example, by dry etching. A plate film 20 is thereby formed on the first protective film 31 as shown in FIG. 5C and FIG. 6C. The plate film 20 includes a plurality of electrode portions 71 extending in parallel to each other and in the X direction and two base portions 72 respectively coupling corresponding end portions of the plurality of electrode portions 71 to each other. Outer edge portions in the X direction of each base portion 72 are respectively disposed in the nonactive area 17. With the exception of the electrode portions 71 at both ends in the Y direction, each electrode portion 71 is formed between a formation planned region of a source electrode 3 and a formation planned region of a drain electrode 5.

Next, as shown in FIG. 5D and FIG. 6D, the second protective film 32 is formed, for example, by a PECVD method (plasma CVD method) such as to cover an entire upper surface of the first protective film 31. The plate film 20 is thereby embedded inside a protective film constituted of the first protective film 31 and the second protective film 32. Thereafter, the source contact holes 36 and the drain contact holes 37 are formed by the second protective film 32, the first protective film 31, and the passivation film 29 being etched in the formation planned regions of the source electrodes 3 and the planned formation regions of the drain electrodes 5.

Next, as shown in FIG. 5E and FIG. 6E, the source electrodes 3 and the drain electrodes 5 are embedded inside the source contact holes 36 and inside the drain contact holes 37, respectively. As mentioned above, in this preferred embodiment, the source electrodes 3 and the drain electrodes 5 include the overlap portions formed on the second protective film 32 at the peripheral edges of the source contact holes 36 and the drain contact holes 37, respectively.

Next, as shown in FIG. 5F and FIG. 6F, the first interlayer insulating film 33 is formed, for example, by a CVD method such as to cover the second protective film 32, the source electrodes 3, and the drain electrodes 5.

Next, as shown in FIG. 5G and FIG. 6G, the first opening portions 38a in the gate opening portions 38 are formed by etching the first interlayer insulating film 33, the second protective film 32, and the plate film 20 from etching regions opposing the plate film 20. The plate film 20 is thereby separated self-aligningly with respect to the gate opening portions 38 into the first source field plates 6 at drain sides and floating plates 7 at source sides. Therefore, at this stage, the first source field plates 6 and the floating plates 7 are exposed to the side portions of the gate opening portions 38.

As shown in FIG. 6G, each source field plate 6 includes a pair of electrode portions 73 extending in parallel to each other in the X direction across a drain electrode 5 and two base portions 74 respectively coupling corresponding end portions of the pair of electrode portions 73 to each other in the nonactive area 17. As shown in FIG. 6G, each floating plate 7 includes a pair of electrode portions 75 extending in parallel to each other in the X direction across a source electrode 3 and two base portions 76 respectively coupling corresponding end portions of the pair of electrode portions 75 to each other in the nonactive area 17.

Next, a material film ($SiO_2$ film) of the side walls 39 is formed, for example, by a CVD method such as to cover an entire upper surface of the first interlayer insulating film 33 and inner surfaces (side walls and bottom walls) of the first opening portions 38a. Then, by the material film being dry-etched, a portion of the material film on the first interlayer insulating film 33 and portions on the bottom walls of the first opening portions 38a are removed selectively such that material films 70 of the side walls 39 are formed on the side walls of the first opening portions 38a as shown in FIG. 5H and FIG. 6H. However, in FIG. 6H, the material films 70 of the side walls 39 are omitted. Therefore, FIG. 6H is the same drawing as FIG. 6G.

Next, as shown in FIG. 5I and FIG. 6I, the first protective film 31 and the passivation film 29 directly below the first opening portions 38a are selectively removed by dry etching. Thereby, openings (portions of the second opening portions 38b) reaching the electron supply layer 24 are formed in the first protective film 31 and the passivation film 29 in the active area 16 and openings reaching the electron transit layer 23 are formed in the first protective film 31 in the nonactive area 17 shown in FIG. 6I. Also, by the material films 70 being thinned, the side walls 39 are formed on the side walls of the first opening portions 38a.

In FIG. 6J to FIG. 6O used in the description that follows, portions that do not appear in a plan view due to members of further upper layers may be indicated not by broken lines but by solid lines for convenience of description.

Next, as shown in FIG. 5J and FIG. 6J, in the active area 16, the electron supply layer 24 (24A and 24B) directly below the first opening portions 38a is selectively removed by an AlN oxidation treatment and wet etching. The second opening portions 38b reaching the electron transit layer 23 are thereby formed in the first protective film 31, the passivation film 29, and the electron supply layer 24 in the active area 16. The gate opening portions 38 constituted of the first opening portions 38a and the second opening portions 38b are thereby formed.

Next, as shown in FIG. 5K and FIG. 6K, the gate insulating film 40 is formed, for example, by a CVD method such as to cover the inner surfaces of the gate opening portions 38 and an entire upper surface of the first interlayer insulating film 33.

Next, as shown in FIG. 5L and FIG. 6L, inside the gate opening portions 38, the gate electrode 4 is embedded at inner sides of the gate insulating film 40. As shown in FIG. 6L, the gate electrode 4 has the plurality of electrode portions 81 extending in parallel to each other in the X direction and the two base portions 82 respectively coupling the corresponding end portions of the plurality of electrode portions 81 to each other in the nonactive area 17. As mentioned above, in this preferred embodiment, the gate electrode 4 includes the overlap portions 4a formed on the gate insulating film 40 at the peripheral edges of the gate opening portions 38.

Next, as shown in FIG. 5M and FIG. 6M, the second interlayer insulating film 34 is formed, for example, by a CVD method such as to cover an entire upper surface of the gate insulating film 40 and the gate electrode 4.

Next, after a plate film that is a material of the second source field plate 8 is formed on the second interlayer insulating film 34, for example, by a sputter method, the plate film is removed selectively, for example, by dry etching. The second source field plate 8 is thereby formed on the second interlayer insulating film 34 as shown in FIG. 5N and FIG. 6N. As shown in FIG. 6N, the second source field plate 8 includes the plurality of electrode portions 91 extending in parallel to each other in the X direction and two base portions 92 respectively coupling corresponding end portions of the plurality of electrode portions 91 to each other in the nonactive area 17.

Next, as shown in FIG. 5O and FIG. 6O, the third interlayer insulating film 35 is formed, for example, by a CVD method such as to cover an entire upper surface of the second interlayer insulating film 34 and the second source field plate 8. Thereafter, as shown in FIG. 6O, the plurality of first source via holes 41, the plurality of first drain via holes 42, the plurality of first gate via holes 43, the plurality of first SFP via holes 44, and the plurality of second SFP via holes 45 are formed, for example, by etching.

The first source via holes 41 are formed in regions in the active area 16 in which the source electrodes 3 and the source wirings 9 to be formed on the third interlayer insulating film 35 would oppose each other and such as to penetrate through the insulating films 33, 40, 34, and 35 therebetween. The first drain via holes 42 are formed in regions in the active area 16 in which the drain electrodes 5 and the drain wirings 10 to be formed on the third interlayer insulating film 35 would oppose each other and such as to penetrate through the insulating films 33, 40, 34, and 35 therebetween. The first gate via holes 43 are formed in regions in the nonactive area 17 in which the base portions 82 (see FIG. 6L) of the gate electrode 4 and the gate wirings 11 to be formed on the third interlayer insulating film 35 would oppose each other and such as to penetrate through the insulating films 40, 34, and 35 therebetween.

The first SFP via holes 44 are formed in regions in the nonactive area 17 in which the base portions 74 (see FIG. 6G) of the first source field plates 6 and the source wirings 9 to be formed on the third interlayer insulating film 35 would oppose each other and such as to penetrate through the insulating films 32, 33, 40, 34, and 35 therebetween. The second SFP via holes 45 are formed in regions in the nonactive area 17 in which the base portions 92 (see FIG. 6N) of the second source field plate 8 and the source wirings 9 to be formed on the third interlayer insulating film 35 would oppose each other and such as to penetrate through the insulating film 35 therebetween.

Next, as shown in FIG. 5P and FIG. 6P, the via metals 51, 52, 53, 54, and 55 are embedded in the respective via holes 41, 42, 43, 44, and 45, respectively. The source wirings 9, the drain wirings 10, and the gate wirings 11 are then formed, for example, by a sputter method on the third interlayer insulating film 35. As shown in FIG. 6P, the source via metals 51 are connected to the source wirings 9. The drain via metals 52 are connected to the drain wirings 10. The gate via metals 53 are connected to the gate wirings 11. The first SFP via metals 54 and the second SFP via metals 55 are connected to the source wirings 9.

Figure 6Q:
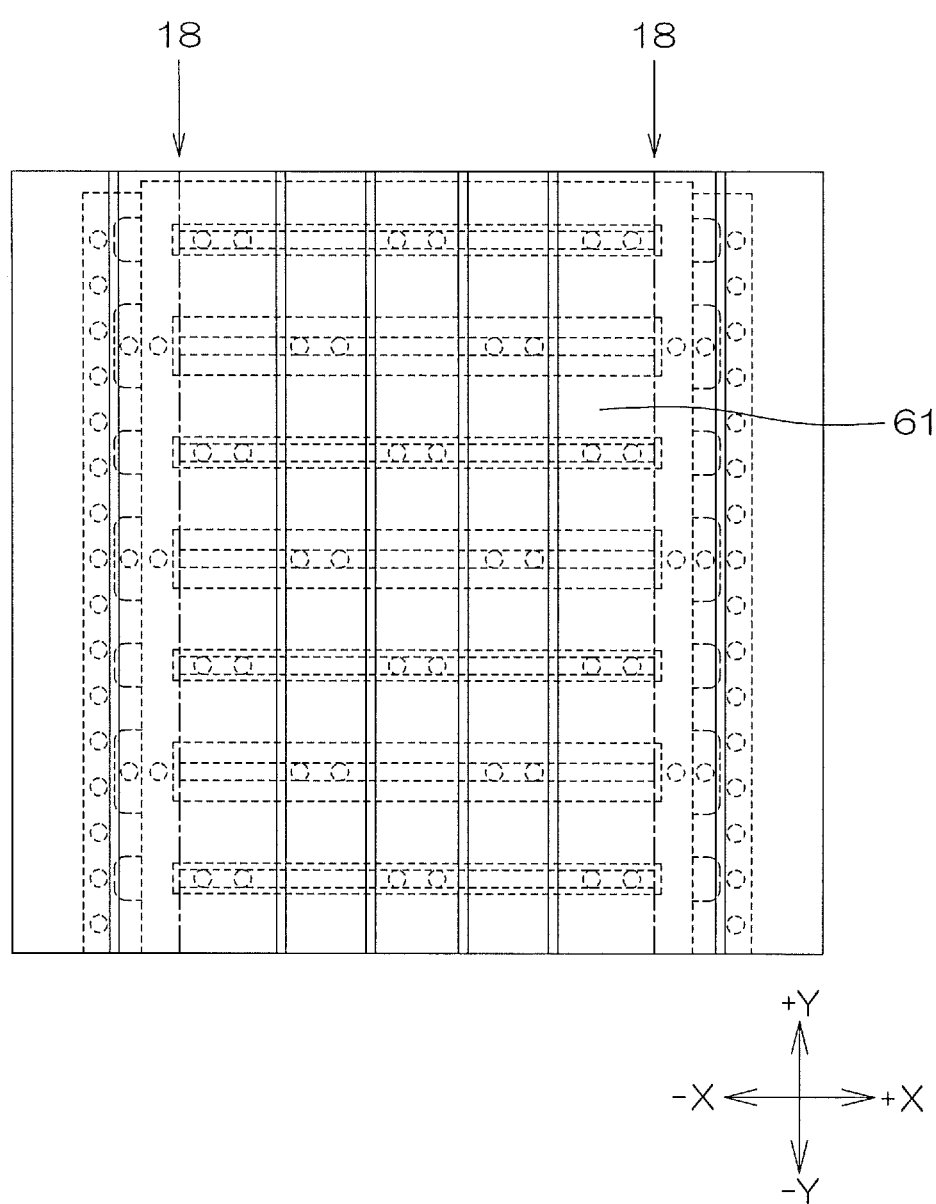
FIG. 6Q is a plan view of a step subsequent to that of FIG. 6P.

Next, as shown in FIG. 5Q and FIG. 6Q, the fourth interlayer insulating film 61 is formed, for example, by a CVD method such as to cover an entire upper surface of the third interlayer insulating film 35 and the source wirings 9, the drain wirings 10, and the gate wirings 11.

Next, as shown in FIG. 5R, in the nonactive area 17, the first substrate contact hole 63a is formed by the fourth interlayer insulating film 61, the third interlayer insulating film 35, the second interlayer insulating film 34, the gate insulating film 40, the first interlayer insulating film 33, the second protective film 32, and the first protective film 31 being selectively removed, for example, by etching.

Next, as shown in FIG. 5S, in the nonactive area 17, the second substrate contact hole 63b in communication with the first substrate contact hole 63a and reaching the substrate 21 is formed by the electron transit layer 23 and the buffer layer 22 being selectively removed, for example, by etching. The substrate contact hole 63 constituted of the first substrate contact hole 63a and the second substrate contact hole 63b is thereby formed.

Figure 6R:
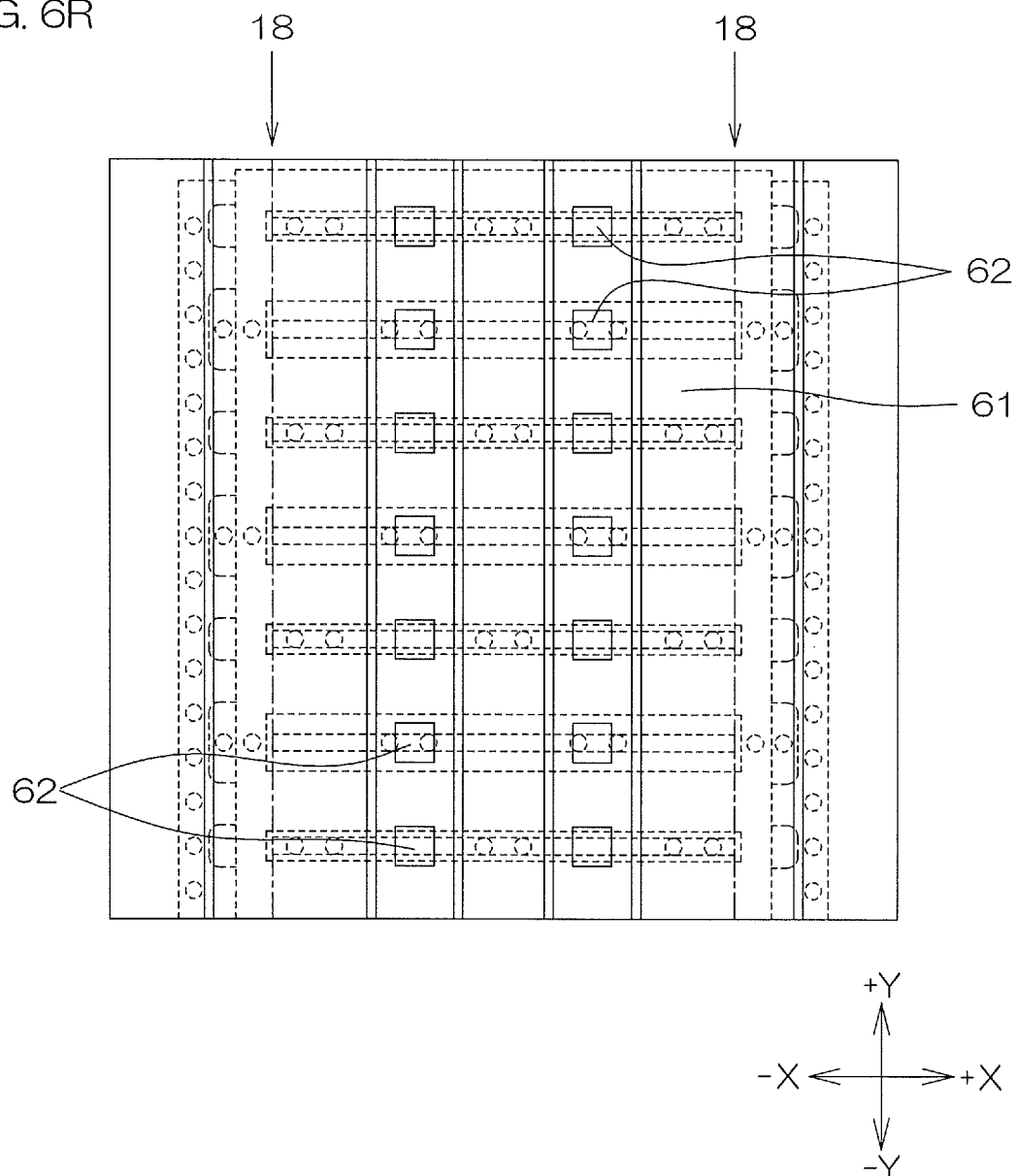
FIG. 6R is a plan view of a step subsequent to that of FIG. 6Q.

Next, as shown in FIG. 5T and FIG. 6R, the plurality of second drain via holes 62 reaching the drain wirings 10 are formed in the fourth interlayer insulating film 61 in a region in which the drain pad 12 is to be formed in plan view. In this process, the plurality of second source via holes (not shown) reaching the source wirings 9 are formed in the fourth interlayer insulating film 61 in a region in which the source pad 13 is to be formed in plan view. Also, in this process, the plurality of second gate via holes (not shown) reaching the gate wirings 11 are formed in the fourth interlayer insulating film 61 in a region in which the gate pad 14 is to be formed in plan view.

Figure 6S:
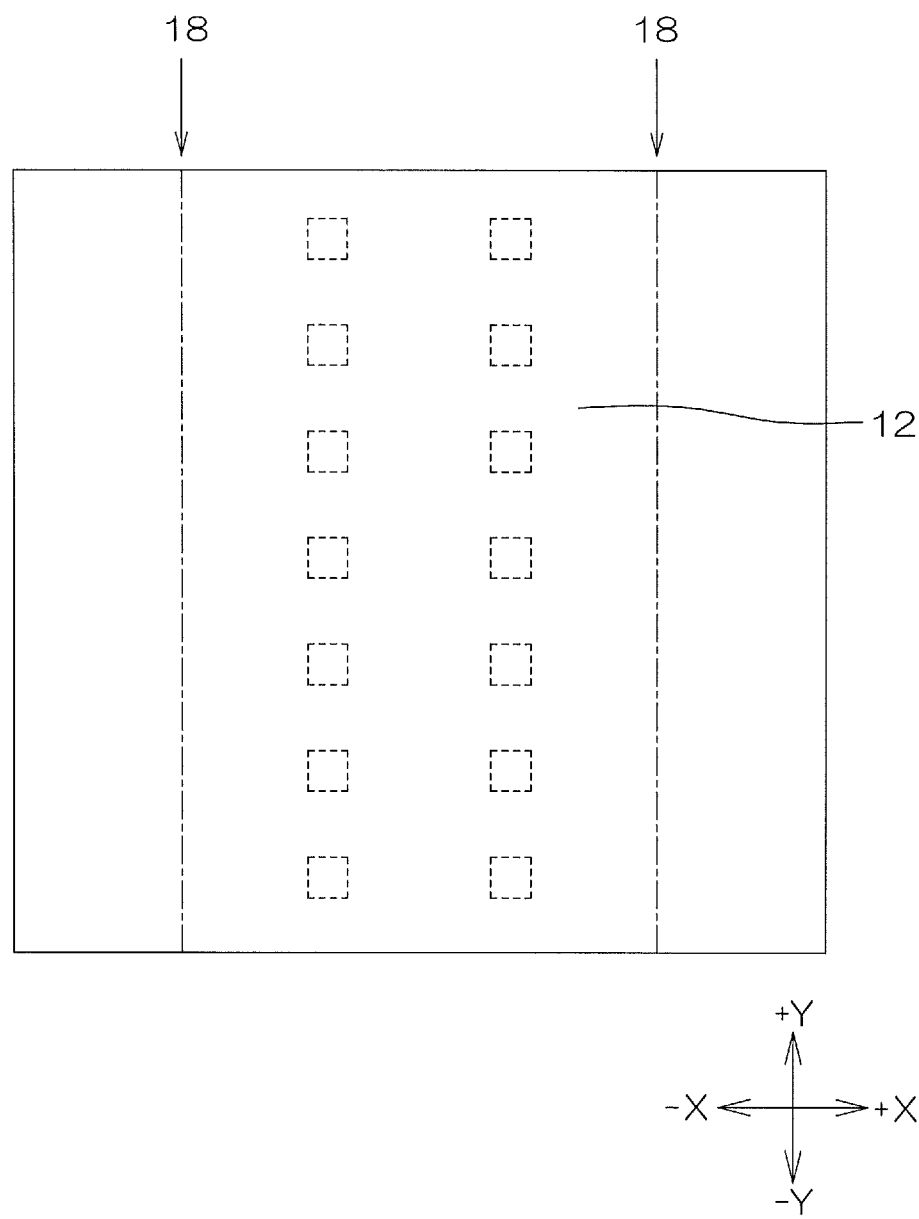
FIG. 6S is a plan view of a step subsequent to that of FIG. 6R.

Next, as shown in FIG. 5U and FIG. 6S, the drain pad 12, the source pad 13, and the gate pad 14 are formed on the fourth interlayer insulating film 61 and the substrate contact metal 64 is embedded inside the substrate contact hole 63. The drain pad 12 is connected to the drain wirings 10 via the second drain via holes 62. The source pad 13 is connected to the source wirings 9 via the second source via holes. The gate pad 14 is connected to the gate wirings 11 via the second gate via holes.

Next, as shown in FIG. 5V and FIG. 6T, the third protective film 65 is formed, for example, by a CVD method on an entire upper surface of the fourth interlayer insulating film 61 such as to cover the respective pads 12, 13, and 14 and the substrate contact metal 64.

Figure 6U:
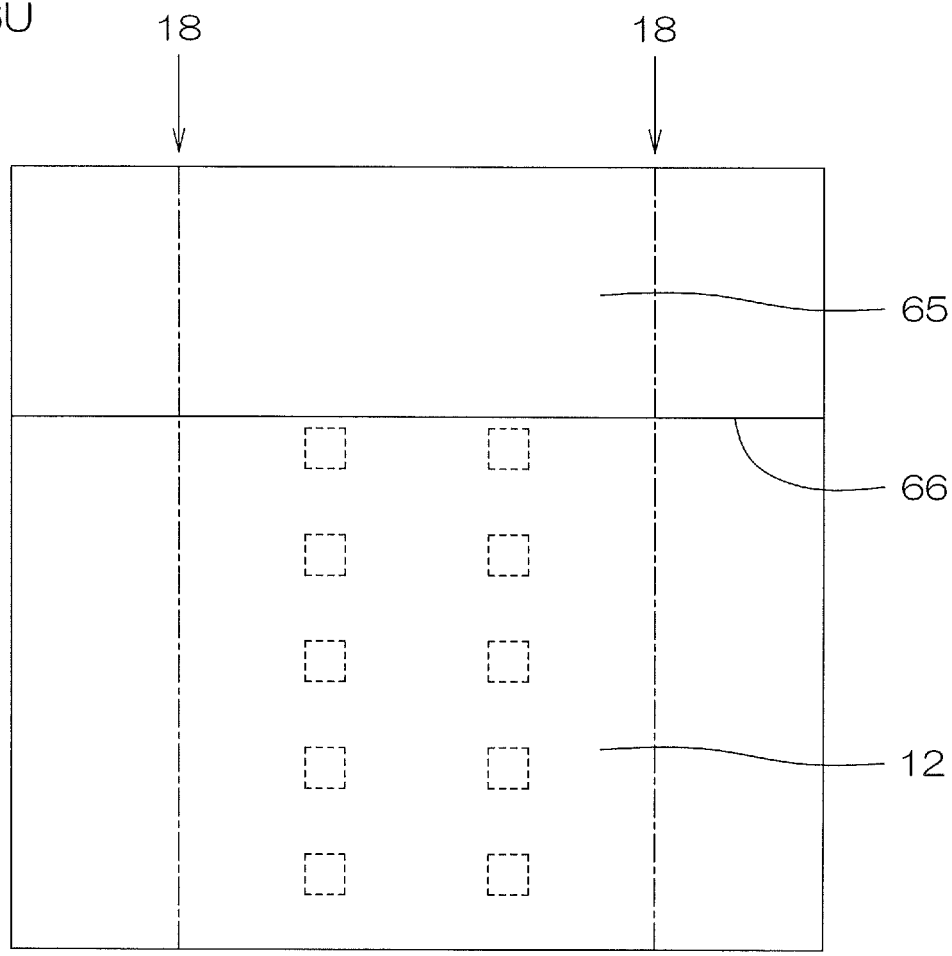
FIG. 6U is a plan view of a step subsequent to that of FIG. 6T.

Next, as shown in FIG. 5W and FIG. 6U, the drain pad opening portion 66, the source pad opening portion, and the gate pad opening portion exposing the drain pad 12, the source pad 13, and the gate pad 14, respectively, are formed in the third protective film 65.

Next, as shown in FIG. 5X and FIG. 6V, the resin layer 67 is formed, for example, by a CVD method on the front surface of the third protective film 65. The semiconductor device 1 shown in FIG. 1 to FIG. 4 is obtained through the above steps.

The reason for providing the second source field plate 8 shall now be described.

In the following, a semiconductor device differing from the semiconductor device 1 of the preferred embodiment described above in just a point that the second source field plate 8 is not provided shall be deemed to be a comparative example. Static capacitances $C_{GD}$, $C_{GS}$, and $C_{DS}$ are present in HEMTs formed in the semiconductor device 1 of the preferred embodiment and the comparative example. $C_{GD}$ is a static capacitance between a gate and a drain of each HEMT (hereinafter referred to as the gate-drain capacitance $C_{GD}$) and is called a feedback capacitance Crss. $C_{GS}$ is a static capacitance between the gate and a source of each HEMT (hereinafter referred to as the gate-source capacitance $C_{GS}$). $C_{DS}$ is a static capacitance between the drain and the source of each HEMT (hereinafter referred to as the drain-source capacitance $C_{DS}$). Also, a sum of the gate-drain capacitance $C_{GD}$ and the gate-source capacitance $C_{GS}$ ($C_{GD}$+$C_{GS}$) is called an input capacitance Ciss. Also, a sum of the drain-source capacitance $C_{DS}$ and the gate-drain capacitance $C_{GD}$ ($C_{DS}$+$C_{GD}$) is called an output capacitance Coss.

In the semiconductor device 1 of the preferred embodiment and the comparative example, a first gate-drain capacitance $C_{GD1}$ is formed by the drain electrodes 5, the gate electrode 4, and the electron supply layer 24 and the electron transit layer 23 therebetween. With the semiconductor device 1 of the preferred embodiment and the comparative example, the electrode portions 81 of the gate electrode 4 in the electrode metal structure are disposed orthogonal to the drain wirings 10 of the wiring metal structure. Therefore, depending on a length direction position of an electrode portion 81 of the gate electrode 4, a drain wiring 10 is disposed directly above the electrode portion 81 of the gate electrode 4. At portions at which the drain wirings 10 are disposed directly above the electrode portions 81 of the gate electrode 4, there is a possibility of a second gate-drain capacitance $C_{GD2}$ being formed by the electrode portions 81 of the gate electrode 4, the drain wirings 10, and the insulating films 34 and 35 therebetween. The feedback capacitance Crss (gate-drain capacitance $C_{GD}$) would then be a sum of the first gate-drain capacitance $C_{GD1}$ and the second gate-drain capacitance $C_{GD2}$ ($C_{GD1}$+$C_{GD2}$) and the feedback capacitance Crss may thus become large.

Changes in the input capacitance Ciss (=$C_{GD}$+$C_{GS}$), the output capacitance Coss (=$C_{DS}$+$C_{GD}$), and the feedback capacitance Crss (=$C_{GD1}$+$C_{GD2}$) with respect to drain voltage of the comparative example were estimated by a simulation.

Figure 7:
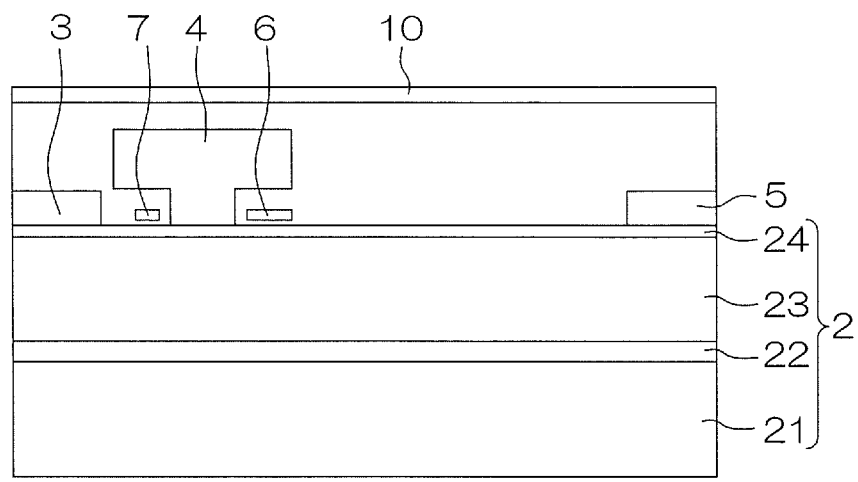
FIG. 7 is a schematic view of a model for a simulation of a comparative example.

FIG. 7 is a schematic view of a simulation model M1 of the comparative example. In FIG. 7, portions corresponding to the respective portions of FIG. 3 are indicated with the same reference signs being provided as in FIG. 3.

Figure 8:
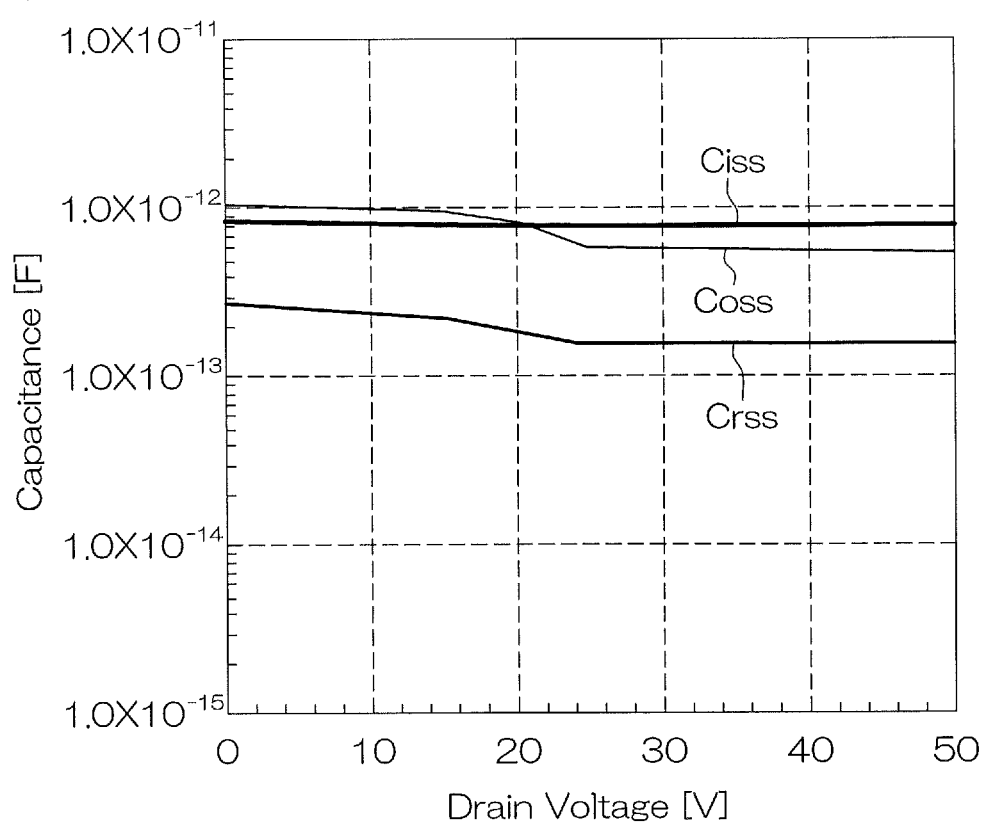
FIG. 8 is a graph of simulation results.

FIG. 8 is a graph of simulation results.

As shown in FIG. 8, the feedback capacitance Crss decreases as the drain voltage increases and thereafter becomes substantially constant. The feedback capacitance Crss decreases in an initial stage when the drain voltage is increased because depletion layers spread in vicinities of the gate electrode 4 in the electron supply layer 24 and the electron transit layer 23 and the first gate-drain capacitance $C_{GD1}$ thus decreases. The feedback capacitance Crss does not decrease as much thereafter because the second gate-drain capacitance $C_{GD2}$ is present.

Thus, with the comparative example, due to the presence of the second gate-drain capacitance $C_{GD2}$, the feedback capacitance Crss becomes large and may cause degradation of switching characteristics of the HEMT.

A description shall now be provided on the degradation of the switching characteristics of the HEMT when the feedback capacitance Crss becomes large.

Figure 9A:
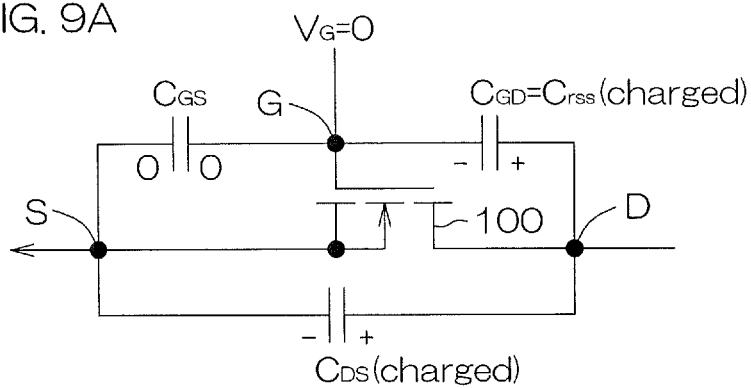
FIG. 9A to FIG. 9D are electric circuit diagrams showing changes in charging and discharging states of respective static capacitances $C_{GD}$, $C_{DS}$, and $C_{GS}$ when a gate voltage is applied to a gate G.

FIG. 9A is an electric circuit diagram of a HEMT 100 formed in the semiconductor device 1 and the static capacitances $C_{GD}$, $C_{GS}$, and $C_{DS}$.

The gate-drain capacitance $C_{GD}$ is present between the gate G and the drain D of the HEMT 100 formed in the semiconductor device 1. The gate-source capacitance $C_{GS}$ is present between the gate G and the source S of the HEMT 100. The drain-source capacitance $C_DS$ is present between the drain D and the source S of the HEMT 100.

When the HEMT 100 is in an off state, potentials at the gate G and the source S are 0 V and a predetermined positive voltage is applied to the drain D and therefore, the gate-drain capacitance $C_{GD}$ and the drain-source capacitance $C_{DS}$ become charged as shown in FIG. 9A. The gate-source capacitance $C_{GS}$ is not charged because the gate G and the source S are equipotential.

Figure 9B:
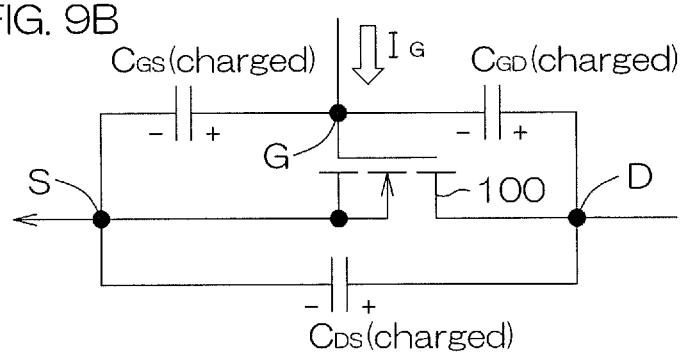
Figure 9C:
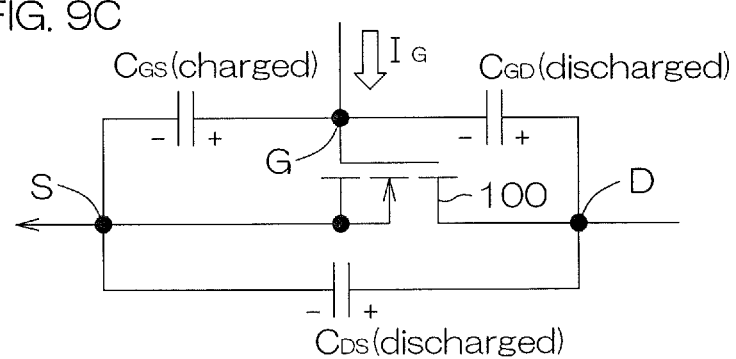

FIG. 10 is a graph of changes in a gate-source voltage $V_{GS}$ and a drain-source voltage $V_{DS}$ with respect to an input gate charge amount $Q_G$ (=gate current $I_G$×time t) when the gate voltage is applied to the gate G.

t0 to t1 period: When the gate voltage is applied to the gate G at time t0, the gate-source voltage $V_{GS}$ increases because charging of the gate-source capacitance $C_{GS}$ by the gate current $I_G$ is started as shown in FIG. 9B.

t1 to t2 period: When the gate-source voltage Vs reaches a threshold voltage Vth at time t1, transition to a short-circuit state between the drain and the source is started and thus decreasing of the drain-source voltage $V_{DS}$ is started and discharging of the drain-source capacitance $C_{DS}$ is started.

t2 to t3 period: The gate-drain capacitance $C_{GD}$ starts discharging only when the drain-source voltage $V_DS$ decreases and a state of $V_{GS} \geq V_D S$ is attained. This is because as long as the drain-source voltage $V_DS$ remains high, in terms of the gate-drain capacitance $C_{GD}$, $V_{GS} < V_{DS}$ is maintained as in the off state of the HEMT 100 even if the gate-source voltage $V_G S$ increases due to inflow of the gate current $I_G$. At time t2, the state of $V_{GS} \geq V_{DS}$ is attained and therefore, as shown in FIG. 9C, the gate-drain capacitance $C_{GD}$ starts discharging. And when the discharge of the gate-drain capacitance $C_G D$ ends, the gate-drain capacitance $C_{GD}$ begins to be charged with an opposite polarity to that of charging in the off state.

For a period from the start of discharge of the gate-drain capacitance $C_G D$ to completion of the charging of the gate-drain capacitance $C_G D$ with the opposite polarity to that of charging in the off state, the gate current $I_G$ is consumed by the discharging/charging of the gate-drain capacitance $C_{GD}$ and therefore, the gate-source voltage $V_G S$ hardly changes.

Figure 9D:
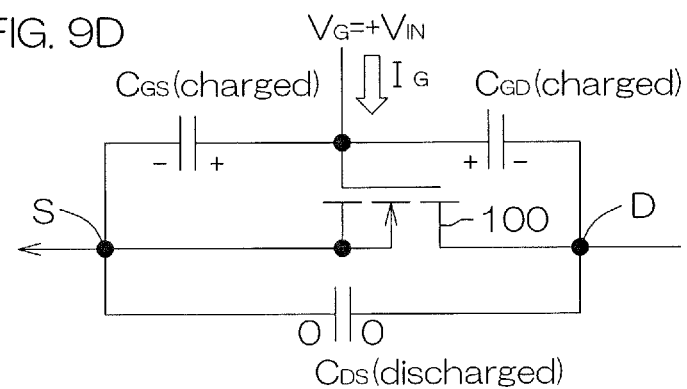

Period from t3 onward: As shown in FIG. 9D, after the charging of the gate-source capacitance $C_{GS}$ with the opposite polarity to that of charging in the off state is completed, that is, after completion of charging of the input capacitance ($C_{GD}$+$C_{GS}$) is completed, the charging level is increased by the inflowing gate current $I_G$ and therefore, the gate-source voltage $V_{GS}$ increases linearly with time.

If the gate-drain capacitance $C_{GD}$ (feedback capacitance Crss) is large, the period of time t2 to t3 becomes long and therefore the switching characteristics of the HEMT 100 become poor.

Thus, in this preferred embodiment, the second source field plate 8 is disposed on the electrode portions 81 of the gate electrode 4. That is, the second source field plate 8 is disposed between the electrode portions 81 of the gate electrode 4 and the drain wirings 10. At least a portion of electric lines of force between the drain wirings 10 and the electrode portions 81 of the gate electrode 4 is arranged to be interrupted by the second source field plate 8. The second gate-drain capacitance $C_{GD2}$ formed by the electrode portions 81 of the gate electrode 4, the drain wirings 10, and the insulating films 34 and 35 therebetween is thereby reduced. The feedback capacitance Crss can thereby be reduced and the switching characteristics of the HEMT 100 can thus be improved.

To reduce the second gate-drain capacitance $C_{GD2}$, it is preferable for a width (Y direction length) of the second source field plate 8 disposed to oppose the upper surfaces of the electrode portions 81 of the gate electrode 4 to be made greater than a width (Y direction length) of the upper surfaces of the electrode portions 81 of the gate electrode 4 in plan view. Also, it is preferable for a −Y direction side edge of the second source field plate 8 to project further in the −Y direction than −Y direction side edges of the upper surfaces of the electrode portions 81 of the gate electrode 4 and for a +Y direction side edge of the second source field plate 8 to project further in the +Y direction than +Y direction side edges of the upper surfaces of the electrode portions 81 of the gate electrode 4.

This is because, by arranging thus, the electric lines of force between the drain wirings 10 and the electrode portions 81 of the gate electrode 4 can be interrupted more effectively in comparison to a structure where the width (Y direction length) of the second source field plate 8 is the same as the width of the upper surfaces of the electrode portions 81 of the gate electrode 4 and the respective side edges in the Y direction of the second source field plate 8 do not project outward from the respective side edges of the upper surfaces of the electrode portions 81 of the gate electrode 4.

The input capacitance Ciss, the output capacitance Coss, and the feedback capacitance Crss of the semiconductor device 1 of the preferred embodiment and the input capacitance Ciss, the output capacitance Coss, and the feedback capacitance Crss of the comparative example were calculated by simulations.

Figure 11:
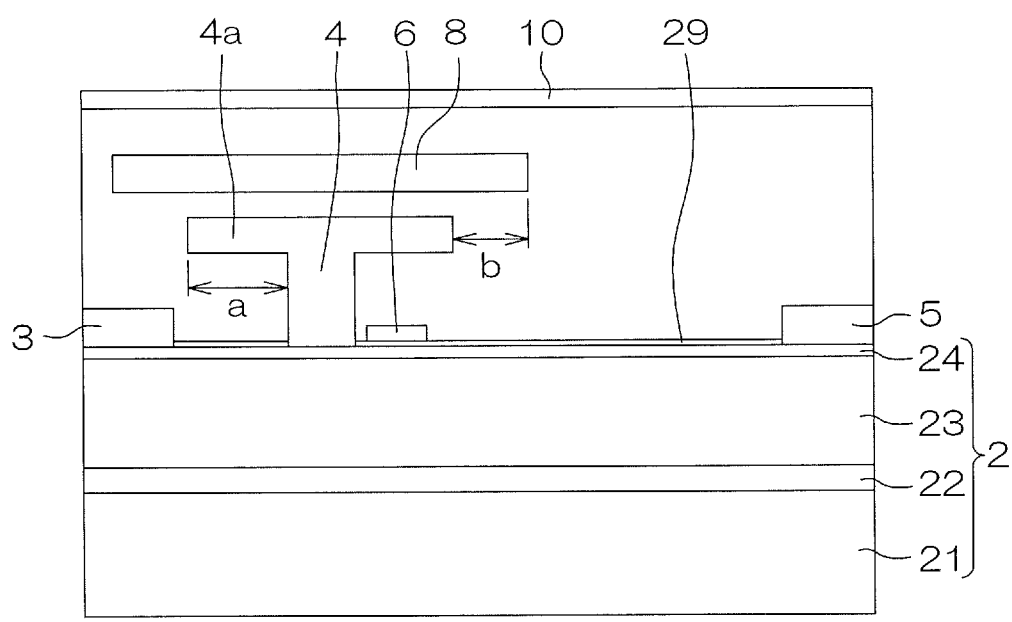
FIG. 11 is a schematic view of a model for a simulation of the semiconductor device of the preferred embodiment.

FIG. 11 is a schematic view of a model M2 for the simulation of the semiconductor device 1 of the preferred embodiment. In FIG. 11, portions corresponding to the respective portions of FIG. 3 are indicated with the same reference signs being provided as in FIG. 3. In FIG. 11, a indicates a width (length in the Y direction) of the overlap portions 4a of the gate electrode 4. In the model M2, a is set to 0.8 µm. In FIG. 11, b indicates a projection amount of the +Y direction side edge of the second source field plate 8 from the +Y direction side edge of the upper surface of the electrode portion 81 of the gate electrode 4 (including upper surfaces of the overlap portions 4a) in plan view. A projection amount of the −Y direction side edge of the second source field plate 8 from the −Y direction side edge of the upper surface of the electrode portion 81 of the gate electrode 4 is the same as the projection amount b of the +Y direction side edge of the second source field plate 8 from the +Y direction side edge of the overlap portions 4a of the gate electrode 4. Here, the projection amount b is set to 0.6 µm.

Here, an arrangement with which the second source field plate 8 is removed from the model M2 of FIG. 11 was made a model for a simulation of a comparative example.

FIG. 12 is a table of simulation results. The respective capacitances Ciss, Coss, and Crss are capacitances (pF) when the drain-source voltage $V_{DS}$ is 50 V. From FIG. 12, it can be understood that in comparison to the comparative example that does not have the second source field plate 8, the feedback capacitance Crss is made significantly smaller with the semiconductor device 1 of the preferred embodiment having the second source field plate 8.

Although the gate electrode 4 has the overlap portions 4a in the preferred embodiment described above, the gate electrode 4 does not have to have the overlap portions 4a. A relationship between the projection amount of the −Y direction side edge and the +Y direction side edge of the second source field plate 8 from the −Y direction side edge and the +Y direction side edge of the upper surface of the electrode portion 81 of the gate electrode 4 and the input capacitance Ciss, the output capacitance Coss, and the feedback capacitance Crss in a case where the gate electrode 4 does not have the overlap portions 4a was examined by a simulation.

Figure 13:
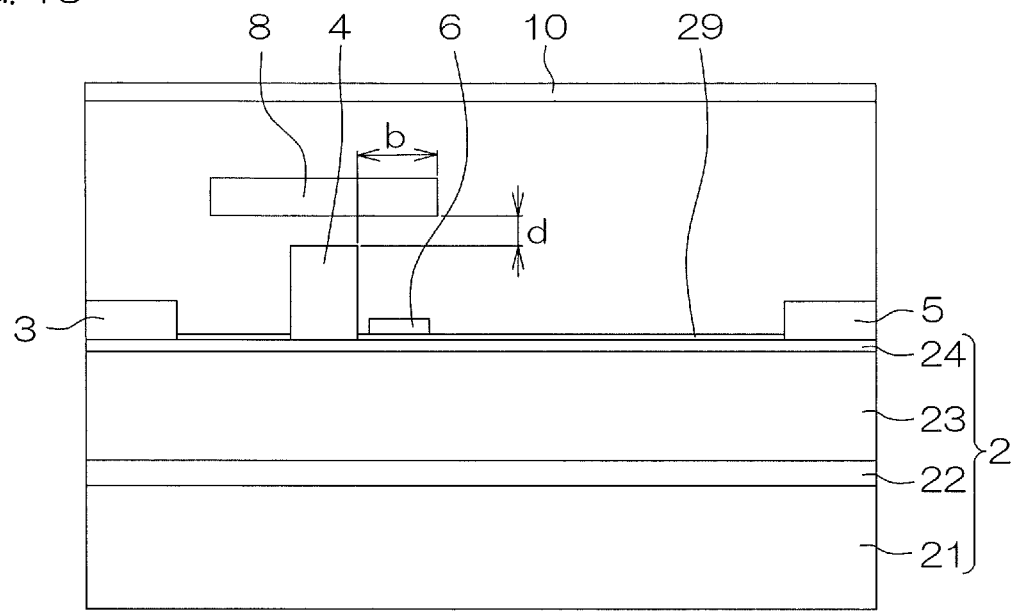
FIG. 13 is a schematic view of a model for a simulation of a case where agate electrode does not have overlap portions.

FIG. 13 is a schematic view of a model M3 for the simulation of the case where the gate electrode 4 does not have the overlap portions 4a. In FIG. 13, portions corresponding to the respective portions of FIG. 3 are indicated with the same reference signs being provided as in FIG. 3. In FIG. 13, b indicates the projection amount of the +Y direction side edge of the second source field plate 8 from the +Y direction side edge of the upper surface of the electrode portion 81 of the gate electrode 4 in plan view. The projection amount of the −Y direction side edge of the second source field plate 8 from the −Y direction side edge of the upper surface of the electrode portion 81 of the gate electrode 4 is the same as the projection amount b of the +Y direction side edge of the second source field plate 8 from the +Y direction side edge of the gate electrode 4.

The input capacitance Ciss, the output capacitance Coss, and the feedback capacitance Crss were calculated for each of cases where the projection amount b shown in FIG. 13 is set to 0 µm, 0.3 µm, 0.6 µm, and 0.9 µm. Also, the input capacitance Ciss, the output capacitance Coss, and the feedback capacitance Crss were calculated by a simulation using an arrangement with which the second source field plate 8 is removed from the model M3 of FIG. 13 as a model of a comparative example.

FIG. 14 is a table of simulation results. The respective capacitances Ciss, Coss, and Crss are capacitances (pF) when the drain-source voltage $V_{DS}$ is 50 V.

From FIG. 14, it can be understood that in comparison to the comparative example that does not have the second source field plate 8, the feedback capacitance Crss is made smaller with the preferred embodiment having the second source field plate 8. It can also be understood that with the preferred embodiment having the second source field plate 8, the larger the projection amount b, the smaller the feedback capacitance Crss. However, as the projection amount b increases, a distance between the second source field plate 8 and the source via metals 51 (see FIG. 4) connected to the source electrode 3 is made shorter. It is thus preferable to increase the projection amount b within a range in which the second source field plate 8 does not become too close to the source via metals 51. From such a standpoint, the projection amount b is preferably not less than 0.4 µm and not more than 0.8 µm and is more preferably approximately 0.6 µm.

Next, a relationship between an interval d between an upper surface of the gate electrode 4 and a lower surface of the second source field plate 8 (see FIG. 13) and the input capacitance Ciss, the output capacitance Coss, and the feedback capacitance Crss in a case where the gate electrode 4 does not have the overlap portions 4a and the projection amount b is set to 0.6 µm was examined by a simulation. The simulation model is the same as that of FIG. 13.

FIG. 15 is a table of simulation results. The respective capacitances Ciss, Coss, and Crss are capacitances (pF) when the drain-source voltage $V_{DS}$ is 50 V. From FIG. 15, it can be understood that the smaller the interval d between the gate electrode 4 and the second source field plate 8, the smaller the feedback capacitance Crss. However, the smaller the interval d, the larger the input capacitance Ciss. It is thus preferable to decrease the interval d within a range in which the input capacitance Ciss does not become too large. From such a standpoint, the interval d is preferably not less than 0.15 µm but less than 0.25 µm and is more preferably approximately 0.2 µm.

With the preferred embodiments described above, in the semiconductor device 1 in which the electrode portions 81 of the gate electrode 4 in the electrode metal structure are disposed orthogonal to the drain wirings 10 in the wiring metal structure, the second source field plate (conductive film) 8 electrically connected to the source electrodes 3 is disposed between the electrode portions 81 of the gate electrode 4 and the drain wirings 10. The static capacitance (second gate-drain capacitance $C_{GD2}$) between the electrode portions 81 of the gate electrode 4 and the drain wirings 10 is thereby reduced and therefore, the feedback capacity Crss of the semiconductor device 1 can be reduced. The switching characteristics of the semiconductor device 1 can thereby be improved.

Also, with the preferred embodiments described above, the source electrodes 3, the electrode portions 81 of the gate electrode 4, and the drain electrodes 5 in the electrode metal structure are disposed orthogonal to the source wirings 9, the drain wirings 10, and the gate wirings 11 in the wiring metal structure, widths of the source wirings 9 and the drain wirings 10 are not restricted by an interval between a source electrode 3 and a drain electrode 5. Although the interval between a source electrode 3 and a drain electrode 5 must be made short to realize an HEMT of small on resistance, even in this case, the widths of the source wirings 9 and the drain wirings 10 can be set to be of sufficient magnitudes easily. Also, with the preferred embodiment described above, the source wirings 9, the drain wirings 10, and the gate wirings 11 can be formed in the same step and therefore, production of these wirings is made easy.

If the direction in which the source electrodes 3, the electrode portions 81 of the gate electrode 4, and the drain electrodes 5 in the electrode metal structure extend and the direction in which the source wirings 9, the drain wirings 10, and the gate wirings 11 in the wiring metal structure extend are made the same direction, it becomes possible to arrange the drain wirings 10 such as not to be disposed directly above all positions of front surfaces of the electrode portions 81 of the gate electrode 4. In this case, the static capacitance (second gate-drain capacitance $C_{GD2}$) formed by the electrode portions 81 of the gate electrode 4, the drain wirings 10, and the insulating films 34 and 35 therebetween is made small. Therefore, with such a structure, it may be unnecessary to provide a conductive film such as the second source field plate 8 for reducing the second gate-drain capacitance $C_{GD2}$ at an upper side of the electrode portions 81 of the gate electrode 4. However, in a case where the direction in which the electrodes 3, 4, and 5 in the electrode metal structure extend and the direction in which the wirings 9, 10, and 11 in the wiring metal structure extend are made the same direction, a problem such as that following may occur.

That is, if a source wiring is disposed on a source electrode and a drain wiring is disposed on a drain electrode, widths of the wirings are restricted by an interval between the source electrode and the drain electrode. In particular, to realize an HEMT of small on resistance, the interval between the source electrode and the drain electrode must be made short and it may not be possible to secure sufficient widths for the source wiring and the drain wiring.

Also, it is difficult to make an interval between the source wiring and the drain wiring large and it is therefore difficult to form a gate wiring therebetween. It thus becomes difficult to form the gate wiring by the same step as the source wiring and the drain wiring. Also, a gate electrode must be extended to a region in which source wiring and the drain wiring are not present in plan view and a gate resistance may thus become large.

Although with the preferred embodiments described above, silicon was given as a material example of the substrate 21, besides this, any substrate material such as that of a sapphire substrate, a GaN substrate, etc., can be applied.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2018-007397 filed on Jan. 19, 2018 in the Japan Patent Office, and the entire disclosure of this application is incorporated herein by reference.

REFERENCE SIGNS LIST 1 semiconductor device
2 semiconductor laminated structure
3 source electrode
4 gate electrode
4a overlap portion
5 drain electrode
6 first source field plate
7 floating plate
8 second source field plate
9 source wiring
10 drain wiring
11 gate wiring
12 drain pad
13 source pad
14 gate pad
15 substrate contact portion
16 active area
17 nonactive area
18 element isolation line
20 plate film
21 substrate
22 buffer layer
23 electron transit layer
24 electron supply layer
25 two-dimensional electron gas
29 passivation film
31 first protective film 32 second protective film
33 first interlayer insulating film
34 second interlayer insulating film
35 third interlayer insulating film
36 source contact hole
37 drain contact hole
38 gate opening portion
38a first opening portion
38b second opening portion
39 side wall
40 gate insulating film
41 first source via hole
42 first drain via hole
43 first gate via hole
44 first SFP via hole
45 second SFP via hole
51 source via metal
52 drain via metal
53 gate via metal
54 first SFP via metal
55 second SFP via metal
61 fourth interlayer insulating film
62 second drain via hole
63 substrate contact hole
64 substrate contact metal
65 third protective film
66 drain pad opening portion
67 resin layer
72 base portion
73 electrode portion (first source field plate 6)
74 base portion
75 electrode portion (floating plate 7)
76 base portion
81 electrode portion (gate electrode 4)
82 base portion
91 electrode portion (second source field plate 8)
92 base portion

The invention claimed is:

1. A semiconductor device having an electrode structure that includes a source electrode, a gate electrode, and a drain electrode disposed on a semiconductor laminated structure and extending in parallel to each other and in a predetermined first direction and a wiring structure that includes a source wiring, a drain wiring, and a gate wiring disposed on the electrode structure and extending in parallel to each other and in a second direction orthogonal to the first direction and wherein the wiring structure is one with which the source wiring, the drain wiring, and the gate wiring are electrically connected to the source electrode, the drain electrode, and the gate electrode, respectively, the semiconductor device comprising: a conductive film disposed between the gate electrode and the drain wiring and being electrically connected to the source electrode;

wherein the conductive film extends in the first direction along an upper surface of the gate electrode, wherein the conductive film includes a first side edge and a second side edge and the upper surface of the gate electrode includes a third side edge and a fourth side edge and wherein the first side edge corresponds to the third side edge and the second side edge corresponds to the fourth side edge, and wherein in plan view, the first side edge projects further outward than the third side edge and the second side edge projects further outward than the fourth side edge, and wherein an amount of projection of the first side edge from the third side edge is not less than 0.3 μm and not more than 0.9 μm and an amount of projection of the second side edge from the fourth side edge is not less than 0.3 μm and not more than 0.9 μm.

2. The semiconductor device according to claim 1, wherein a distance between the upper surface of the gate electrode and a lower surface of the conductive film is not less than 0.15 μm and not more than 0.25 μm.

3. The semiconductor device according to claim 1, wherein the source electrode and the drain electrode are disposed apart from the gate electrode such as to sandwich the gate electrode.

4. The semiconductor device according to claim 3, wherein the semiconductor laminated structure includes an active area including an element structure arranged by sandwiching the gate electrode with the source electrode and the drain electrode and a nonactive area outside the active area and in the nonactive area, the source wiring and the conductive film are electrically connected.

5. The semiconductor device according to claim 3, wherein the semiconductor laminated structure includes an electron transit layer and an electron supply layer formed on the electron transit layer and having formed therein a lower opening portion reaching the electron transit layer, the semiconductor device further comprises:

an insulating layer, having an upper opening portion in communication with the lower opening portion and formed on the semiconductor laminated structure; and a gate insulating film, formed such as to cover a front surface of the insulating layer and a bottom portion and a side portion of a gate opening portion that is constituted of the lower opening portion and the upper opening portion, and the gate electrode is formed on the gate insulating film inside the gate opening portion.

6. The semiconductor device according to claim 5, further comprising: a second conductive film, embedded in the insulating layer and between the gate electrode and the drain electrode, insulated from the gate electrode, and electrically connected to the source electrode.

7. The semiconductor device according to claim 6, further comprising: a third conductive film, embedded in the insulating layer and between the gate electrode and the source electrode, and insulated from the gate electrode and the source electrode.

8. The semiconductor device according to claim 6, further comprising: a side wall of an insulating property, disposed between the gate insulating film and the side portion of the gate opening portion.

9. The semiconductor device according to claim 5, wherein the gate electrode includes an overlap portion, formed on the gate insulating film at a peripheral edge of the gate opening portion.

10. A method for producing a semiconductor device comprising:

forming a source electrode, a drain electrode, and a gate electrode extending in parallel to each other and in a predetermined first direction on a semiconductor laminated structure including an electron transit layer and an electron supply layer formed on the electron transit layer;

forming a first insulating layer disposed above the source electrode and the drain electrode and covering the gate electrode;

forming a conductive film at a position on the first insulating layer opposing an upper surface of the gate electrode, the conductive film including a first side edge and a second side edge, the upper surface of the gate electrode including a third side edge and a fourth side edge with the first side edge corresponding to the third side edge and the second side edge corresponding to the fourth side edge; and forming a second insulating layer on the first insulating layer such as to cover the conductive film, and further comprising a step in which a source via metal, a drain via metal, and a gate via metal for connecting the source electrode, the drain electrode, and the gate electrode respectively to a source wiring, a drain wiring, and a gate wiring formed on the second insulating layer are formed inside an insulating layer between the electrodes and the wirings, and a conductive film via metal for connecting the conductive film to the source wiring is formed inside the second insulating layer; and a step in which the source wiring, the drain wiring, and the gate wiring extending in parallel to each other are formed on the second insulating layer and in a second direction that is a direction along a front surface of the second insulating layer and is orthogonal to the first direction;

wherein the conductive film extends in the first direction along the upper surface of the gate electrode, and wherein, in plan view, the first side edge projects further outward than the third side edge and the second side edge projects further outward than the fourth side edge, and an amount of projection of the first side edge from the third side edge is not less than 0.3 μm and not more than 0.9 μm and an amount of projection of the second side edge from the fourth side edge is not less than 0.3 μm and not more than 0.9 μm.

* * * * *